(12) United States Patent
Chung et al.

(10) Patent No.: US 12,317,572 B2
(45) Date of Patent: May 27, 2025

(54) SEMICONDUCTOR DEVICE

(71) Applicant: SAMSUNG ELECTRONICS CO., LTD., Suwon-si (KR)

(72) Inventors: Wonkeun Chung, Seoul (KR); Byungchul Kang, Suwon-si (KR); Hongkeun Park, Suwon-si (KR); Hoonjoo Na, Seoul (KR); Chunghwan Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 443 days.

(21) Appl. No.: 17/901,054

(22) Filed: Sep. 1, 2022

(65) Prior Publication Data
US 2023/0215930 A1 Jul. 6, 2023

(30) Foreign Application Priority Data

Dec. 31, 2021 (KR) ........................ 10-2021-0194238

(51) Int. Cl.
*H01L 29/06* (2006.01)
*H01L 23/528* (2006.01)
(Continued)

(52) U.S. Cl.
CPC ......... *H10D 64/62* (2025.01); *H01L 23/5286* (2013.01); *H10D 30/014* (2025.01);
(Continued)

(58) Field of Classification Search
CPC .... H10D 64/62; H10D 30/014; H10D 30/031; H10D 30/43; H10D 30/6729; H10D 30/6735; H10D 30/6757; H10D 62/121; H10D 64/01; H10D 64/017; H10D 84/0167; H10D 84/017; H10D 84/0186; H10D 84/038; H10D 84/85; H10D 30/6219; H10D 30/797; H10D 62/151; H10D 62/822; H10D 64/256; H10D 64/518; H10D 84/0158; H10D 84/834; H10D 84/853; H01L 23/5286; H01L 23/5283; H01L 21/76846; H01L 21/76847; H01L 21/76856; H01L 23/485; H01L 23/5226; H01L 23/53266
(Continued)

(56) References Cited
U.S. PATENT DOCUMENTS 8,466,063 B2 6/2013 Lin et al.
9,431,296 B2 8/2016 Basker et al.
(Continued)

*Primary Examiner* — Theresa T Doan
(74) *Attorney, Agent, or Firm* — Sughrue Mion, PLLC

(57) ABSTRACT

A semiconductor device includes a substrate that includes an active pattern, a channel pattern and a source/drain pattern on the active pattern, a gate electrode on the channel pattern, an active contact electrically connected to the source/drain pattern, and a gate contact electrically connected to the gate electrode. The active contact includes a first barrier pattern, a first seed pattern on the first barrier pattern, a first fill pattern on the first seed pattern, and a first metal-containing pattern between the first seed pattern and the first fill pattern. The first metal-containing pattern includes tungsten nitride. A nitrogen concentration of the first metal-containing pattern decreases in a direction toward the substrate.

20 Claims, 59 Drawing Sheets

(51) Int. Cl.
*H01L 39/00* (2006.01)
*H10D 30/01* (2025.01)
*H10D 30/43* (2025.01)
*H10D 30/67* (2025.01)
*H10D 62/10* (2025.01)
*H10D 64/01* (2025.01)
*H10D 64/62* (2025.01)
*H10D 84/01* (2025.01)
*H10D 84/03* (2025.01)
*H10D 84/85* (2025.01)

(52) U.S. Cl.
CPC ........... *H10D 30/031* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 64/01* (2025.01); *H10D 64/017* (2025.01); *H10D 84/0167* (2025.01); *H10D 84/017* (2025.01); *H10D 84/0186* (2025.01); *H10D 84/038* (2025.01); *H10D 84/85* (2025.01)

(58) Field of Classification Search
USPC .......................................................... 257/30
See application file for complete search history.

(56) References Cited

U.S. PATENT DOCUMENTS

| | | |
|---|---|---|
| 9,825,031 B1 * | 11/2017 | Bouche .............. H10D 84/0149 |
| 9,825,037 B2 * | 11/2017 | Inoue ..................... H10B 41/70 |
| 10,396,034 B2 | 8/2019 | Siew et al. |
| 10,797,176 B2 | 10/2020 | Wu et al. |
| 10,867,845 B2 | 12/2020 | Wang et al. |
| 10,879,244 B2 | 12/2020 | Shin et al. |
| 10,998,411 B2 | 5/2021 | Bae et al. |
| 2004/0171241 A1 | 9/2004 | Kitamura et al. |
| 2020/0303245 A1 | 9/2020 | Tsai et al. |
| 2021/0193517 A1 | 6/2021 | Chen et al. |
| 2021/0343712 A1 | 11/2021 | Lin et al. |

* cited by examiner

SEMICONDUCTOR DEVICE

CROSS-REFERENCE TO RELATED APPLICATION

This U.S. non-provisional application claims priority under 35 U.S.C. § 119 to Korean Patent Application No. 10-2021-0194238 filed on Dec. 31, 2021 in the Korean Intellectual Property Office, the disclosure of which is hereby incorporated by reference in its entirety.

BACKGROUND

The disclosure relates to a semiconductor device, and more particularly, to a semiconductor device including a field effect transistor.

A semiconductor device includes an integrated circuit including metal-oxide-semiconductor field-effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various research has been conducted to develop methods of fabricating semiconductor devices having superior performance while overcoming issues associated with high integration of the semiconductor devices.

SUMMARY

Some embodiments of the disclosure provide a semiconductor device with increased electrical properties.

In accordance with an aspect of the disclosure, a semiconductor device includes a substrate including an active pattern; a channel pattern and a source/drain pattern on the active pattern, the channel pattern being connected to the source/drain pattern; a gate electrode on the channel pattern; an active contact electrically connected to the source/drain pattern; and a gate contact electrically connected to the gate electrode, wherein the active contact includes a first barrier pattern; a first seed pattern on the first barrier pattern; a first fill pattern on the first seed pattern; and a first metal-containing pattern between the first seed pattern and the first fill pattern, wherein the first metal-containing pattern includes tungsten nitride, and wherein a nitrogen concentration of the first metal-containing pattern decreases in a direction toward the substrate.

In accordance with an aspect of the disclosure, a semiconductor device includes a substrate including an active pattern; a channel pattern and a source/drain pattern on the active pattern, the channel pattern being connected to the source/drain pattern; a gate electrode on the channel pattern; an active contact electrically connected to the source/drain pattern; and a gate contact electrically connected to the gate electrode, wherein the active contact includes a first barrier pattern; a first seed pattern on the first barrier pattern; a first metal-containing pattern on the first seed pattern; and a first fill pattern on the first metal-containing pattern, wherein the gate contact includes a second barrier pattern; a second seed pattern on the second barrier pattern; a second metal-containing pattern on the second seed pattern; a second fill pattern on the second metal-containing pattern; a third seed pattern on the second fill pattern; a third metal-containing pattern on the third seed pattern; and a third fill pattern on the third metal-containing pattern, and wherein each of the first metal-containing pattern, the second metal-containing pattern, and the third metal-containing pattern includes metal nitride.

In accordance with an aspect of the disclosure, a semiconductor device includes a substrate comprising a PMOSFET region and an NMOSFET region; a first active pattern on the PMOSFET region and a second active pattern on the NMOSFET region; a first channel pattern and a first source/drain pattern on the first active pattern; a second channel pattern and a second source/drain pattern on the second active pattern; a gate electrode that runs across the first channel pattern and the second channel pattern; a gate dielectric layer between the gate electrode and the first channel pattern, the gate dielectric layer being between the gate electrode and the second channel pattern; a gate spacer on a sidewall of the gate electrode; a gate capping pattern on a top surface of the gate electrode; a gate cutting pattern that penetrates the gate electrode; an interlayer dielectric layer on the gate capping pattern; an active contact that penetrates the interlayer dielectric layer and is electrically connected to one of the first source/drain pattern and the second source/drain pattern; a metal-semiconductor compound layer between the active contact and the first source/drain pattern, the metal-semiconductor compound layer being between the active contact and the second source/drain pattern; a gate contact that penetrates the interlayer dielectric layer and the gate capping pattern and is electrically connected to the gate electrode; a first metal layer on the interlayer dielectric layer, the first metal layer including a power line that vertically overlaps the gate cutting pattern; and a plurality of first lines that are electrically connected to the active contact and the gate contact; and a second metal layer on the first metal layer, wherein the second metal layer includes a plurality of second lines that are electrically connected to the first metal layer, wherein the active contact includes a first barrier pattern; a first seed pattern on the first barrier pattern; a first metal-containing pattern on the first seed pattern; and a first fill pattern on the first metal-containing pattern, wherein the gate contact includes a second barrier pattern; a second seed pattern on the second barrier pattern; a second metal-containing pattern on the second seed pattern; a second fill pattern on the second metal-containing pattern; a third seed pattern on the second fill pattern; a third metal-containing pattern on the third seed pattern; and a third fill pattern on the third metal-containing pattern, and wherein each of the first metal-containing pattern, the second metal-containing pattern, and the third metal-containing pattern includes tungsten nitride, and wherein a nitrogen concentration of each of the first metal-containing pattern, the second metal-containing pattern, and the third metal-containing pattern decreases in a direction toward the substrate.

BRIEF DESCRIPTION OF DRAWINGS

FIGS. 9A to 19C illustrate cross-sectional views showing a method of fabricating a semiconductor device according to an embodiment.

FIGS. 9A, 10A, 11A, 12A, 13A, 14A, 15A, 16A, and 18A illustrate cross-sectional views taken along line A-A' of FIG. 4.

FIGS. 19A to 19C illustrate enlarged views showing a method of forming a gate contact on section N of FIG. 18A.

DETAILED DESCRIPTION OF EMBODIMENTS

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

For the sake of brevity, conventional elements to semiconductor devices may or may not be described in detail herein for brevity purposes.

Figure 1:
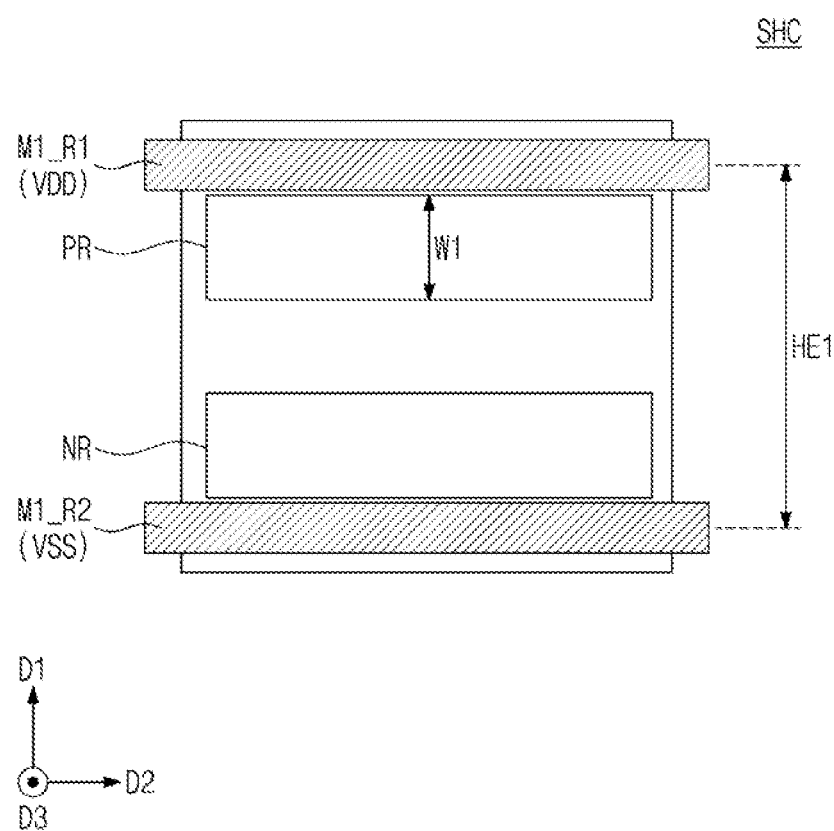
FIGS. 1 to 3 illustrate conceptual diagrams showing logic cells of a semiconductor device according to an embodiment.
Figure 2:
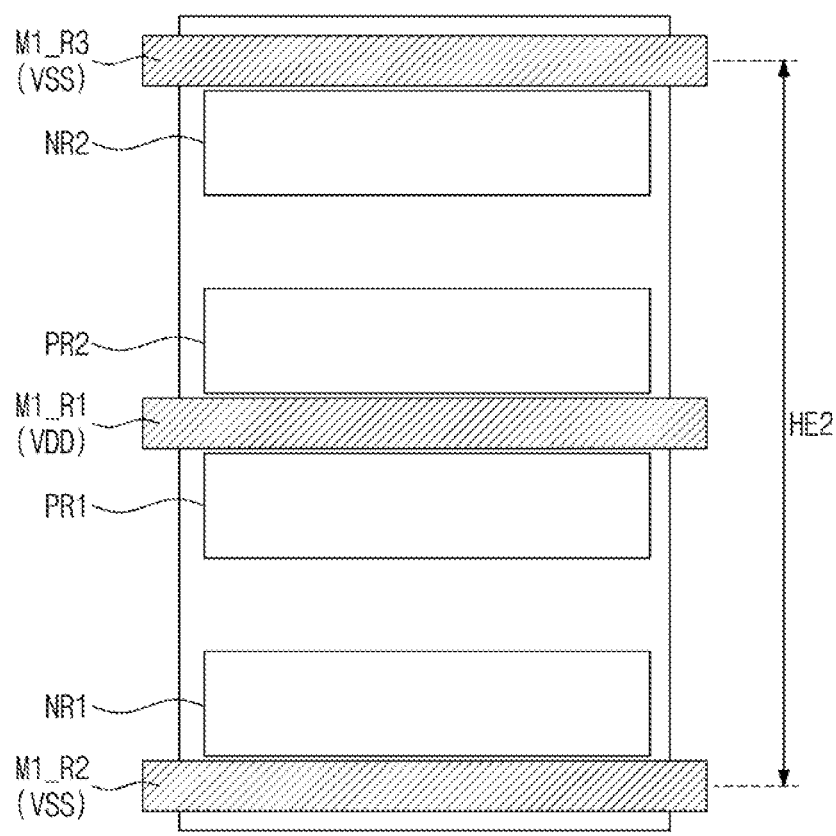
Figure 3:
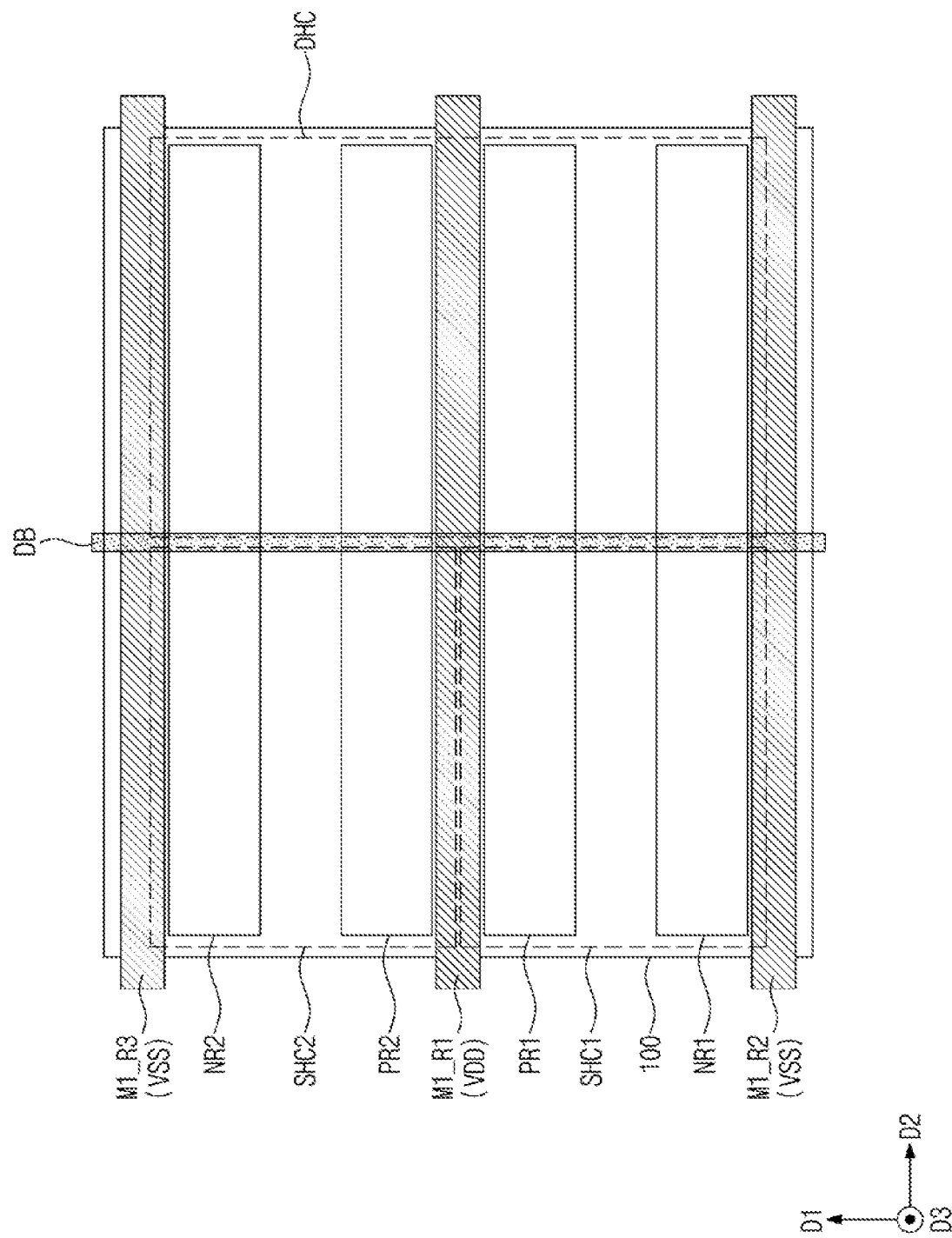

FIGS. 1 to 3 illustrate conceptual views showing logic cells of a semiconductor device according to an embodiment.

Referring to FIG. 1, a single height cell SHC may be provided. For example, a a first power line M1_R1 and a second power line M1_R2 may be provided on a substrate 100. The first power line MIRI may be a path for providing a drain voltage VDD, for example, a power voltage. The second power line M1_R2 may be a path for providing a source voltage VSS, for example, a ground voltage.

The single height cell SHC may be defined between the first power line M1_R1 and the second power line M1_R2. The single height cell SHC may include one p-type MOSFET (PMOSFET) region PR and one n-type MOSFET (NMOSFET) region NR. For example, the single height cell SHC may have a complementary metal oxide semiconductor (CMOS) structure provided between the first power line M1_R1 and the second power line M1_R2.

Each of the PMOSFET and NMOSFET regions PR and NR may have a first width W1 in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a first power line M1_R1, a second power line M1_R2, and a third power line M1_R3 may be provided on a substrate 100. The first power line M1_R1 may be disposed between the second power line M1_R2 and the third power line M1_R3. The third power line M1_R3 may be a path to which a source voltage VSS is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in plan, the first power line M1_R1 may be located between the first and second PMOSFET regions PR1 and PR2.

A second height HE2 may be defined to indicate a length in the first direction D1 of the double height cell DHC. The second height HE2 may be about twice the first height HE1 of FIG. 1. The first and second PMOSFET regions PR1 and PR2 of the double height cell DHC may be collectively coupled to operate as a single PMOSFET region.

Therefore, the double height cell DHC may have a PMOS transistor whose size is greater than that of a PMOS transistor included in the single height cell SHC discussed above in FIG. 1. For example, the channel size of the PMOS transistor included in the double height cell DHC may be about twice that of the PMOS transistor included in the single height cell SHC. In conclusion, the double height cell DHC may operate at higher speeds than those of the single height cell SHC. In the disclosure, the double height cell DHC shown in FIG. 2 may be defined as a multi-height cell. The multi-height cell may include a triple height cell whose cell height is about three times that of the single height cell SHC.

Referring to FIG. 3, a first single height cell SHC1, a second single height cell SHC2, and a double height cell DHC that are two-dimensionally disposed may be provided on a substrate 100. The first single height cell SHC1 may be located between a first power line M1_R1 and a second power line M1_R2. The second single height cell SHC2 may be located between the first power line M1_R1 and a third power line M1_R3. The second single height cell SHC2 may be adjacent in a first direction D1 to the first single height cell SHC1. The double height cell DHC may be located between the second power line M1_R2 and the third power line M1_R3. The double height cell DHC may be adjacent in a second direction D2 to the first and second single height cells SHC1 and SHC2. A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
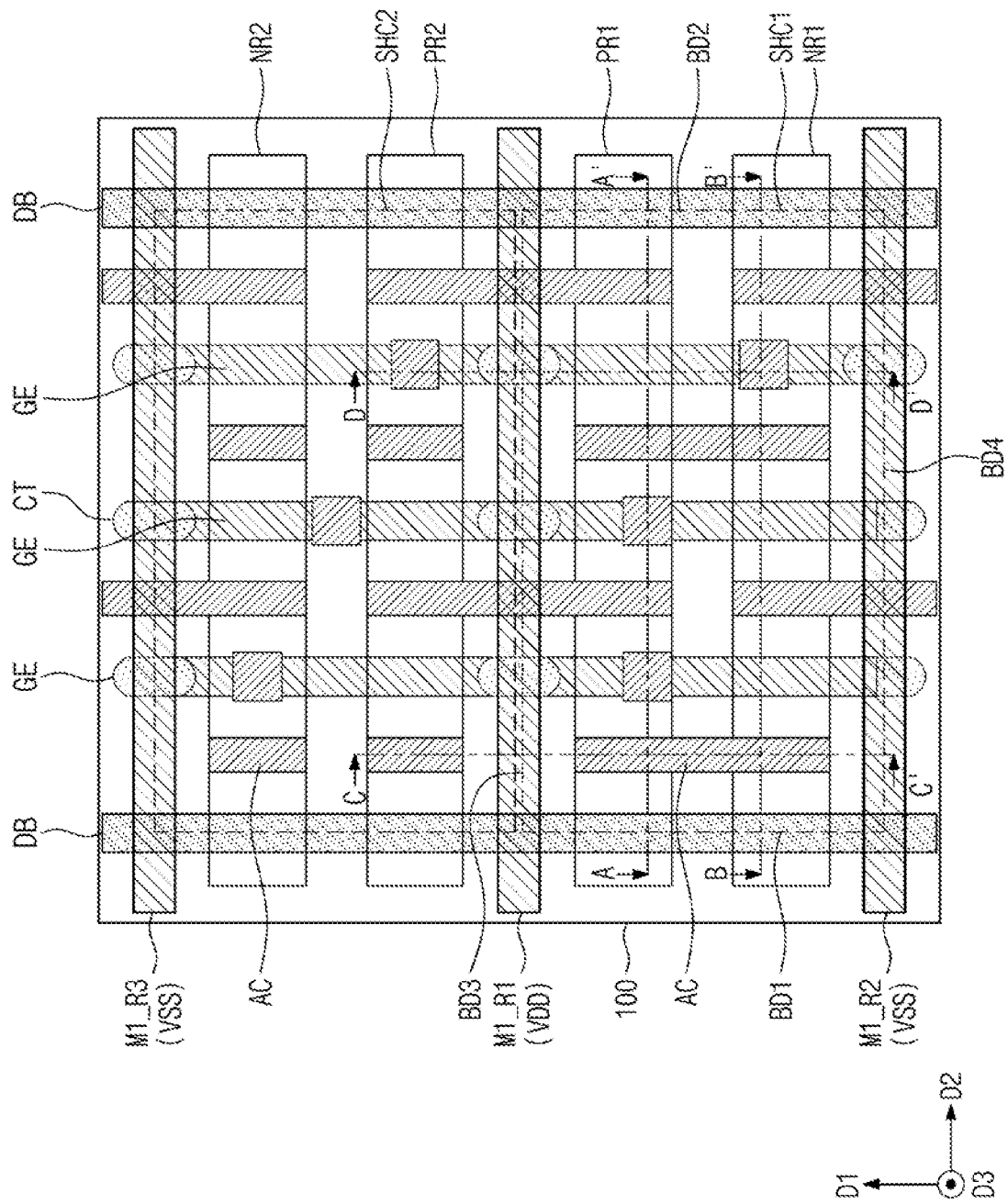
FIG. 4 illustrates a plan view showing a semiconductor device according to an embodiment.
Figure 5A:
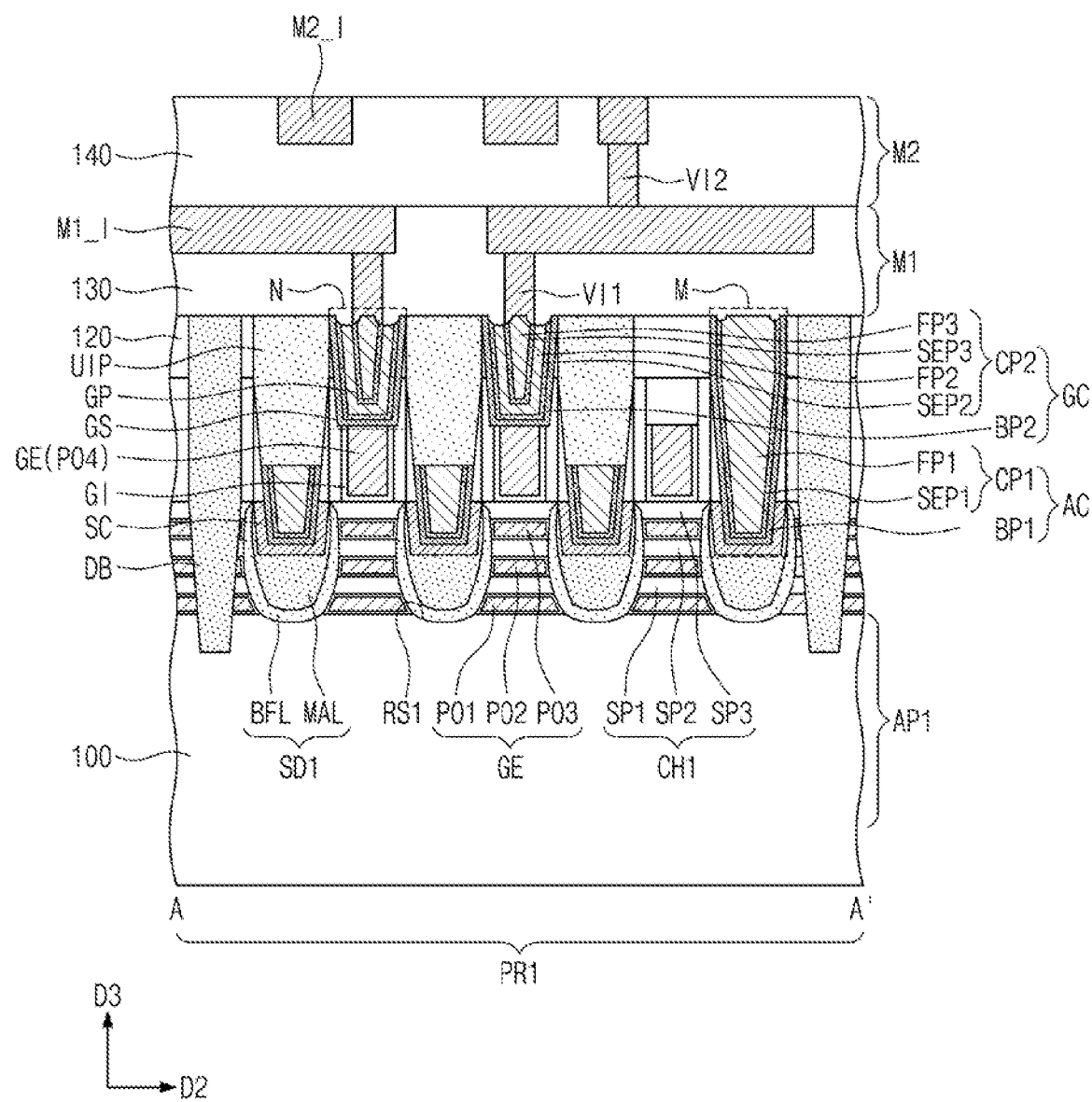
FIGS. 5A, 5B, 5C, and 5D illustrate cross-sectional views respectively taken along lines A-A', B-B', C-C', and D-D' of FIG. 4.
Figure 6:
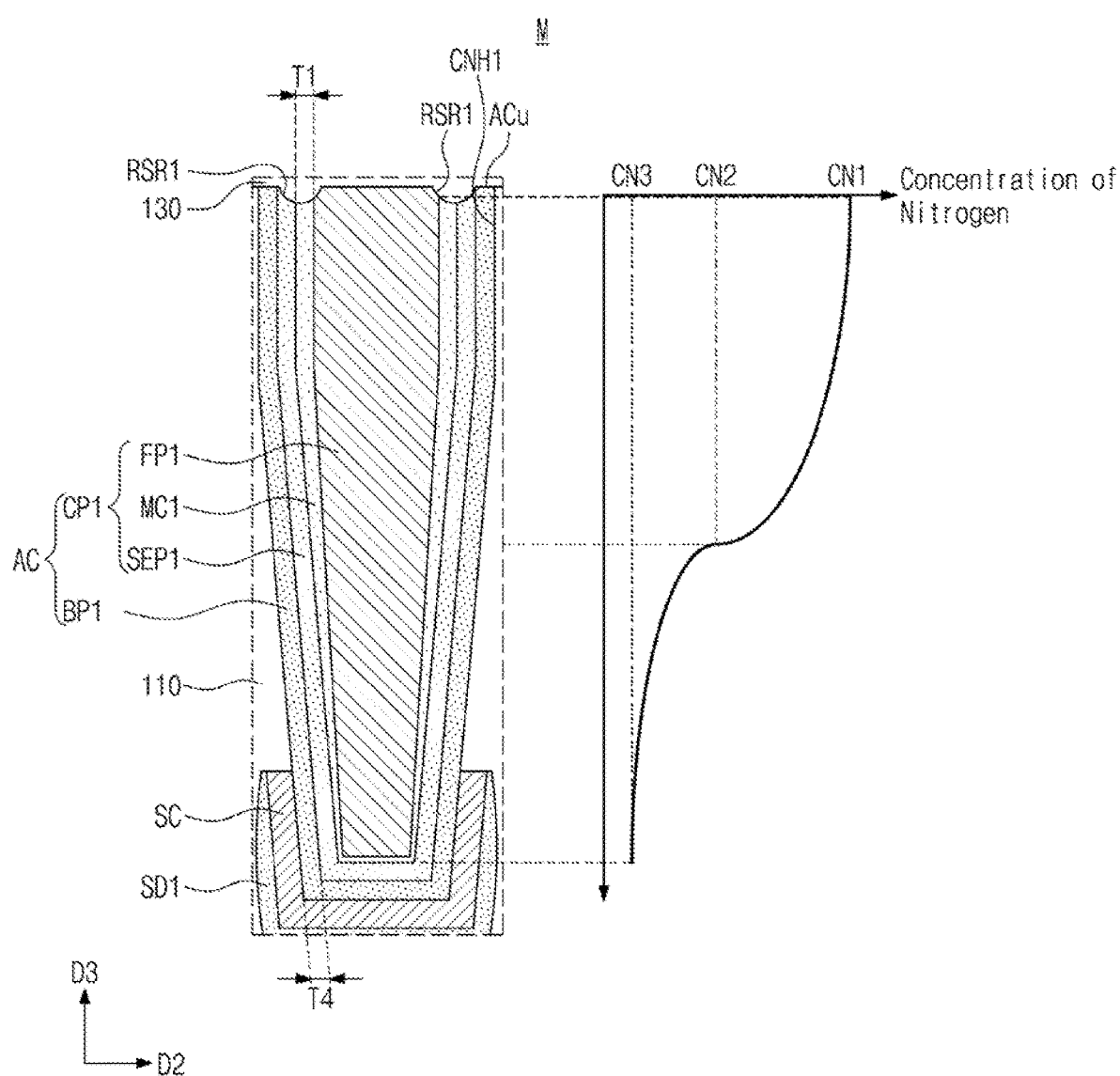
FIG. 6 illustrates an enlarged view showing an example of section M depicted in FIG. 5A.
Figure 7:
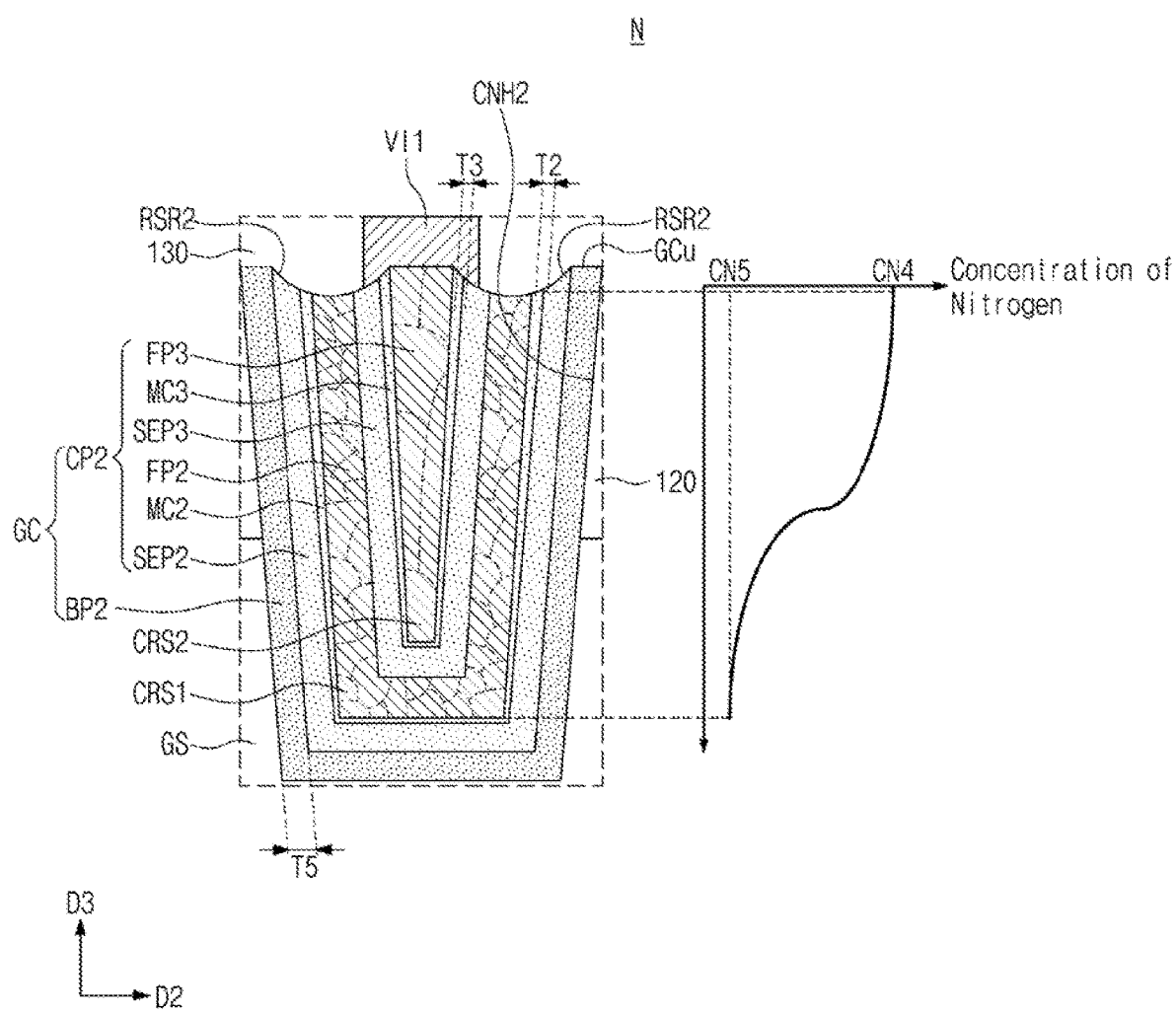
FIG. 7 illustrates an enlarged view showing an example of section N depicted in FIG. 5A.
Figure 8:
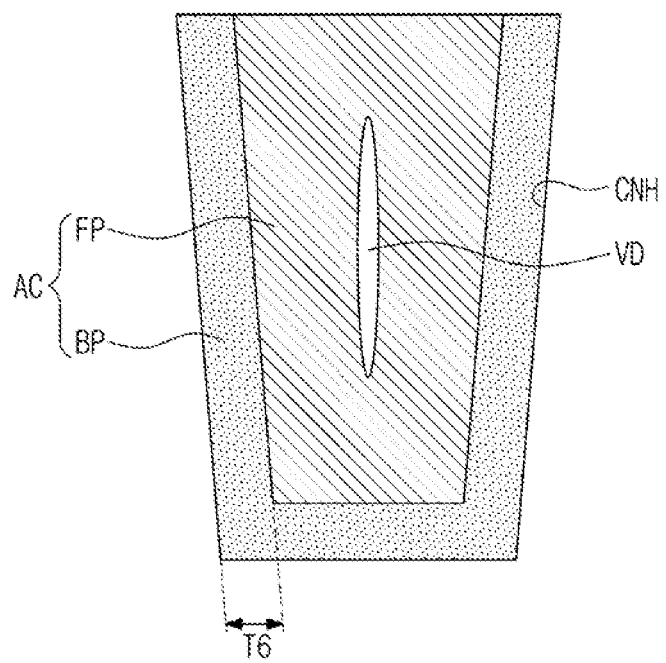
FIG. 8 illustrates a cross-sectional view showing an active contact according to a comparative example.

FIG. 4 illustrates a plan view showing a semiconductor device according to an embodiment. FIGS. 5A, 5B, 5C, and 5D illustrate cross-sectional views respectively taken along lines A-A', B-B', C-C', and D-D' of FIG. 4. FIG. 6 illustrates an enlarged view showing an example of section M depicted in FIG. 5A. FIG. 7 illustrates an enlarged view showing an example of section N depicted in FIG. 5A. FIG. 8 illustrates a cross-sectional view showing an active contact according to a comparative example. A semiconductor device shown in FIGS. 4 and 5A to 5D is a detailed example of the first and second single height cells SHC1 and SHC2 of FIG. 3.

Referring to FIGS. 4 and 5A to 5D, first and second single height cells SHC1 and SHC2 may be provided on a substrate 100. Each of the first and second single height cells SHC1 and SHC2 may include logic transistors included in a logic circuit. The substrate 100 may be a compound semiconductor substrate or a semiconductor substrate including silicon, germanium, or silicon-germanium. For example, the substrate 100 may be a silicon substrate.

The substrate 100 may have a first PMOSFET region PR1, a second PMOSFET region PR2, a first NMOSFET region NR1, and a second NMOSFET region NR2. Each of the first and second PMOSFET and NMOSFET regions PR1, PR2, NR1, and NR2 may extend in a second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 (see, e.g., FIG. 5A) and a second active pattern AP2 (see, e.g., FIG. 5B) may be defined by a trench TR (see, e.g., FIG. 5C) formed on an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be vertically protruding portions of the substrate 100.

The trench TR may be filled with a device isolation layer ST. The device isolation layer ST may include a silicon oxide layer. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (e.g., a third direction D3).

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon.

A plurality of first source/drain patterns SD1 (see, e.g., FIG. 5A) may be provided on the first active pattern AP1. A plurality of first recesses RS1 may be formed on an upper portion of the first active pattern AP1. The first source/drain patterns SD1 may be provided in corresponding first recesses RS1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 (see, e.g., FIG. 5B) may be provided on the second active pattern AP2. A plurality of second recesses RS2 may be formed on an upper portion of the second active pattern AP2. The second source/drain patterns SD2 may be provided in corresponding second recesses RS2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth (SEG) process. For example, each of the first and second source/drain patterns SD1 and SD2 may have a top surface higher than that of the third semiconductor pattern SP3. For another example, at least one selected from the first and second source/drain patterns SD1 and SD2 may have a top surface at substantially the same level as that of a top surface of the third semiconductor pattern SP3.

The first source/drain patterns SD1 may include a semiconductor element (e.g., SiGe) whose lattice constant is greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Each of the first source/drain patterns SD1 may include a buffer layer BFL and a main layer MAL on the buffer layer BFL. With reference to FIG. 5A, the following will describe a cross-section in the second direction D2 of the first source/drain pattern SD1.

The buffer layer BFL may cover an inner wall of the first recess RS1. In an embodiment, the buffer layer BFL may have a thickness that decreases in a direction from lower to upper portions thereof. For example, a thickness in the third direction D3 of the buffer layer BFL on a bottom surface of the first recess RS1 may be greater than a thickness in the second direction D2 of the buffer layer BFL on an upper portion of the first recess RS1. The buffer layer BFL may have a U shape along the inner wall of the first recess RS1.

The main layer MAL may fill most of an unoccupied portion of the first recess RS1 in which the buffer layer BFL is formed. The main layer MAL may have a volume greater than that of the buffer layer BFL. For example, a ratio of the volume of the main layer MAL to a total volume of the first source/drain pattern SD1 may be greater than a ratio of the volume of the buffer layer BFL to the total volume of the first source/drain pattern SD1.

Each of the buffer layer BFL and the main layer MAL may include silicon-germanium (SiGe). For example, the buffer layer BFL may contain germanium (Ge) whose concentration is relatively low. In an embodiment, the buffer layer BFL may contain silicon (Si), but not include germanium (Ge). A concentration of germanium (Ge) in the buffer layer BFL may range from about 0 at % to about 10 at %. For example, the concentration of germanium (Ge) in the buffer layer BFL may range from about 2 at % to about 8 at %.

The main layer MAL may contain germanium (Ge) whose concentration is relatively high. For example, a concentration of germanium (Ge) in the main layer MAL may range from about 30 at % to about 70 at %. The germanium concentration of the main layer MAL may increase in the third direction D3. For example, the germanium concentration of the main layer MAL adjacent to the buffer layer BFL may have about 40 at %, and the germanium concentration at an upper portion of the main layer MAL may have about 60 at %.

Each of the buffer layer BFL and the main layer MAL may include an impurity (e.g., boron, gallium, or indium) that causes the first source/drain pattern SD1 to have a p-type conductivity. The main layer MAL may have an impurity concentration greater than that of the buffer layer BFL.

The buffer layer BFL may prevent stacking faults between the main layer MAL and the substrate 100 (or the first active pattern AP1) and between the main layer MAL and the first, second, and third semiconductor patterns SP1, SP2, and SP3. The occurrence of stacking faults may increase a channel resistance. The stacking faults may easily occur at the bottom of the first recess RS1. Therefore, it may be preferable that the buffer layer BFL adjacent to the bottom surface of the first recess RS1 has a relatively large thickness to prevent stacking faults.

Figure 14A:
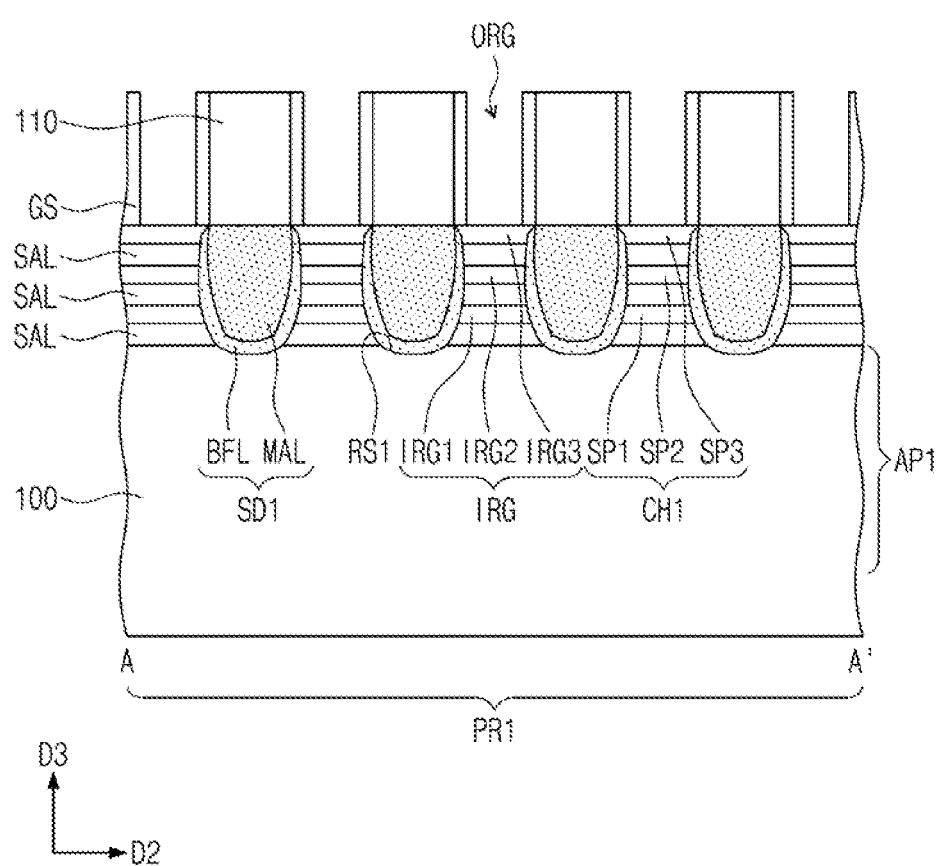
Figure 14B:
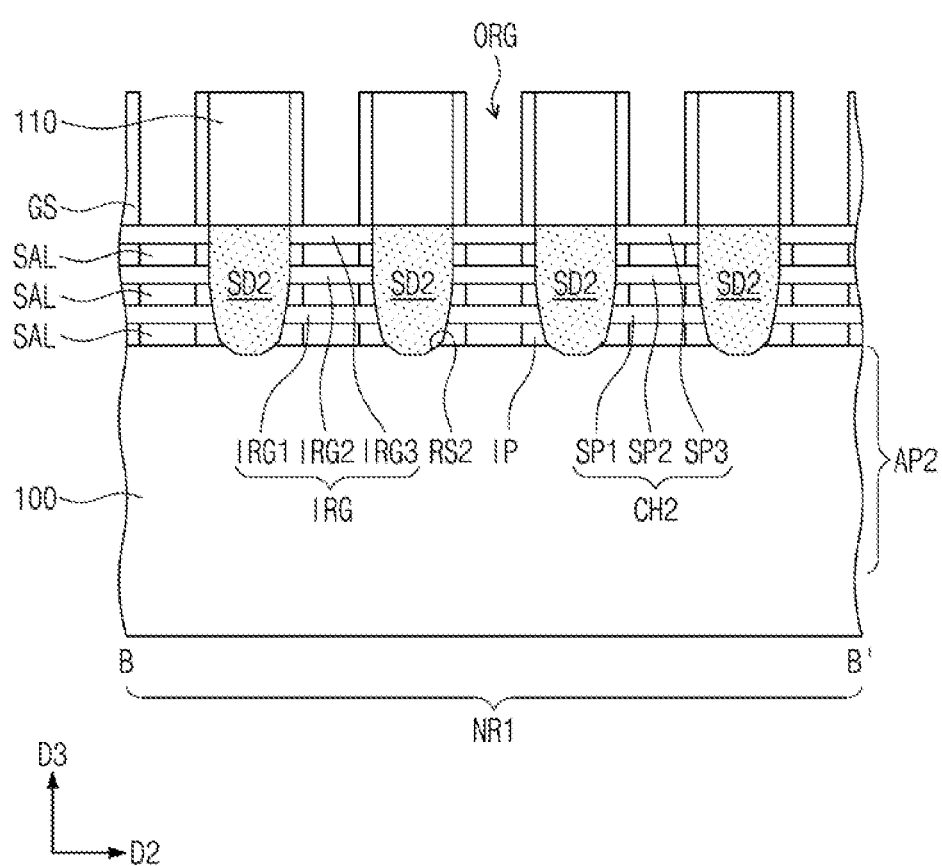
Figure 14C:
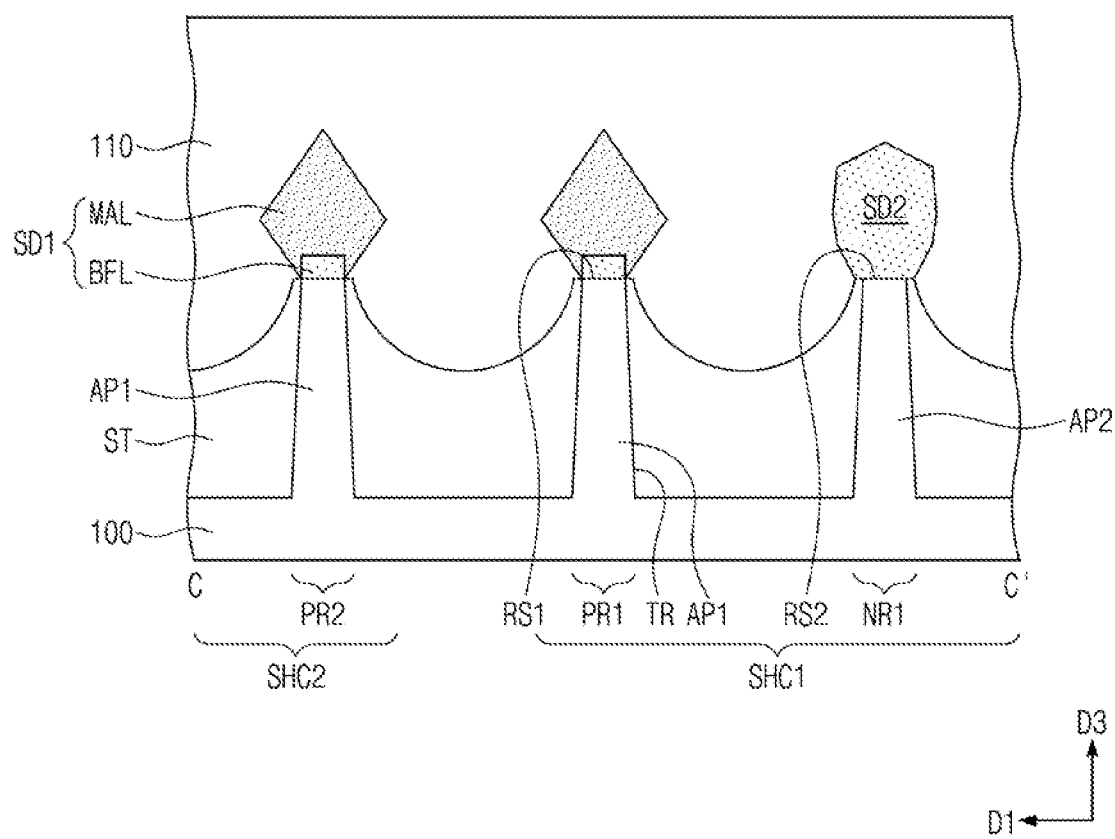
Figure 15A:
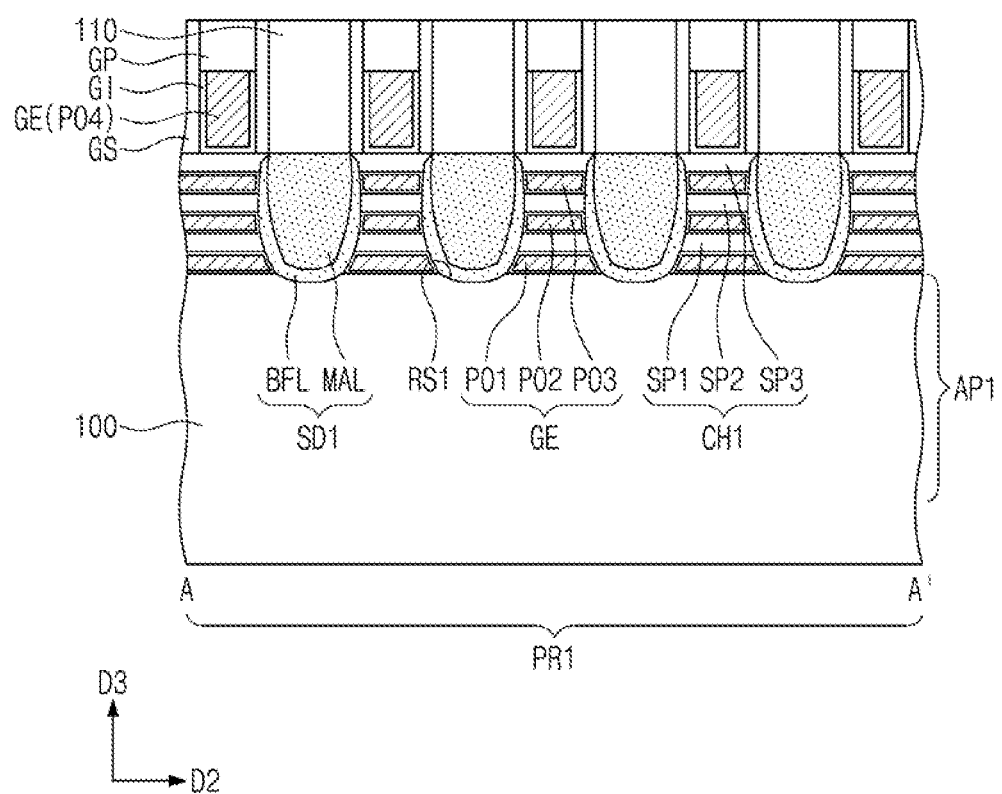
Figure 15B:
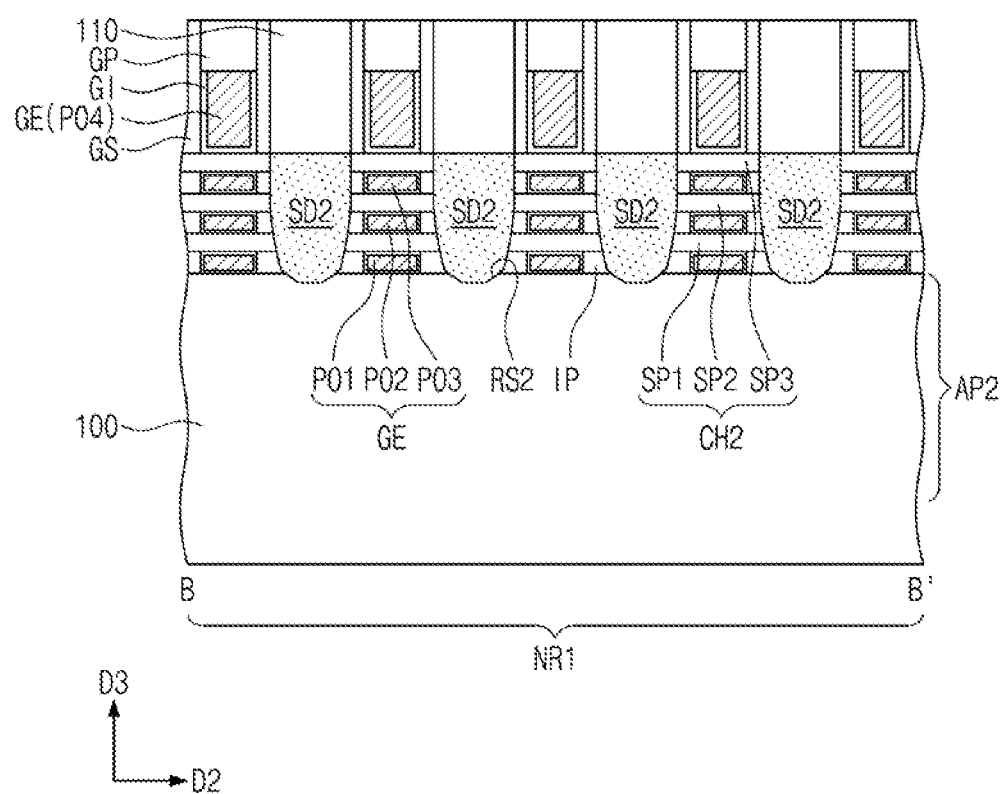
Figure 15C:
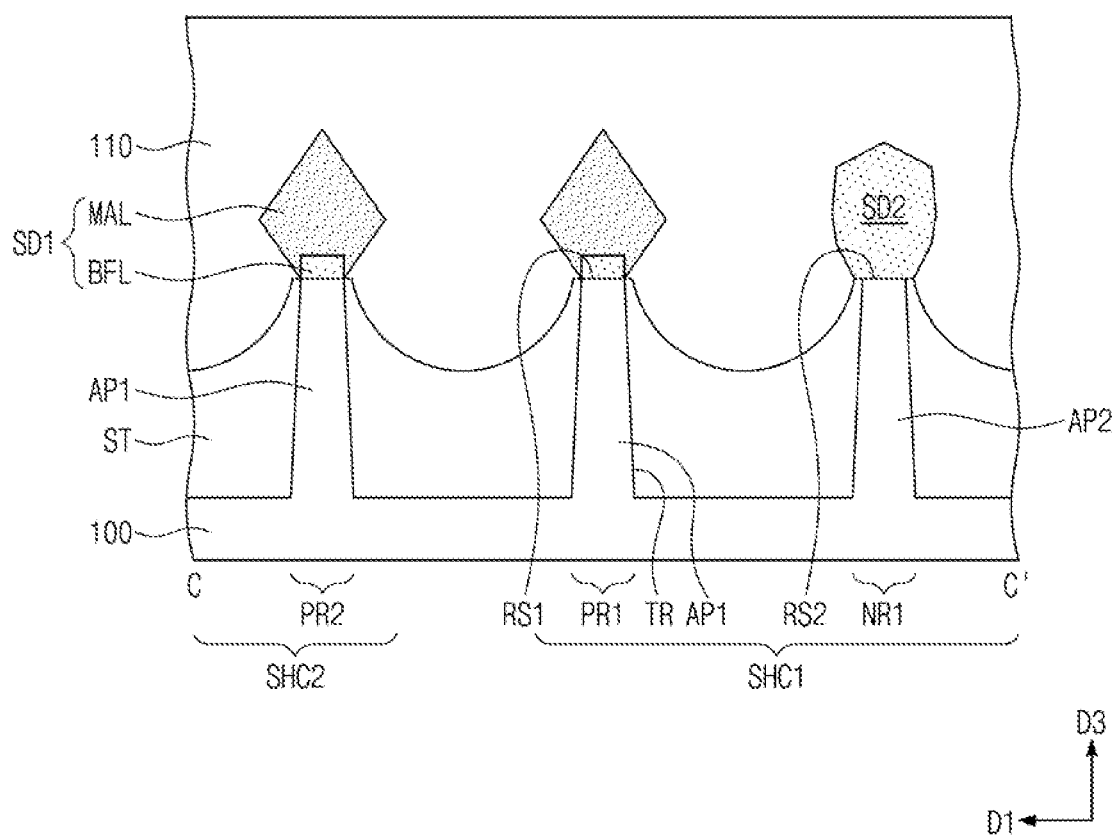
Figure 15D:
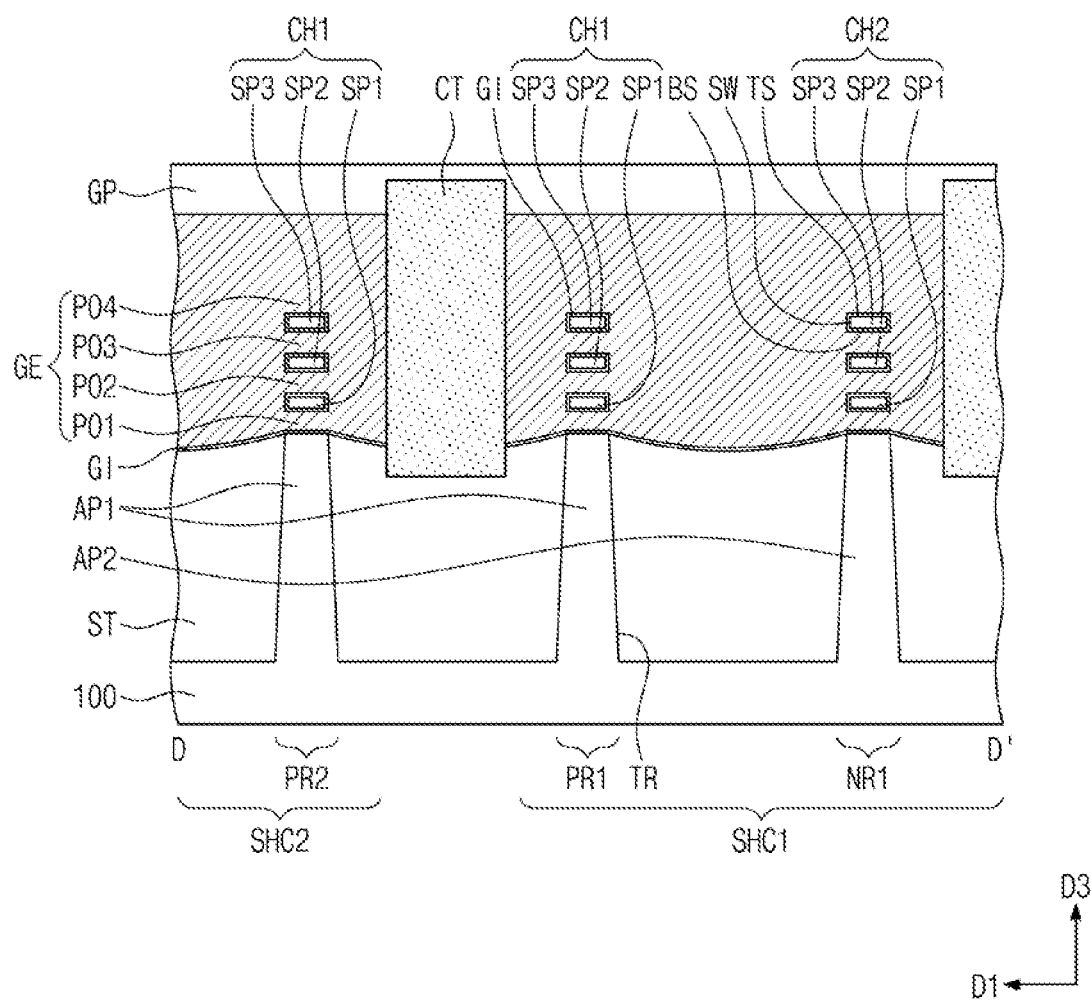

The buffer layer BFL may protect the main layer MAL while sacrificial layers SAL are replaced with first, second, and third portions PO1, PO2, and PO3 of a gate electrode GE which will be discussed below with reference, e.g., to FIGS. 14A and 15A. For example, the buffer layer BFL may prevent the main layer MAL from being etched with an etching material that removes the sacrificial layers SAL which will be discussed below.

Referring back to FIGS. 4 and 5A to 5D, gate electrodes GE may be provided to extend in a first direction D1 and to run across the first and second channel patterns CH1 and CH2. The gate electrodes GE may be arranged in the second direction D2 at a first pitch. Each of the gate electrodes GE may vertically overlap the first and second channel patterns CH1 and CH2.

The gate electrode GE may include a first portion PO1 interposed between the first semiconductor pattern SP1 and one of the first and second active patterns AP1 and AP2, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 5A, on the first PMOSFET region PR1, the gate electrode GE may have different widths at the first, second, and third portions PO1, PO2, and PO3 thereof. For example, a maximum width in the second direction D2 of the third portion PO3 may be greater than a maximum width in the second direction D2 of the second portion PO2. A maximum width in the second direction D2 of the first portion PO1 may be greater than the maximum in the second direction D2 of the third portion PO3.

Referring back to FIG. 5D, the gate electrode GE may be provided on a top surface TS, a bottom surface BS, and opposite sidewalls SW of each of the first, second, and third semiconductor patterns SP1, SP2, and SP3. In this sense, a transistor according to an embodiment may be a three-dimensional field effect transistor (e.g., MBCFET or GAAFET) in which the gate electrode GE three-dimensionally surrounds the first and second channel patterns CH1 and CH2.

Referring again to FIGS. 4 and 5A to 5D, the first single height cell SHC1 may have a first boundary BD1 and a second boundary BD2 that are opposite to each other in the second direction D2. The first and second boundaries BD1 and BD2 may extend in the first direction D1. The first single height cell SHC1 may have a third boundary BD3 and a fourth boundary BD4 that are opposite to each other in the first direction D1. The third and fourth boundaries BD3 and BD4 may extend in the second direction D2.

Gate cutting patterns CT may be disposed on a boundary in the second direction D2 of each of the first and second single height cells SHC1 and SHC2. For example, the gate cutting patterns CT may be located on the third and fourth boundaries BD3 and BD4 of the first single height cell SHC1. The gate cutting patterns CT may be arranged at the first pitch along the third boundary BD3. The gate cutting patterns CT may be arranged at the first pitch along the fourth boundary BD4. The gate cutting patterns CT may include a dielectric material, such as a silicon oxide layer, a silicon nitride layer, or a combination thereof.

The gate cutting pattern CT may separate the gate electrode GE on the first single height cell SHC1 from the gate electrode GE on the second single height cell SHC2. The gate cutting pattern CT may be interposed between the gate electrode GE on the first single height cell SHC1 and the gate electrode GE on the second single height cell SHC2, which gate electrodes GE are aligned with each other in the first direction D1. For example, the gate cutting patterns CT may divide the gate electrode GE, which extends in the first direction D1, into a plurality of gate electrodes GE.

A pair of gate spacers GS may be disposed on opposite sidewalls of the fourth portion PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. In an embodiment, the gate spacers GS may include at least one selected from SiCN, SiCON, and SiN. Alternatively, the gate spacers GS may include a multi-layer formed of two or more of SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover a top surface of the device isolation layer ST below the gate electrode GE.

In an embodiment, the gate dielectric layer GI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In an embodiment, a semiconductor device may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing (SS) of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the disclosure is not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the disclosure is not limited thereto. Because ferroelectric materials have their own critical thickness that exhibits ferroelectric properties, the thickness of the ferroelectric material layer may depend on ferroelectric material.

For example, the gate dielectric layer GI may include one ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI to be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third portions PO1, PO2, and PO3 of the gate electrode GE may be formed of the first metal pattern or a work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta). For example, the fourth portion PO4 of the gate electrode GE may include the first metal pattern and the second metal pattern on the first metal pattern.

Referring back to FIG. 5B, inner spacers IP may be provided on the first and second NMOSFET regions NR1 and NR2. For example, the inner spacers IP may be provided on the second active pattern AP2. The inner spacers IP may be interposed between the second source/drain pattern SD2 and the first, second, and third portions PO1, PO2, and PO3 of the gate electrode GE. The inner spacers IP may be in direct contact with the second source/drain pattern SD2. The inner spacer IP may separate the second source/drain pattern SD2 from each of the first, second, and third portions PO1, PO2, and PO3 of the gate electrode GE.

A first interlayer dielectric layer 110 (see, e.g., FIG. 5C) may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Each of the first and second single height cells SHC1 and SHC2 may be provided on its opposite sides with a pair of separation structures DB that are opposite to each other in the second direction D2. For example, the pair of separation structures DB may be correspondingly provided on first and second boundaries BD1 and BD2 of the first single height cell SHC1. The separation structure DB may extend in the first direction D1 parallel to the gate electrodes GE.

The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may electrically separate an active region of each of the first and second single height cells SHC1 and SHC2 from an active region of another cell.

Active contacts AC may be provided to penetrate the first and second interlayer dielectric layers 110 and 120 and to correspondingly electrically connect to the first and second source/drain patterns SD1 and SD2. A pair of active contacts AC may be provided on opposite sides of the gate electrode GE. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. For example, the active contact AC may cover at least a portion of a sidewall of the gate spacer GS. The active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one selected from titanium silicide, tantalum silicide, nickel silicide, and cobalt silicide.

Gate contacts GC may be provided to penetrate the second interlayer dielectric layer 120 and the gate capping pattern GP and to electrically connect to corresponding gate electrodes GE.

Figure 5B:
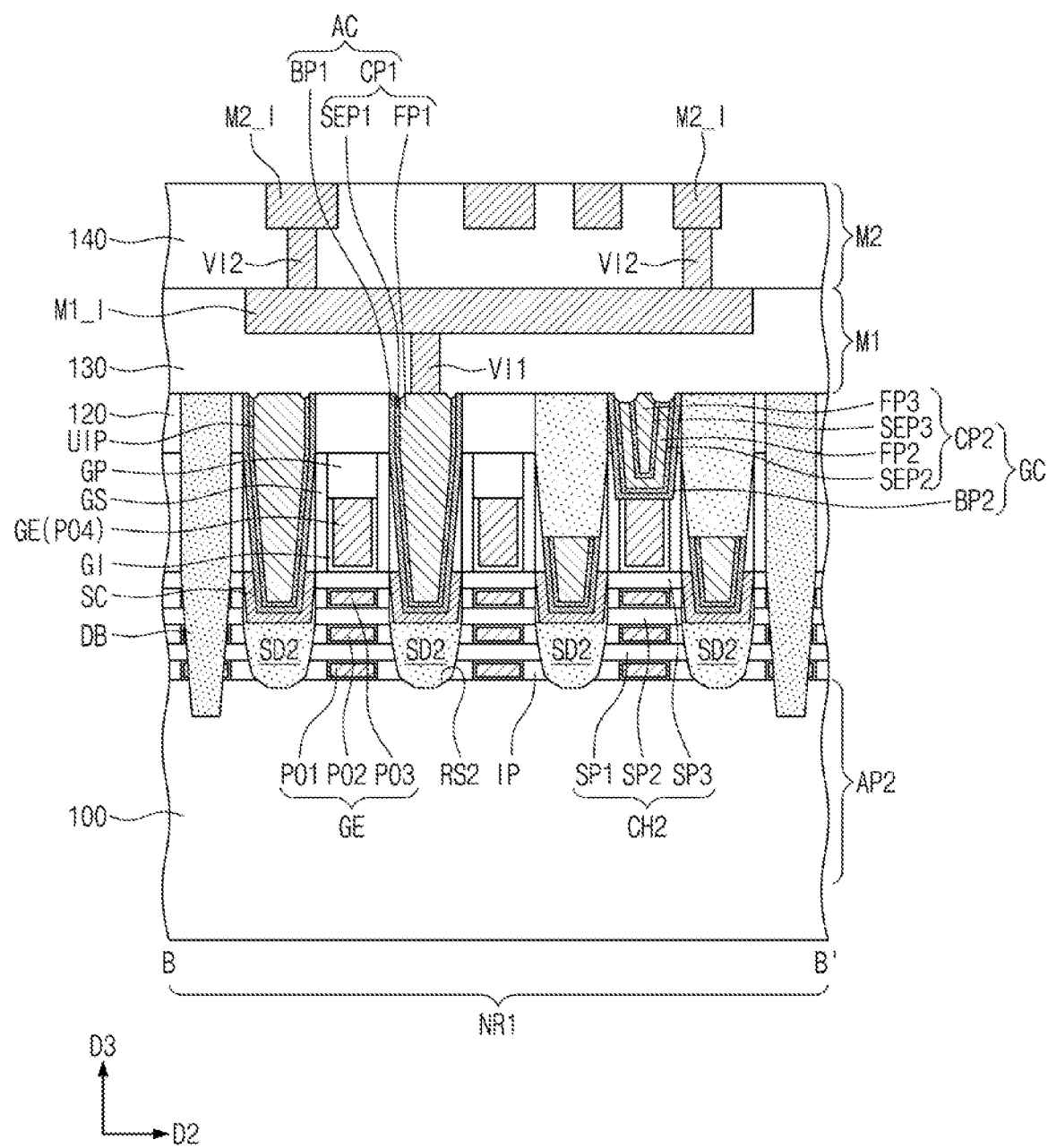
Figure 5C:
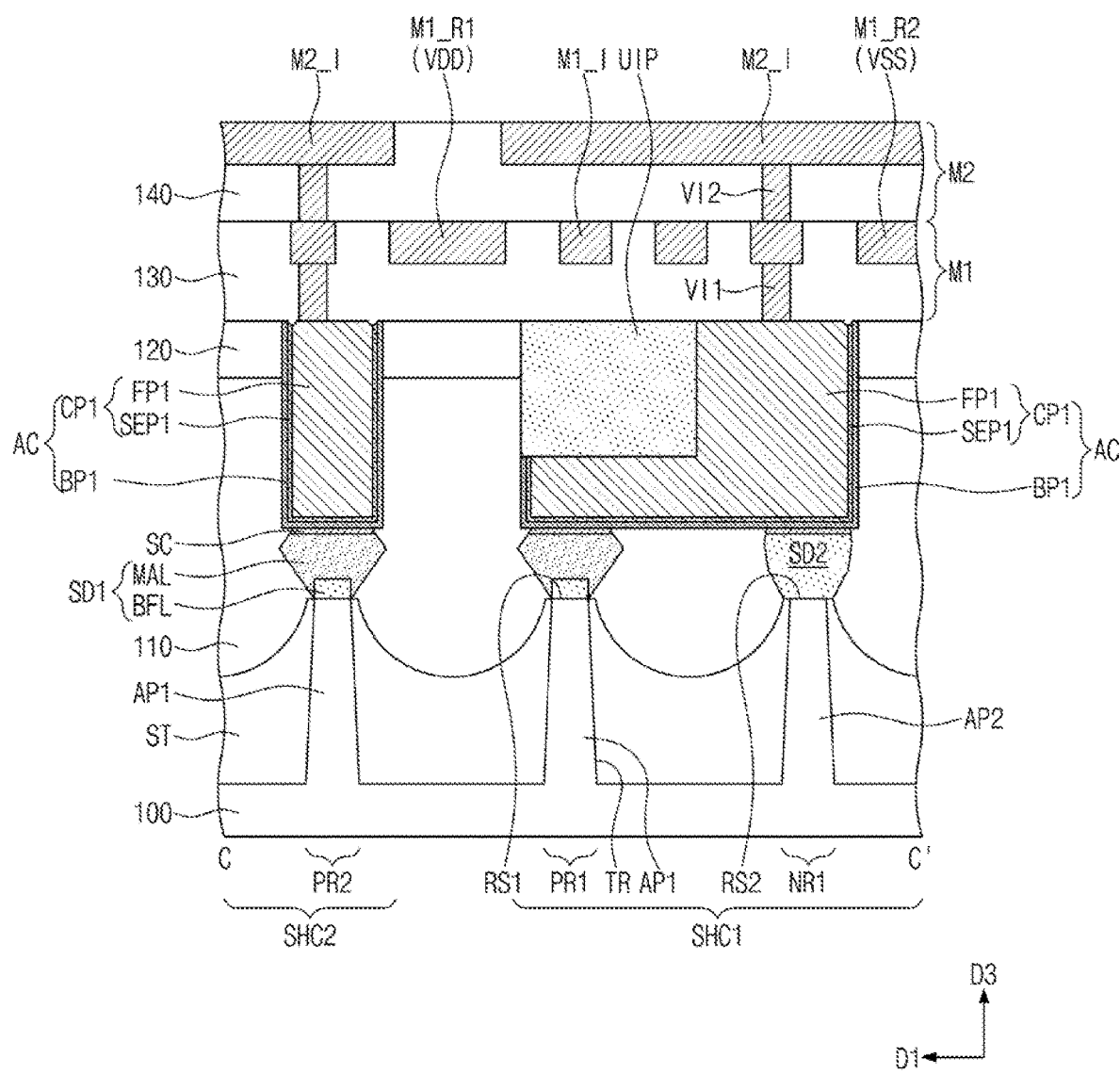
Figure 5D:
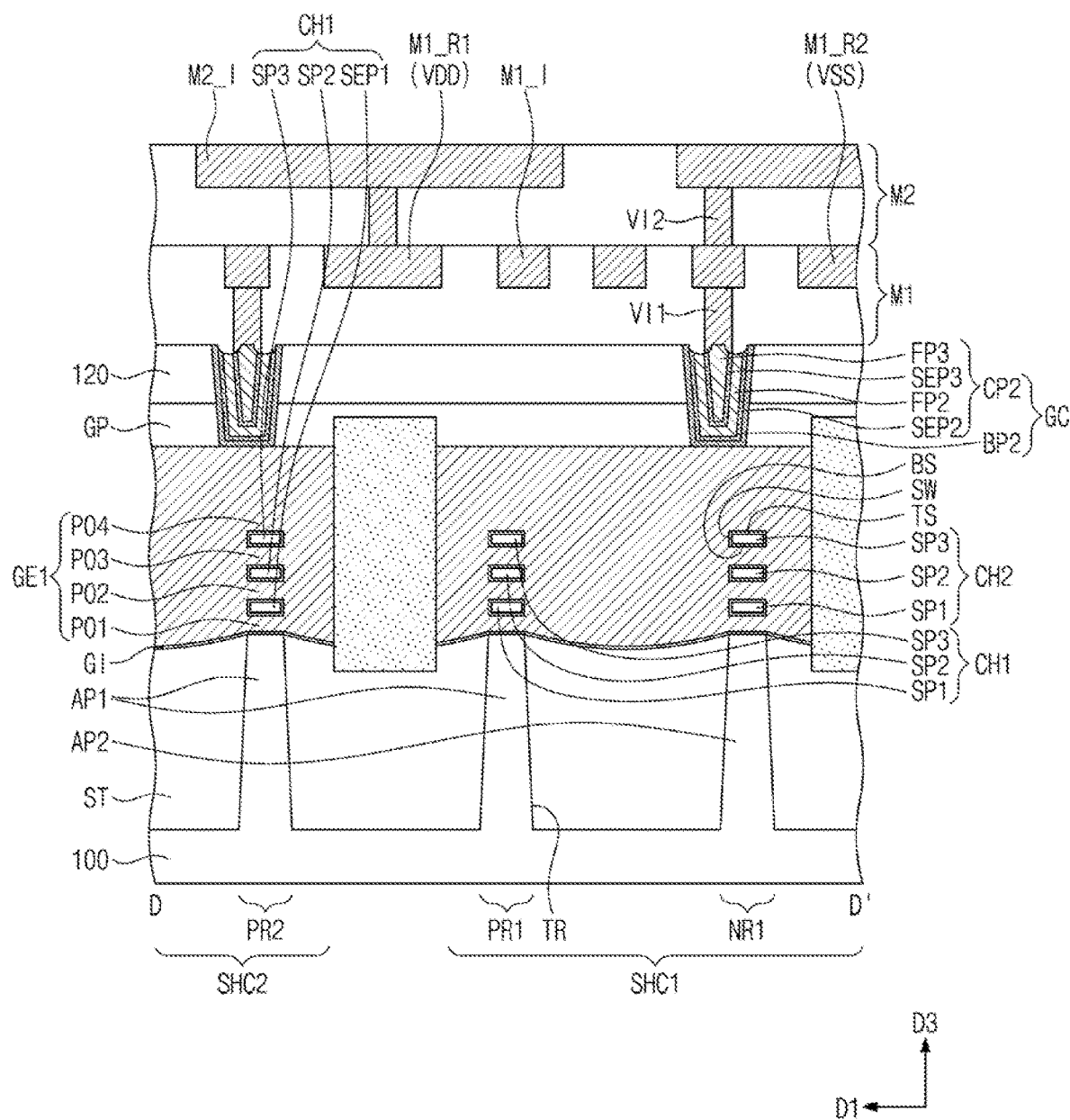

In an embodiment, referring to FIGS. 5A and 5B, an upper dielectric pattern UIP may fill an upper portion of each of the active contacts AC, which upper portion is adjacent to the gate contact GC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to prevent a short circuit resulting from contact between the gate contact GC and its adjacent active contact AC.

A first metal layer M1 may be provided in the third interlayer dielectric layer 130. For example, the first metal layer M1 may include a first power line M1_R1, a second power line M1_R2, a third power line M1_R3, and first wiring lines M1_I. The lines M1_R1, M1_R2, M1_R3, and M1_I of the first metal layer M1 may extend parallel to each other in the second direction D2.

For example, the first and second power lines M1_R1 and M1_R2 may be correspondingly provided on the third and fourth boundaries BD3 and BD4 of the first single height cell SHC1. The first power line M1_R1 may extend in the second direction D2 along the third boundary BD3. The second power line M1_R2 may extend in the second direction D2 along the fourth boundary BD4.

The first wiring lines M1_I of the first metal layer M1 may be arranged along the first direction D1 at a second pitch. The second pitch may be less than the first pitch. Each of the first wiring lines M1_I may have a line-width less than that of each of the first, second, and third power lines M1_R1, M1_R2, and M1_R3.

The first metal layer M1 may further include first vias VI1. The first vias VI1 may be correspondingly provided below the lines M1_R1, M1_R2, M1_R3, and M1_I of the first metal layer M1. The first via VI1 may electrically connect the active contact AC to one of the lines M1_R1, M1_R2, M1_R3, and M1_I of the first metal layer M1. The first via VI1 may electrically connect the gate contact GC to one of the lines M1_R1, M1_R2, M1_R3, and M1_I of the first metal layer M1.

A wiring line and its underlying first via VI1 of the first metal layer M1 may be formed by individual processes. For example, a wiring line and its underlying first via VI1 of the first metal layer M1 may each be formed by a single damascene process. A sub-20 nm process may be employed to fabricate a semiconductor device according to an embodiment.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may extend parallel to each other in the first direction D1.

The second metal layer M2 may further include second vias VI2 correspondingly provided below the second wiring lines M2_I. A wiring line of the first metal layer M1 may be electrically through the second via VI2 to a corresponding wiring line of the second metal layer M2. For example, a wiring line and its underlying second via VI2 of the second metal layer M2 may be simultaneously formed by a dual damascene process.

The first and second metal layers M1 and M2 may have their wiring lines that include the same or different conductive materials. For example, the wiring line of the first metal layer M1 and the wiring line of the second metal layer M2 may include at least one metal selected from copper, ruthenium, aluminum, tungsten, molybdenum, and cobalt. Other metal layers (e.g., M3, M4, M5, etc.) may be additionally stacked on the fourth interlayer dielectric layer 140. Each of the stacked metal layers may include wiring lines for routing between cells.

With reference to FIGS. 6 and 7, the following will describe in detail the active contact AC and the gate contact GC. Referring to FIG. 6, the active contact AC may include a first barrier pattern BP1 and a first conductive pattern CP1 on the first barrier pattern BP1. The first barrier pattern BP1 may be provided on an inner wall of a first contact hole CNH1 that penetrates the first interlayer dielectric layer 110. The first barrier pattern BP1 may be conformally formed. The first barrier pattern BP1 may include metal nitride. For example, the first barrier pattern BP1 may include at least one selected from titanium nitride (TiN), tantalum nitride (TaN), nickel nitride (NiN), cobalt nitride (CoN), and platinum nitride (PtN). For example, the first barrier pattern BP1 may include titanium nitride (TiN).

The first conductive pattern CP1 may include a first seed pattern SEP1, a first metal-containing pattern MC1, and a first fill pattern FP1 that are sequentially stacked. The first seed pattern SEP1 may be provided on the first barrier pattern BP1. The first seed pattern SEP1 may be conformally formed along an inner wall of the first barrier pattern BP1. The first seed pattern SEP1 may include at least one selected from aluminum, copper, tungsten, molybdenum, and cobalt, and may further include boron. For example, the first seed pattern SEP1 may include tungsten and boron.

The first metal-containing pattern MC1 may be provided on the first seed pattern SEP1. The first metal-containing pattern MC1 may be formed along an inner wall of the first seed pattern SEP1. The first metal-containing pattern MC1 may include metal nitride. For example, the first metal-containing pattern MC1 may include at least one selected from aluminum nitride, copper nitride, tungsten nitride, molybdenum nitride, and cobalt nitride. For more detail, the first metal-containing pattern MC1 may include tungsten nitride (WN).

A first thickness T1 may be defined to indicate a thickness of the first metal-containing pattern MC1. The first thickness T1 may decrease in a downward direction. For example, the first thickness T1 may decrease in a direction toward the substrate 100.

The first metal-containing pattern MC1 may have a nitrogen concentration that decreases in a downward direction. For example, the nitrogen concentration of the first metal-containing pattern MC1 may decrease in a direction toward the substrate 100. A first concentration CN1 may be defined to indicate a nitrogen concentration at an upper portion of the first metal-containing pattern MC1. The first concentration CN1 may be a maximum concentration of nitrogen in the first metal-containing pattern MC1. A second concentration CN2 may be defined to indicate a nitrogen concentration at an intermediate portion of the first metal-containing pattern MC1. A third concentration CN3 may be defined to indicate a nitrogen concentration at a lower portion of the first metal-containing pattern MC1. The third concentration CN3 may be a minimum concentration of nitrogen in the first metal-containing pattern MC1. For example, the first concentration CN1 may range from about 7 at % to about 10 at %. The second concentration CN2 may range from about 3 at % to about 4 at %. The third concentration CN3 may range from about 0 at % to about 1 at %.

The first fill pattern FP1 may fill an unoccupied portion of the first contact hole CNH1. The first fill pattern FP1 may include at least one selected from aluminum, copper, tungsten, molybdenum, and cobalt. For example, the first fill pattern FP1 may include tungsten. The first metal-containing pattern MC1 may be provided between the first seed pattern SEP1 and the first fill pattern FP1.

A top surface ACu of the active contact AC may include a first recess region RSR1 or an area that is recessed toward the substrate 100. The first recess region RSR1 may be defined by a top surface of the first seed pattern SEP1 and a top surface of the first metal-containing pattern MC1. For example, the first seed pattern SEP1 and the first metal-containing pattern MC1 may have their top surfaces each of which has a curved profile. The top surface of each of the first seed pattern SEP1 and the first metal-containing pattern MC1 may be located at a lower level than that of an uppermost surface of the first fill pattern FP1. The third interlayer dielectric layer 130 may fill the first recess region RSR1. For example, the third interlayer dielectric layer 130 may have a portion that protrudes toward the first recess region RSR1.

Referring to FIG. 7, the gate contact GC may include a second barrier pattern BP2 and a second conductive pattern CP2. The second barrier pattern BP2 may be provided on an inner wall of a second contact hole CNH2 that penetrates the second interlayer dielectric layer 120. The second barrier pattern BP2 may be conformally formed. The second barrier pattern BP2 may include metal nitride. For example, the second barrier pattern BP2 may include at least one selected from titanium nitride (TiN), tantalum nitride (TaN), nickel nitride (NiN), cobalt nitride (CoN), and platinum nitride (PtN). For more detail, the second barrier pattern BP2 may include titanium nitride (TiN).

The second conductive pattern CP2 may include a second seed pattern SEP2, a second metal-containing pattern MC2, a second fill pattern FP2, a third seed pattern SEP3, a third metal-containing pattern MC3, and a third fill pattern FP3 that are sequentially stacked. The second seed pattern SEP2 may be provided on the second barrier pattern BP2. The second seed pattern SEP2 may be conformally formed along an inner wall of the second barrier pattern BP2. The second seed pattern SEP2 may include at least one selected from aluminum, copper, tungsten, molybdenum, and cobalt, and may further include boron. For example, the second seed pattern SEP2 may include tungsten and boron.

The second metal-containing pattern MC2 may be provided on the second seed pattern SEP2. The second metal-containing pattern MC2 may be formed along an inner wall of the second seed pattern SEP2. The second metal-containing pattern MC2 may include metal nitride. For example, the second metal-containing pattern MC2 may include at least one selected from aluminum nitride, copper nitride, tungsten nitride, molybdenum nitride, and cobalt nitride. For more detail, the second metal-containing pattern MC2 may include tungsten nitride (WN).

A second thickness T2 may be defined to indicate a thickness of the second metal-containing pattern MC2. The second thickness T2 may decrease in a downward direction. For example, the second thickness T2 may decrease in a direction toward the substrate 100.

The second metal-containing pattern MC2 may have a nitrogen concentration that decreases in a downward direction. For example, the nitrogen concentration of the second metal-containing pattern MC2 may decrease in a direction toward the substrate 100. A fourth concentration CN4 may be defined to indicate a nitrogen concentration at an upper portion of the second metal-containing pattern MC2. The fourth concentration CN4 may be a maximum concentration of nitrogen in the second metal-containing pattern MC2. A fifth concentration CN5 may be defined to indicate a nitrogen concentration at a lower portion of the second metal-containing pattern MC2. The fifth concentration CN5 may be a minimum concentration of nitrogen in the second metal-containing pattern MC2. The fourth concentration CN4 may range from about 3 at % to about 4 at %. The fifth concentration CN5 may range from about 0 at % to about 1 at %.

The second fill pattern FP2 may be provided on the second metal-containing pattern MC2. The second fill pattern FP2 may be conformally formed on the second metal-containing pattern MC2. The second fill pattern FP2 may include at least one selected from aluminum, copper, tungsten, molybdenum, and cobalt. For example, the second fill pattern FP2 may include tungsten.

The third seed pattern SEP3 may be provided on the second fill pattern FP2. The third seed pattern SEP3 may be conformally formed along an inner wall of the second fill pattern FP2. The third seed pattern SEP3 may include the same material as that of the second seed pattern SEP2. For example, the third seed pattern SEP3 may include tungsten and boron.

The third metal-containing pattern MC3 may be provided on the third seed pattern SEP3. The third metal-containing pattern MC3 may be formed along an inner wall of the third seed pattern SEP3. The third metal-containing pattern MC3 may include the same material as that of the second metal-containing pattern MC2. For example, the third metal-containing pattern MC3 may include tungsten nitride (WN).

A third thickness T3 may be defined to indicate a thickness of the third metal-containing pattern MC3. The third thickness T3 may decrease in a downward direction. For example, the third thickness T3 may decrease in a direction toward the substrate 100.

The third metal-containing pattern MC3 may have a nitrogen concentration that decreases in a downward direction. For example, the nitrogen concentration of the third metal-containing pattern MC3 may decrease in a direction toward the substrate 100. The nitrogen concentration of the third metal-containing pattern MC3 may have a profile the same as or similar to that of the nitrogen concentration of the second metal-containing pattern MC2. For example, the nitrogen concentration of the third metal-containing pattern MC3 may range from about 3 at % to about 4 at % at an upper portion of the third metal-containing pattern MC3 and from about 0 at % to about 1 at % at a lower portion of the third metal-containing pattern MC3.

The third fill pattern FP3 may fill an unoccupied portion of the second contact hole CNH2. The third fill pattern FP3 may include at least one selected from aluminum, copper, tungsten, molybdenum, and cobalt. For example, the third fill pattern FP3 may include tungsten.

The second fill pattern FP2 may include first grains CRS1. The third fill pattern FP3 may include second grains CRS2. For example, each of the first and second grains CRS1 and CRS2 may have a body centered cubic (BCC) structure. The first grain CRS1 may have a size smaller than that of the second grain CRS2. This may be derived from the fact that a process temperature is greater when the third fill pattern FP3 is formed than when the second fill pattern FP2 is formed. Among crystal planes included in each of the first, second, and third fill patterns FP1, FP2, and FP3, a crystal plane of (200) may have a proportion greater than that of any other crystal plane.

A top surface GCu of the gate contact GC may include a second recess region RSR2 or an area that is recessed toward the substrate 100. The second recess region RSR2 may be defined by a top surface of each of the second seed pattern SEP2, the second metal-containing pattern MC2, the second fill pattern FP2, the third seed pattern SEP3, and the third metal-containing pattern MC3. For example, a curved profile may be provided to the top surface of each of the second seed pattern SEP2, the second metal-containing pattern MC2, the second fill pattern FP2, the third seed pattern SEP3, and the third metal-containing pattern MC3. The top surface of each of the second seed pattern SEP2, the second metal-containing pattern MC2, the second fill pattern FP2, the third seed pattern SEP3, and the third metal-containing pattern MC3 may be located at a lower level than that of an uppermost surface of the third fill pattern FP3. The third interlayer dielectric layer 130 may fill the second recess region RSR2. For example, the third interlayer dielectric layer 130 may have a portion that protrudes toward the second recess region RSR2. The first via VI1 may extend toward a partial area of the second recess region RSR2.

FIG. 8 illustrates a cross-sectional view showing an active contact according to a comparative example.

Referring to FIG. 8, an active contact AC of a semiconductor device according to a comparative example may include a barrier pattern BP that is conformally formed in a contact hole CNH, and may also include on the barrier pattern BP a fill pattern FP that fills an unoccupied portion of the contact hole CNH. The barrier pattern BP may include at least one selected from titanium nitride (TiN), tantalum nitride (TaN), nickel nitride (NiN), cobalt nitride (CoN), and platinum nitride (PtN). For example, the barrier pattern BP may include titanium nitride. The fill pattern FP may include at least one selected from aluminum, copper, tungsten, molybdenum, and cobalt. For example, the fill pattern FP may include tungsten. A gate contact of the semiconductor device according to a comparative example may have a structure the same as or similar to that of the active contact AC.

The active contact AC may include a void VD therein. The fill pattern FP may be formed by using a deposition process such as atomic layer deposition (ALD), and thus when the contact hole CNH has a large width, the fill pattern FP may not completely fill an unoccupied portion of the contact hole CNH, with the result that the void VD may be formed.

A fourth thickness T4 may be defined to indicate a thickness of the first barrier pattern BP1 discussed with reference to FIG. 6, and a fifth thickness T5 may be defined to indicate a thickness of the second barrier pattern BP2 discussed with reference to FIG. 7. A sixth thickness T6 may be defined to indicate a thickness of the barrier pattern BP discussed with reference to FIG. 8. The sixth thickness T6 may be greater than each of the fourth thickness T4 and the fifth thickness T5.

An increase in thickness of the barrier pattern BP including titanium nitride (TiN) may induce an increase in resistance of the barrier pattern BP, and thus a semiconductor device may decrease in electrical properties. According to an embodiment, the formation of the first and second metal-containing patterns MC1 and MC2 may reduce thicknesses of the first and second barrier patterns BP1 and BP2. Therefore, it may be possible to form the active contact AC and the gate contact GC each of which has a relatively low resistance. In conclusion, a semiconductor device may increase in electrical properties.

In addition, the formation of the first, second, and third metal-containing patterns MC1, MC2, and MC3 may reduce widths of the first and third fill patterns FP1 and FP3. For example, it may be possible to prevent the occurrence of void VD or to reduce a thickness of the void VD in forming the first fill pattern FP1 and the third fill pattern FP3 that fill an unoccupied portion of the first contact hole CNH1 and an unoccupied portion of the second contact hole CNH2. Accordingly, the active contact AC and the gate contact GC may be suppressed or prevented from resistance increase due to the void VD. In conclusion, a semiconductor device may increase in electrical properties.

FIGS. 9A to 19C illustrate cross-sectional views showing a method of fabricating a semiconductor device according to an embodiment. FIGS. 9A, 10A, 11A, 12A, 13A, 14A, 15A, 16A, and 18A illustrate cross-sectional views taken along line A-A' of FIG. 4. FIGS. 11B, 12B, 13B, 14B, 15B, 16B, and 18B illustrate cross-sectional views taken along line B-B' of FIG. 4. FIGS. 11C, 12C, 13C, 14C, 15C, 16C, and 18C illustrate cross-sectional views taken along line C-C' of FIG. 4. FIGS. 9B, 10B, 11D, 12D, 13D, 14D, 15D, 16D, and 18D illustrate cross-sectional views taken along line D-D' of FIG. 4.

Figure 9A:
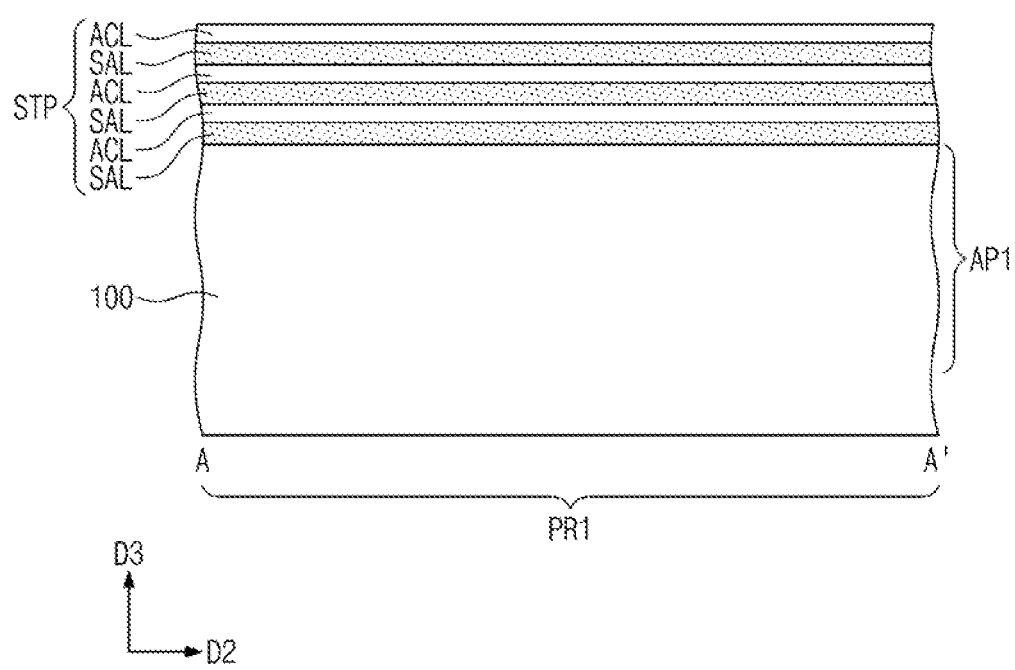
Figure 9B:
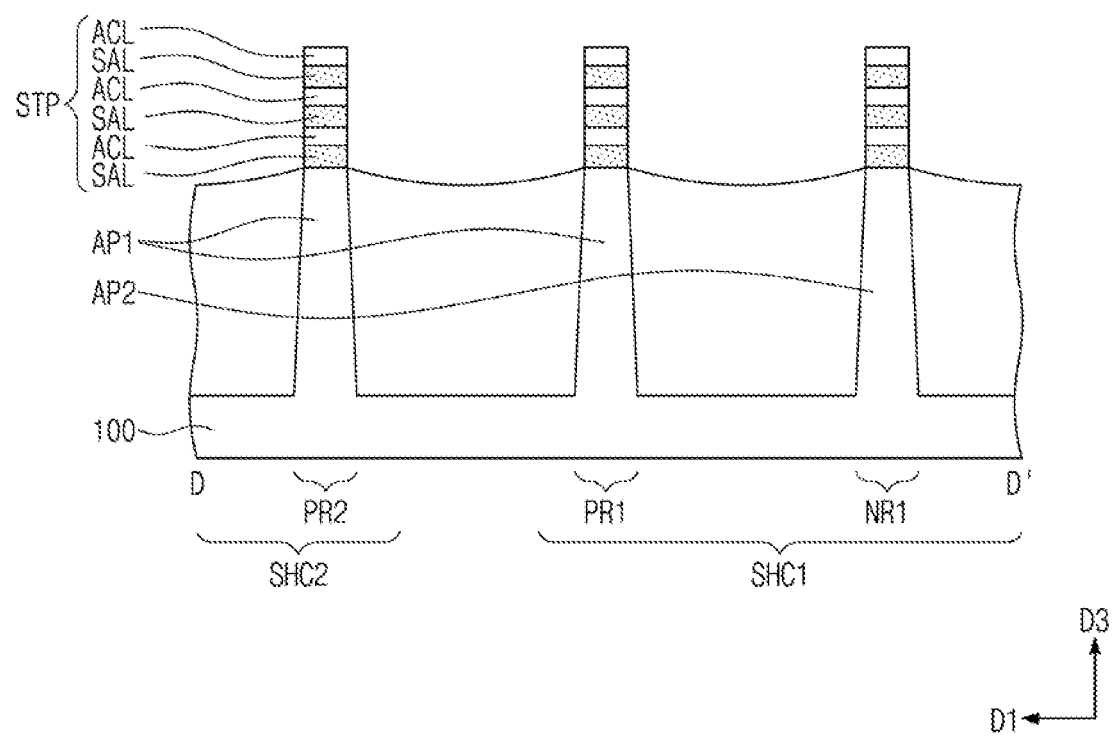
FIGS. 9B, 10B, 11D, 12D, 13D, 14D, 15D, 16D, and 18D illustrate cross-sectional views taken along line D-D' of FIG. 4.

Referring to FIGS. 9A and 9B, a substrate 100 may be provided which includes first and second PMOSFET regions PR1 and PR2 and also includes first and second NMOSFET regions NR1 and NR2. There may be formed active layers ACL and sacrificial layers SAL that are alternately stacked on the substrate 100. The active layers ACL may include one of silicon (Si), germanium (Ge), and silicon-germanium (SiGe), and the sacrificial layers SAL may include another of silicon (Si), germanium (Ge), and silicon-germanium (SiGe).

The sacrificial layer SAL may include a material having an etch selectivity with respect to the active layer ACL. For example, the sacrificial layers SAL may include silicon-germanium (SiGe), and the active layers ACL may include silicon (Si). Each of the sacrificial layers SAL may have a germanium concentration of about 10 at % to about 30 at %.

Mask patterns may be correspondingly formed on the first and second PMOSET regions PR1 and PR2 and the first and second NMOSFET regions NR1 and NR2 of the substrate 100. The mask patterns may each have a linear or bar shape that extends in a second direction D2.

A patterning process may be performed in which the mask patterns are used as an etching mask to form a trench TR that defines a first active pattern AP1 and a second active pattern AP2. The first active pattern AP1 may be formed on each of the first and second PMOSFET regions PR1 and PR2. The second active pattern AP2 may be formed on each of the first and second NMOSFET regions NR1 and NR2.

A stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first and second active patterns AP1 and AP2.

A device isolation layer ST (see, e.g., FIG. 11C) may be formed to fill the trench TR. For example, a dielectric layer may be formed on an entire surface of the substrate 100 to cover the first and second active patterns AP1 and AP2 and the stack patterns STP. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwardly from the device isolation layer ST. For example, the stack patterns STP may vertically protrude upwards from the device isolation layer ST.

Figure 10A:
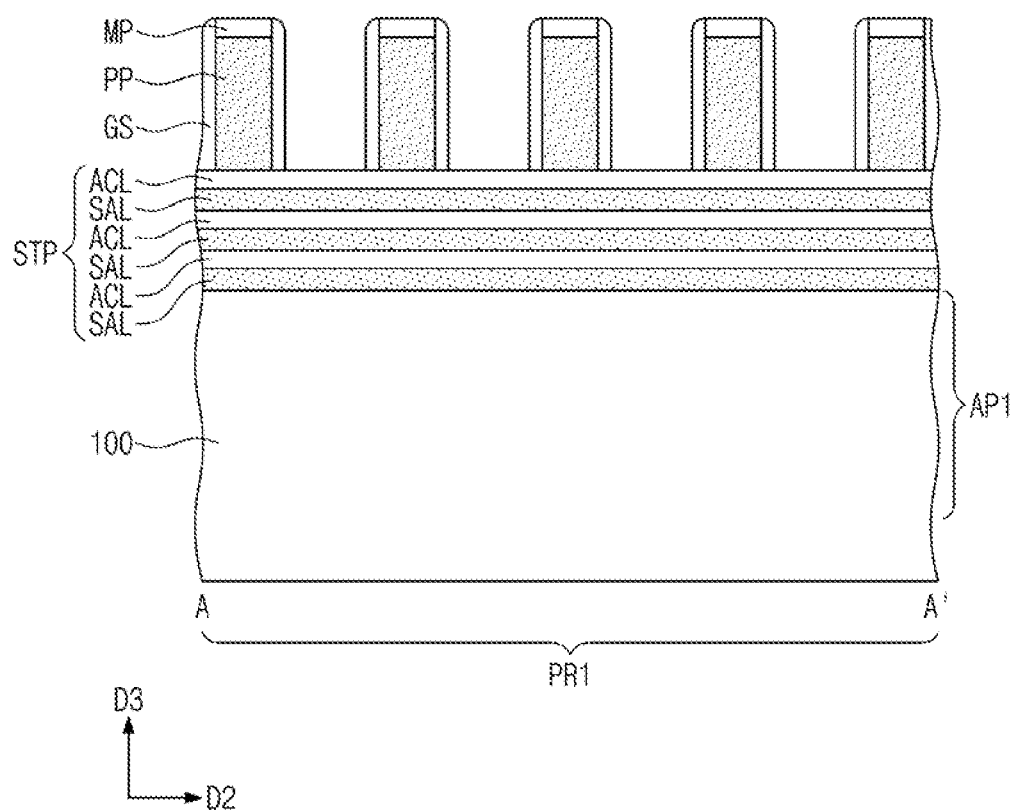
Figure 10B:
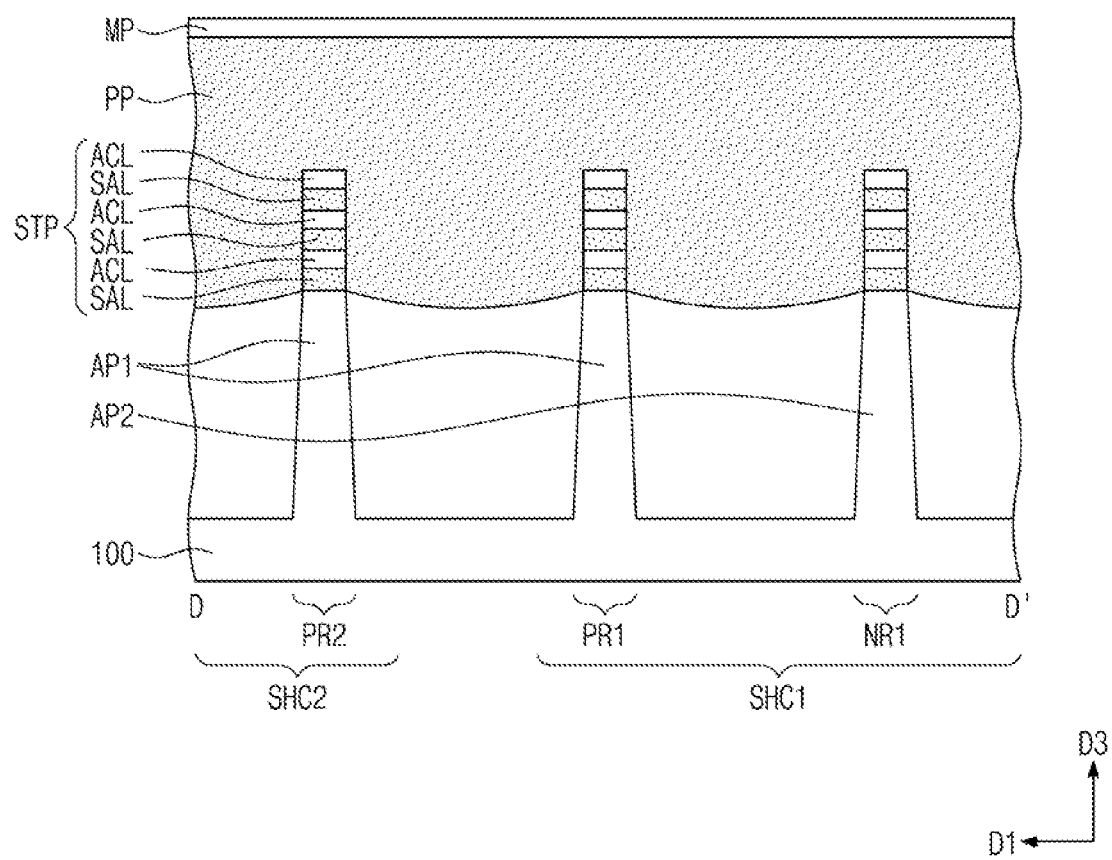
Figure 11A:
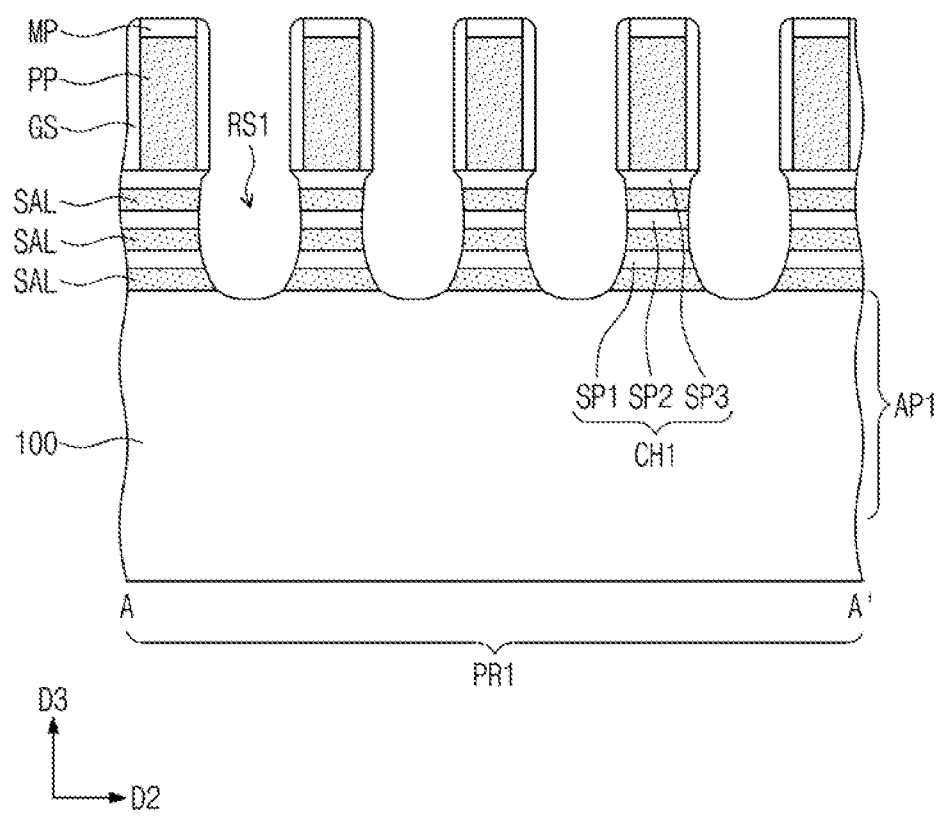
Figure 11B:
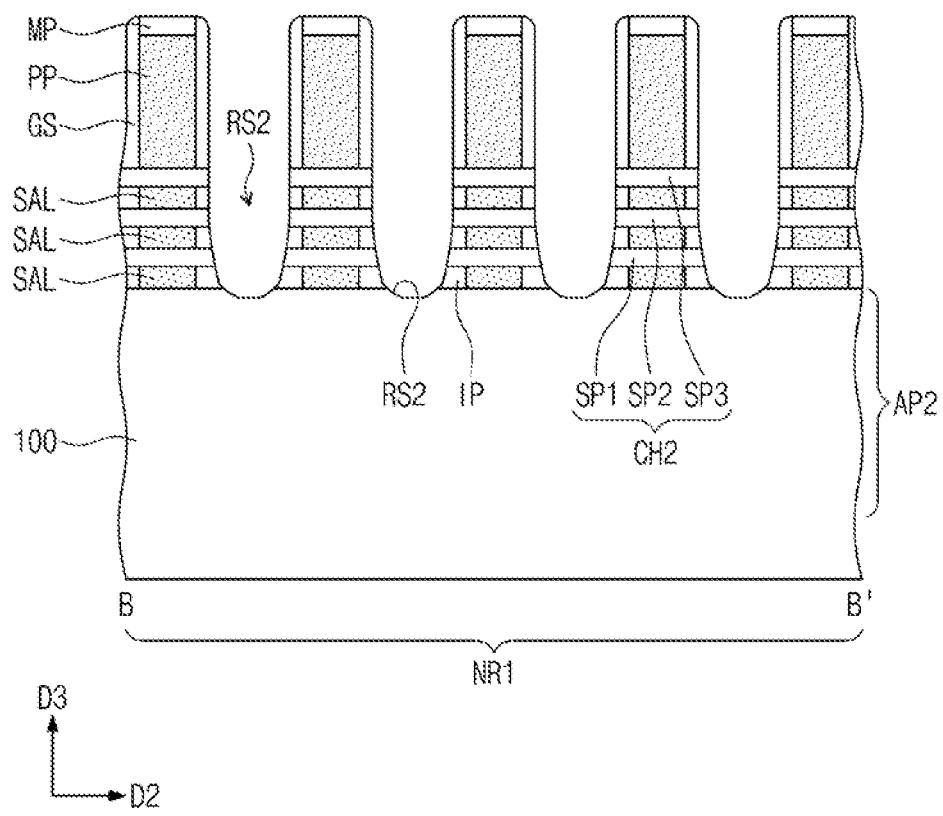
FIGS. 11B, 12B, 13B, 14B, 15B, 16B, and 18B illustrate cross-sectional views taken along line B-B' of FIG. 4.
Figure 11C:
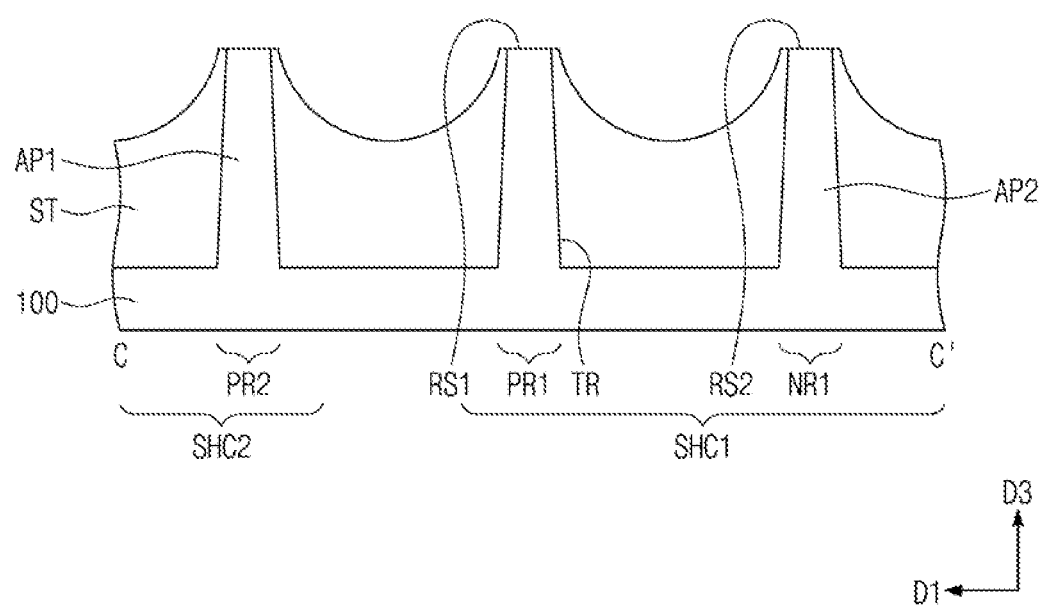
FIGS. 11C, 12C, 13C, 14C, 15C, 16C, and 18C illustrate cross-sectional views taken along line C-C' of FIG. 4.
Figure 11D:
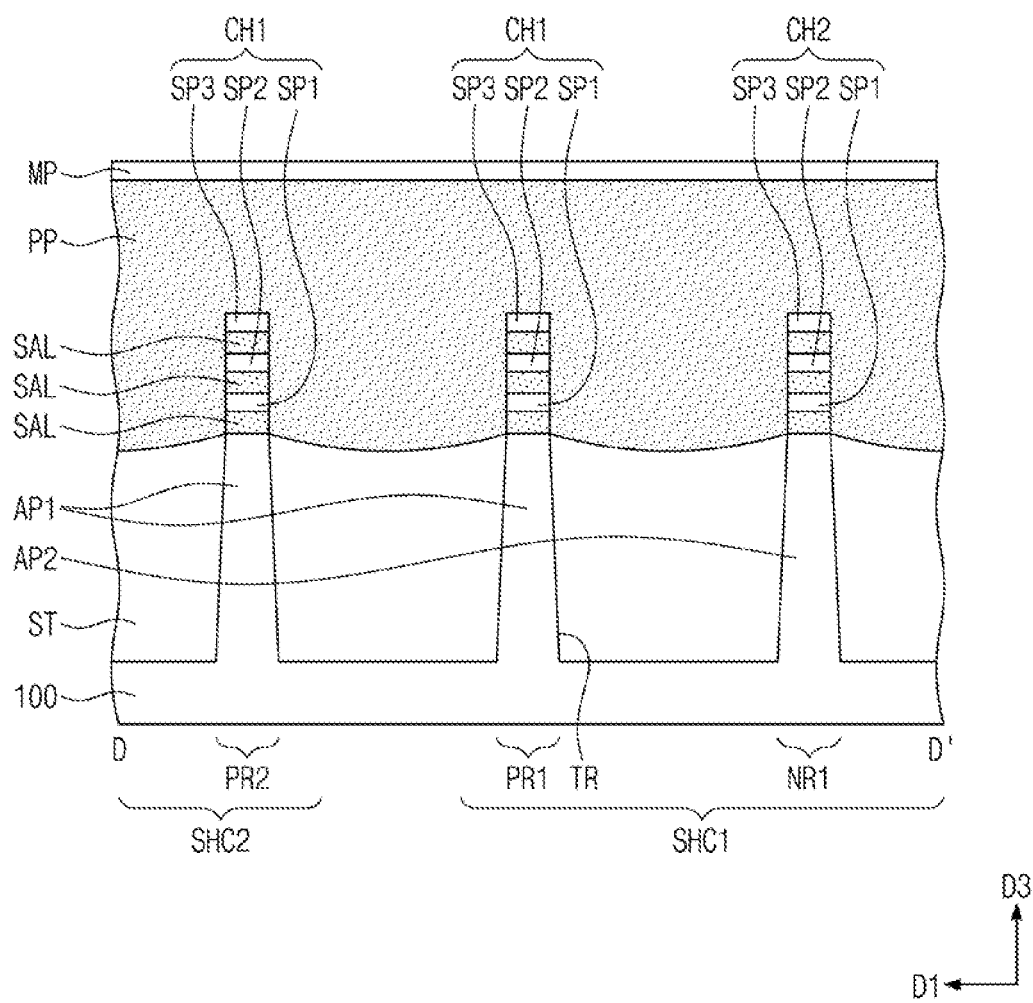
Figure 12A:
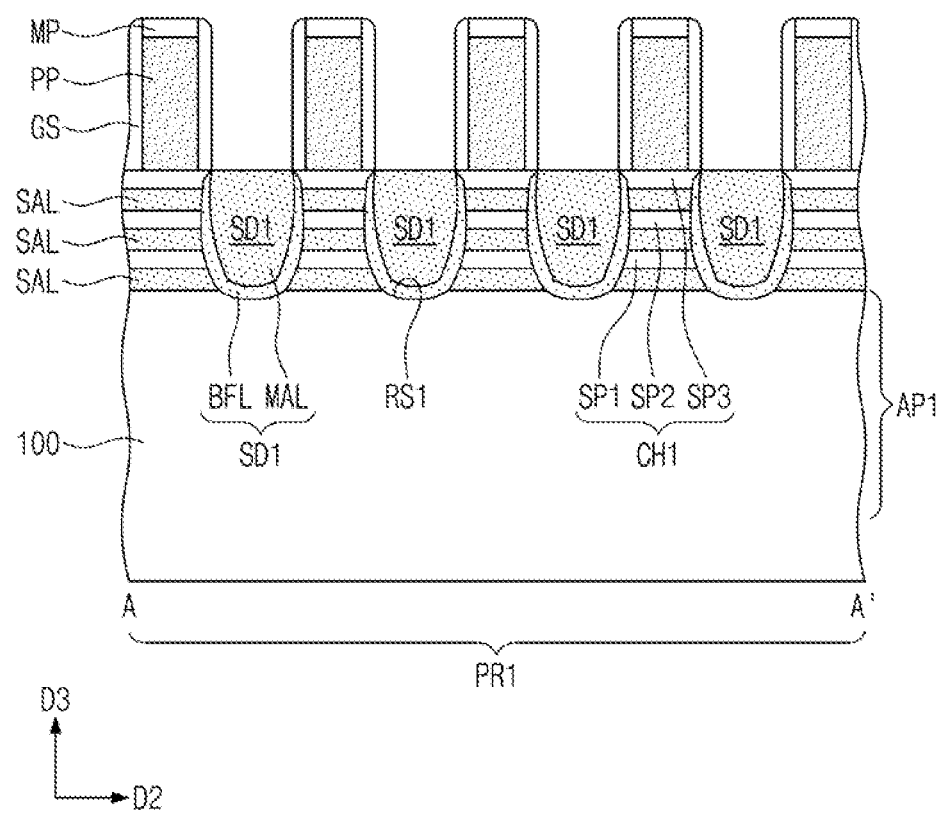
Figure 12B:
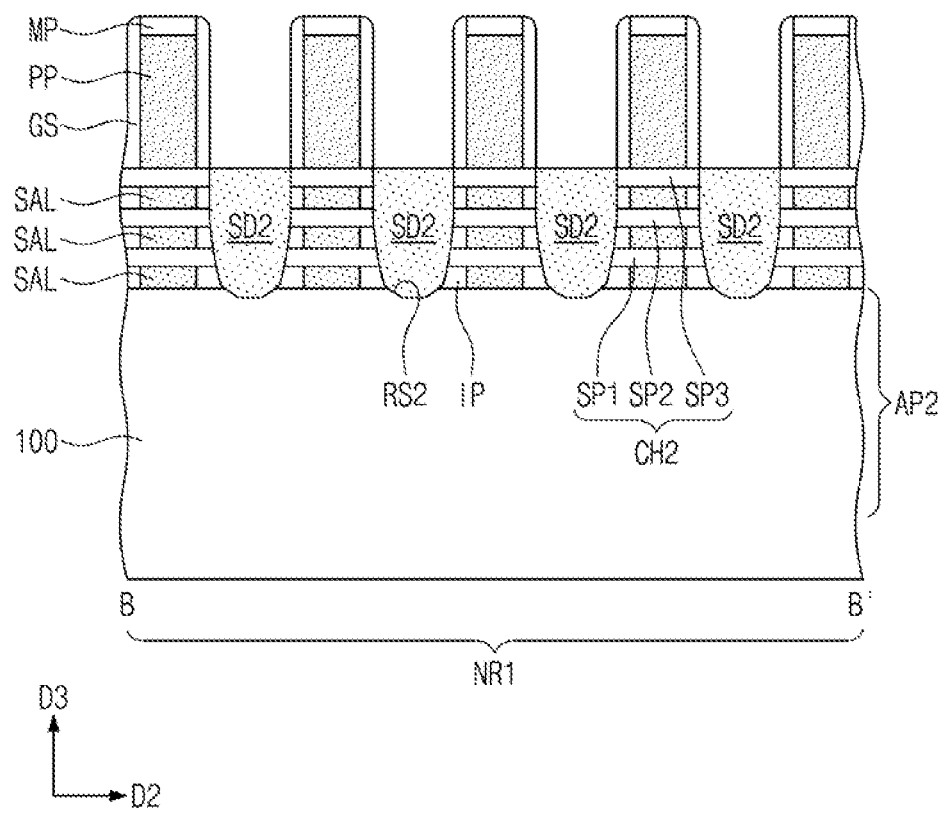
Figure 12C:
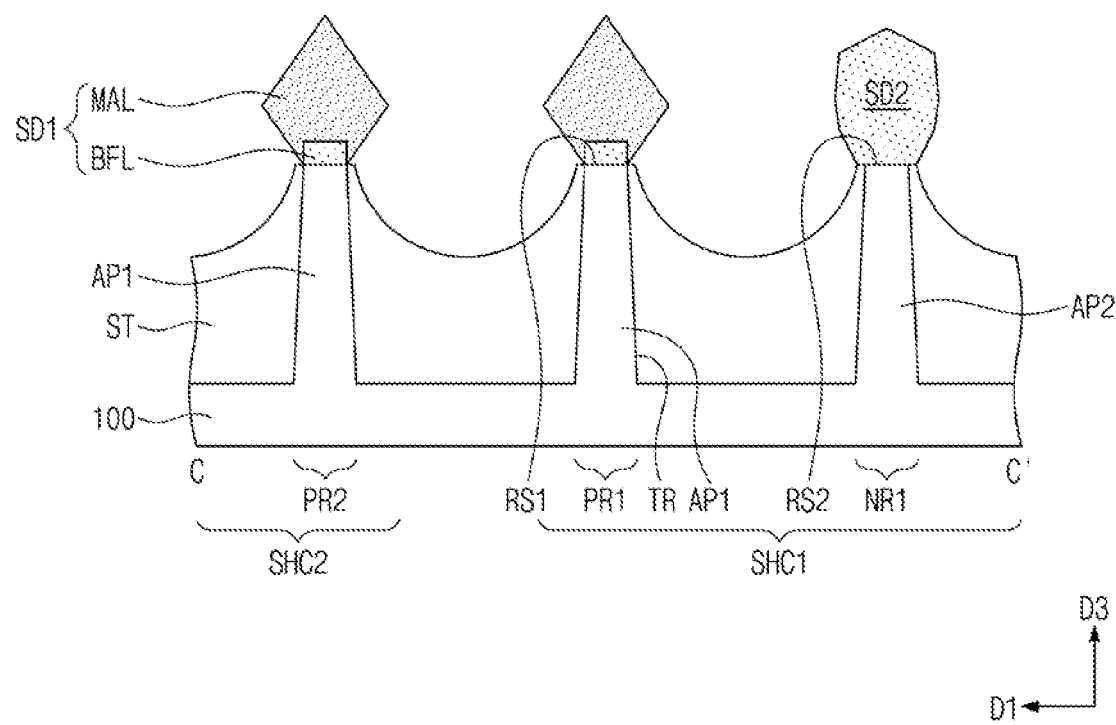
Figure 12D:
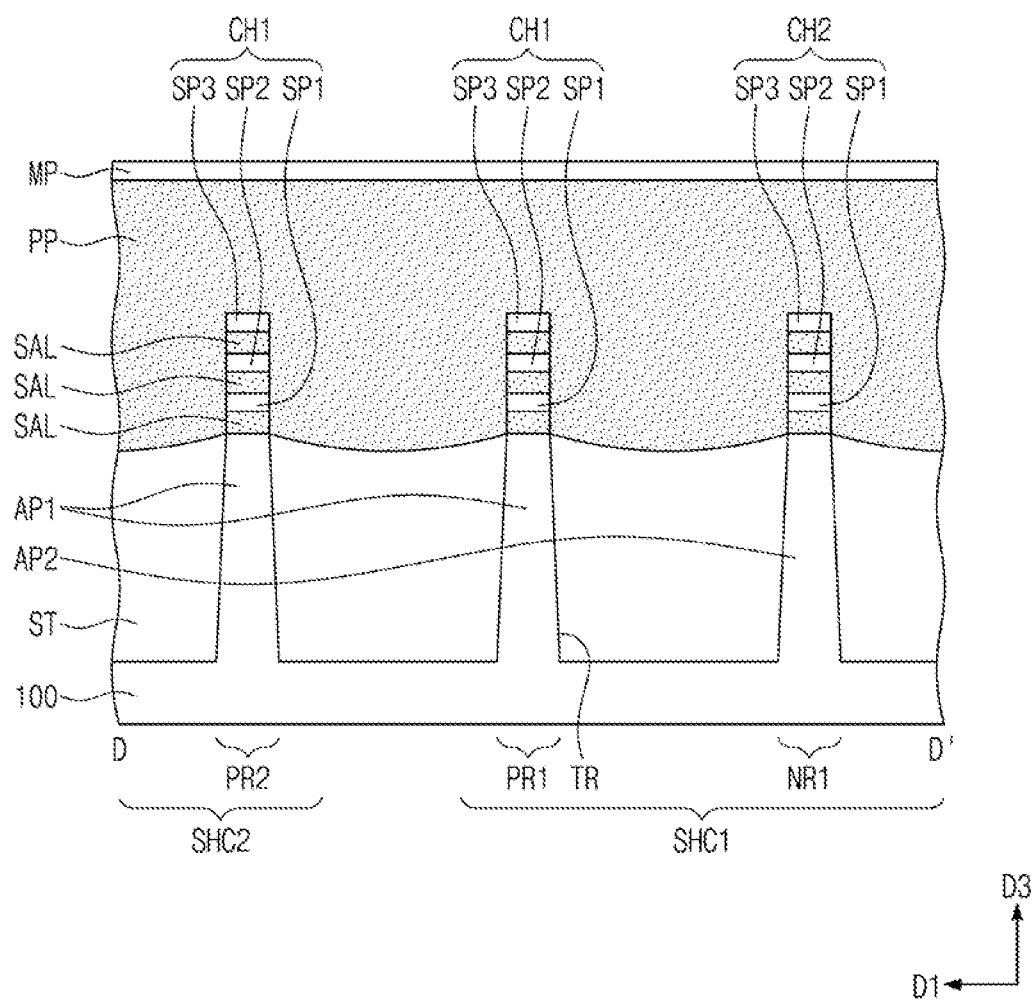
Figure 13A:
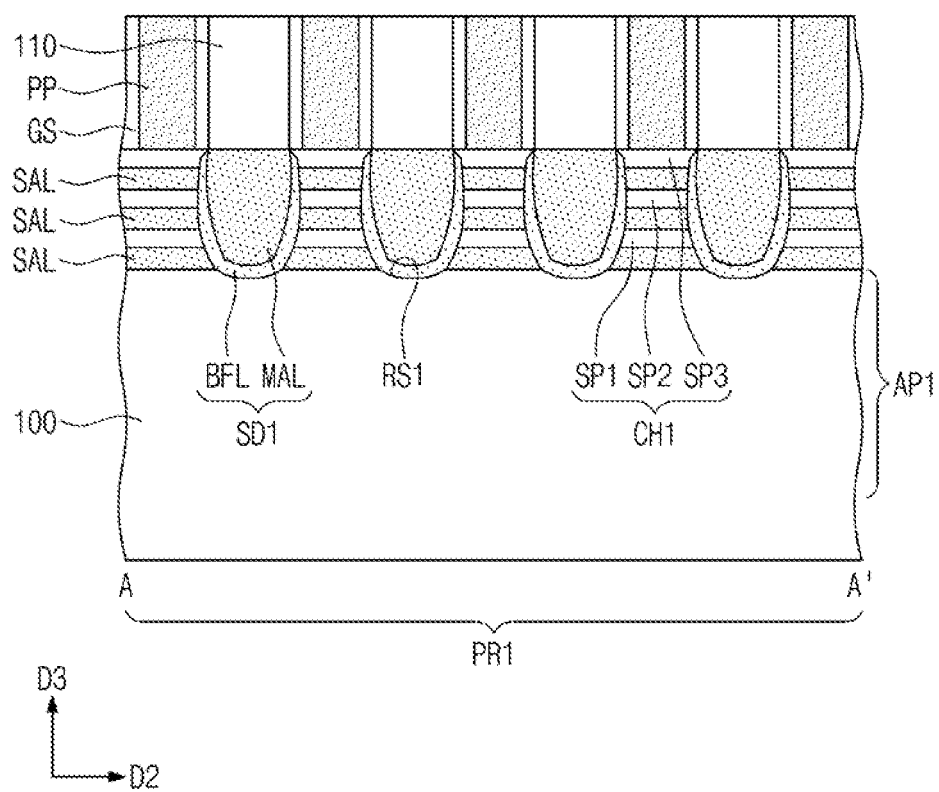
Figure 13B:
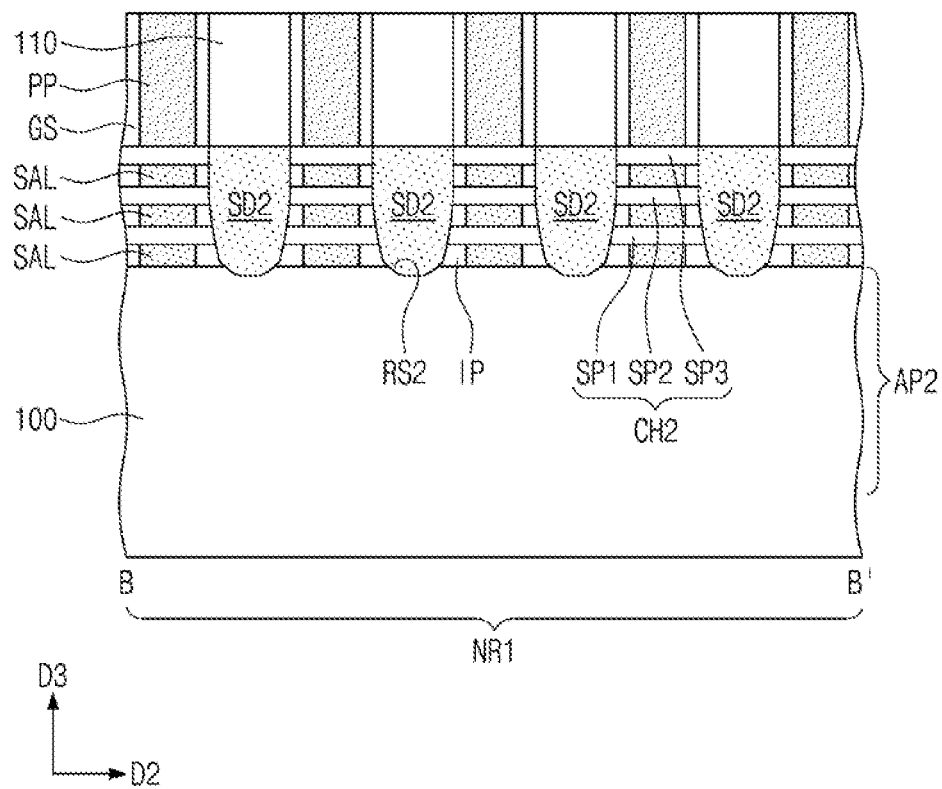
Figure 13C:
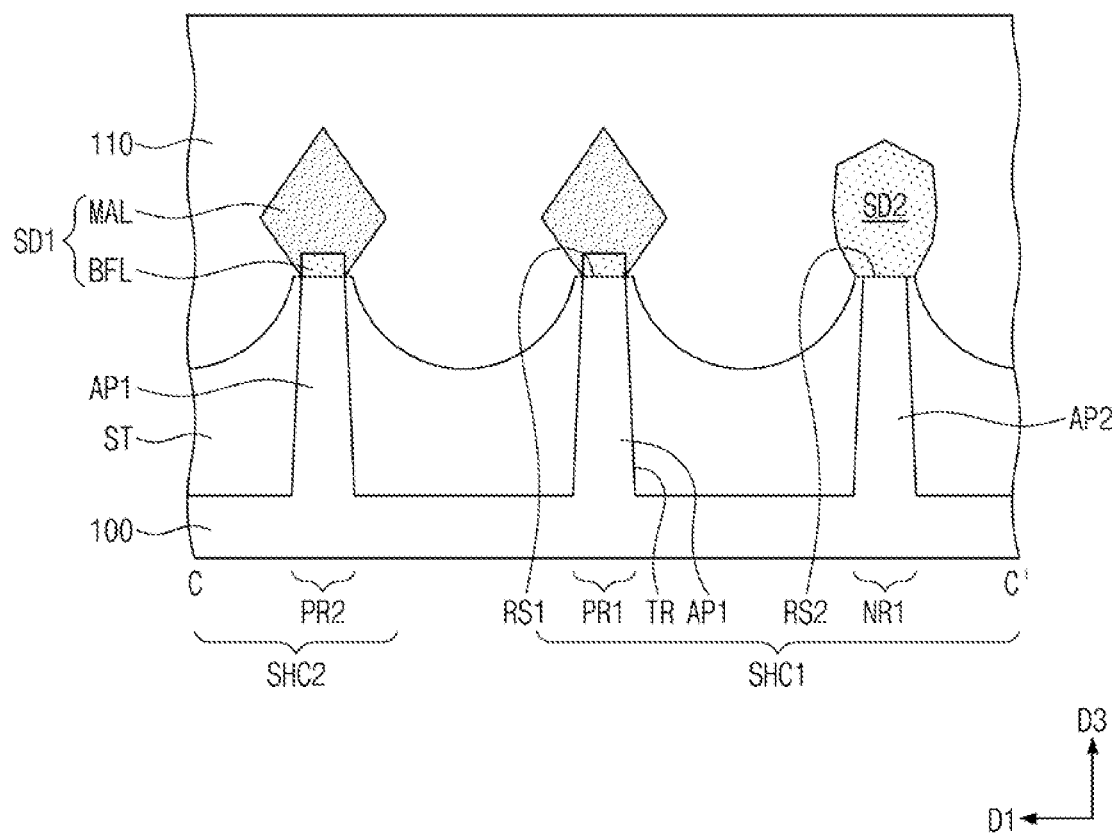
Figure 13D:
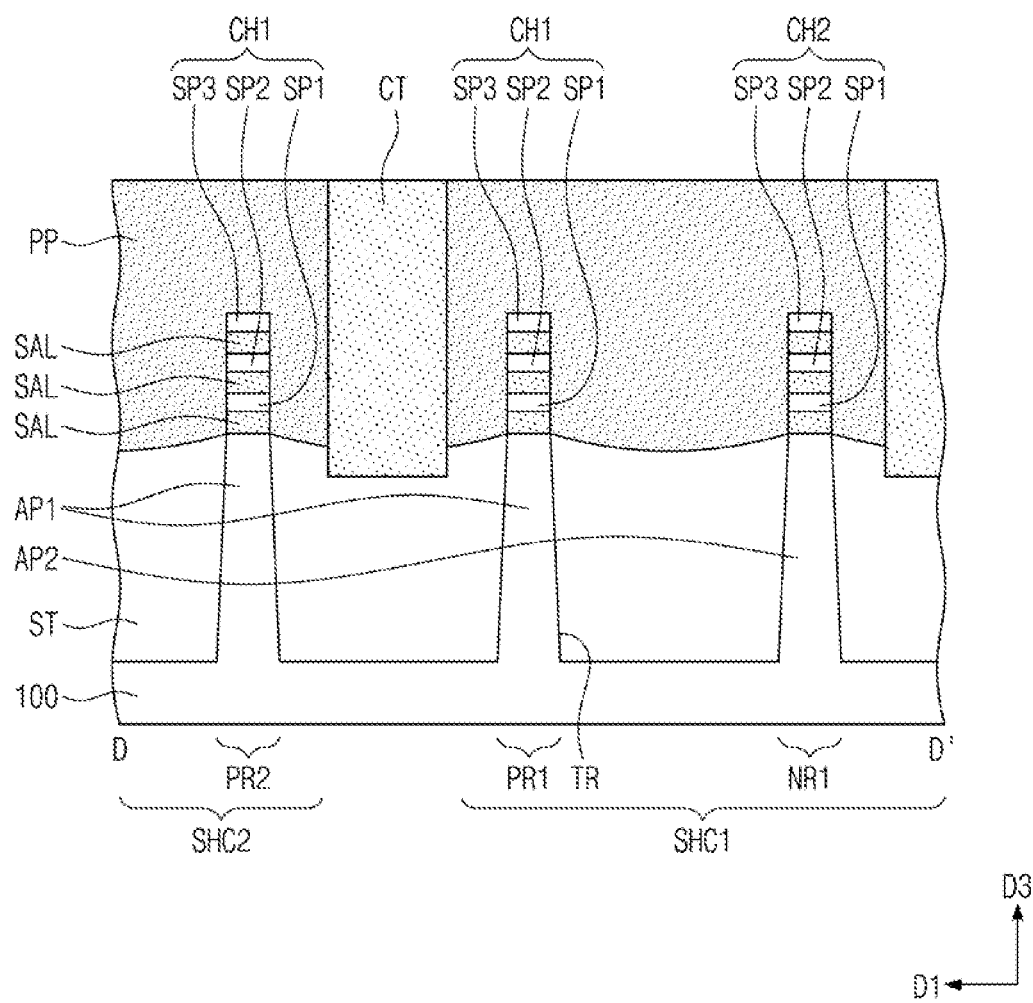

Referring to FIGS. 10A and 10B, sacrificial patterns PP may be formed on the substrate 100 to run across the stack patterns STP. Each of the sacrificial patterns PP may be formed to have a linear or bar shape that extends in a first direction D1. The sacrificial patterns PP may be arranged along the second direction D2 at a first pitch.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include, for example, a polysilicon layer.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. In an embodiment, the gate spacer GS may be a multi-layer including at least two layers.

Referring to FIGS. 11A to 11D, first recesses RS1 may be formed in the stack pattern STP on the first active pattern AP1. Second recesses RS2 may be formed in the stack pattern STP on the second active pattern AP2. During the formation of the first and second recesses RS1 and RS2, the device isolation layer ST on opposite sides of each of the first and second active patterns AP1 and AP2 may further be recessed (see FIG. 11C).

For example, the hardmask patterns MP and the gate spacers GS may be used as an etching mask to etch the stack pattern STP on the first active pattern AP1, thereby forming the first recesses RS1. The first recess RS1 may be formed between a pair of sacrificial patterns PP.

The second recesses RS2 in the stack pattern STP on the second active pattern AP2 may be formed by the same method used for the formation of the first recesses RS1. The formation of the second recess RS2 may further include forming an inner spacer IP in an area where the sacrificial layer SAL is recessed.

The active layers ACL may be formed into first, second, and third semiconductor patterns SP1, SP2, and SP3 that are sequentially stacked between neighboring first recesses RS1. The active layers ACL may also be formed into first, second, and third semiconductor patterns SP1, SP2, and SP3 that are sequentially stacked between neighboring second recesses RS2. A first channel pattern CH1 may be constituted by the first, second, and third semiconductor patterns SP1, SP2, and SP3 between neighboring first recesses RS1. A second channel pattern CH2 may be constituted by the first, second, and third semiconductor patterns SP1, SP2, and SP3 between neighboring second recesses RS2.

Referring to FIGS. 12A to 12D, first source/drain patterns SD1 may be correspondingly formed in the first recesses RS1. For example, a first selective epitaxial growth (SEG) process may be performed in which an inner wall of the first recess RS1 is used as a seed layer to form a buffer layer BFL. The buffer layer BFL may be grown from a seed, or the substrate 100 and the first, second, and third semiconductor patterns SP1, SP2, and SP3 that are exposed to the first recess RS1. For example, the first SEG process may include chemical vapor deposition (CVD) or molecular beam epitaxy (MBE).

The buffer layer BFL may include a semiconductor element (e.g., SiGe) whose lattice constant is greater than that of a semiconductor element of the substrate 100. The buffer layer BFL may contain germanium (Ge) whose concentration is relatively low. In an embodiment, the buffer layer BFL may contain silicon (Si), but may not include germanium (Ge). A concentration of germanium (Ge) in the buffer layer BFL may range from about 0 at % to about 10 at %.

The buffer layer BFL may undergo a second SEG process to form a main layer MAL. The main layer MAL may be formed to completely fill the first recess RS1. The main layer MAL may contain germanium (Ge) whose concentration is relatively high. For example, a concentration of germanium (Ge) in the main layer MAL may range from about 30 at % to about 70 at %.

During the formation of the buffer layer BFL and the main layer MAL, an impurity (e.g., boron, gallium, or indium) may be in-situ implanted to cause the first source/drain pattern SD1 to have a p-type conductivity. Alternatively, after the formation of the first source/drain pattern SD1, an impurity may be implanted into the first source/drain pattern SD1.

Second source/drain patterns SD2 may be correspondingly formed in the second recesses RS2. For example, a third SEG process may be performed in which an inner wall of the second recess RS2 is used as a seed to form the second source/drain pattern SD2. For example, the second source/drain pattern SD2 may include a semiconductor element (e.g., Si) that is the same as that of the substrate 100.

During the formation of the second source/drain pattern SD2, an impurity (e.g., phosphorus, arsenic, or antimony) may be in-situ implanted to cause the second source/drain pattern SD2 to have an n-type conductivity. Alternatively, after the formation of the second source/drain pattern SD2, an impurity may be implanted into the second source/drain pattern SD2.

Referring to FIGS. 13A to 13D, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

A photolithography process may be used to selectively open a partial area of the sacrificial pattern PP. For example, it may be possible to selectively open an area of the sacrificial pattern PP on the third and fourth boundaries BD3 and BD4 of the first single height cell SHC1. The opened area of the sacrificial pattern PP may be selectively etched and removed. A space where the sacrificial pattern PP is removed may be filled with a dielectric material to form a gate cutting pattern CT (see, e.g., FIG. 13D).

Referring to FIGS. 14A to 14D, exposed sacrificial patterns PP may be selectively removed. The removal of the sacrificial patterns PP may form an outer region ORG that exposes the first and second channel patterns CH1 and CH2 (see FIG. 14D). The removal of the sacrificial patterns PP may include performing a wet etching process using an etchant that selectively etches polysilicon.

Figure 14D:
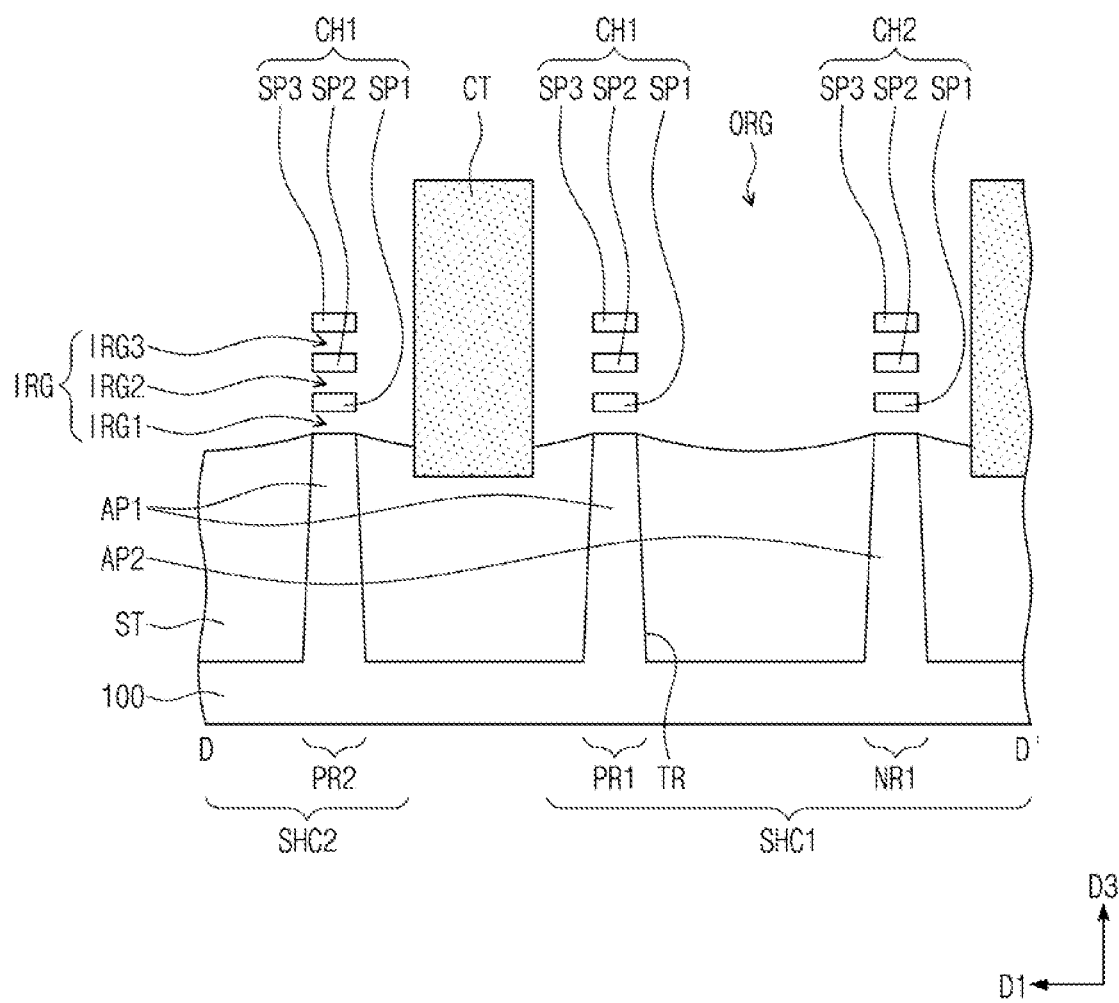

The sacrificial layers SAL exposed to the outer region ORG may be selectively removed to form inner regions IRG (see FIG. 14D). For example, an etching process that selectively etches the sacrificial layers SAL may be performed such that only the sacrificial layers SAL may be removed, and such that the first, second, and third semiconductor patterns SP1, SP2, and SP3 may remain. The etching process may have a high etch rate for silicon-germanium whose germanium concentration is relatively high.

During the etching process, the sacrificial layers SAL may be removed from the first and second PMOSFET regions PR1 and PR2 and from the first and second NMOSFET regions NR1 and NR2. The etching process may be a wet etching process. The etching material used for the etching process may promptly etch the sacrificial layer SAL whose germanium concentration is relatively high. During the etching process, the buffer layer BFL whose germanium concentration is relatively low may protect the first source/drain pattern SD1 on the first and second PMOSFET regions PR1 and PR2.

Referring back to FIG. 14D, as the sacrificial layers SAL are selectively removed, only the stacked first, second, and third semiconductor patterns SP1, SP2, and SP3 may remain on each of the first and second active patterns AP1 and AP2. The removal of the sacrificial layers SAL may form first, second, and third inner regions IRG1, IRG2, and IRG3.

For example, the first inner region IRG1 may be formed between the first semiconductor pattern SP1 and one of the first and second active patterns AP1 and AP2, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 15A to 15D, a gate dielectric layer GI may be conformally formed on exposed first, second, and third semiconductor patterns SP1, SP2, and SP3. A gate electrode GE may be formed on the gate dielectric layer GI. The gate electrode GE may include first, second, and third portions PO1, PO2, and PO3 correspondingly formed in the first, second, and third inner regions IRG1, IRG2, and IRG3, and may also include a fourth portion PO4 formed in the outer region ORG.

The gate electrode GE may be recessed to have a reduced height. While the gate electrode GE is recessed, upper portions of the gate cutting patterns CT may also be slightly recessed. A gate capping pattern GP may be formed on the recessed gate electrode GE.

Referring to FIGS. 16A to 16D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and electrically connect to the first and second source/drain patterns SD1 and SD2. An upper dielectric pattern UIP may be formed in an upper portion of the active contact AC.

Figure 16A:
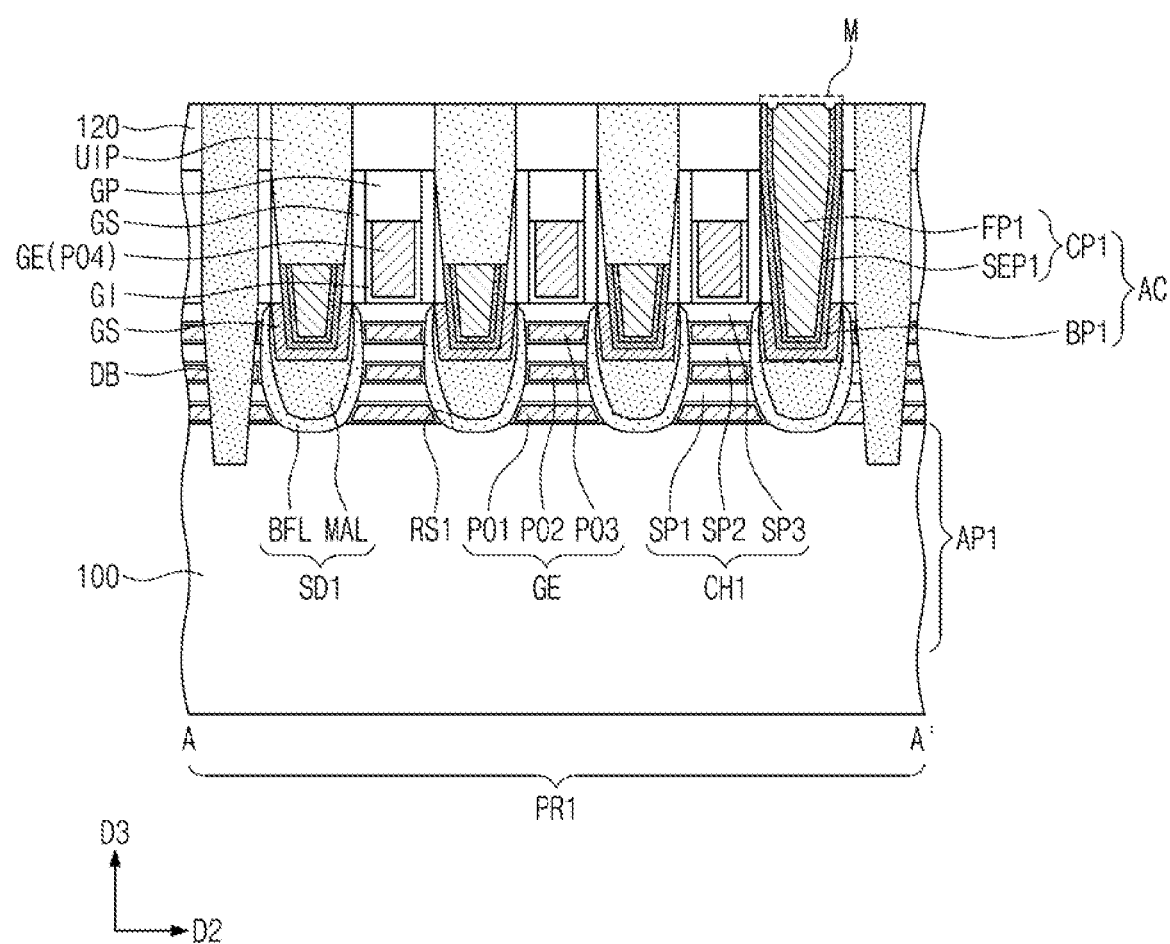
Figure 16B:
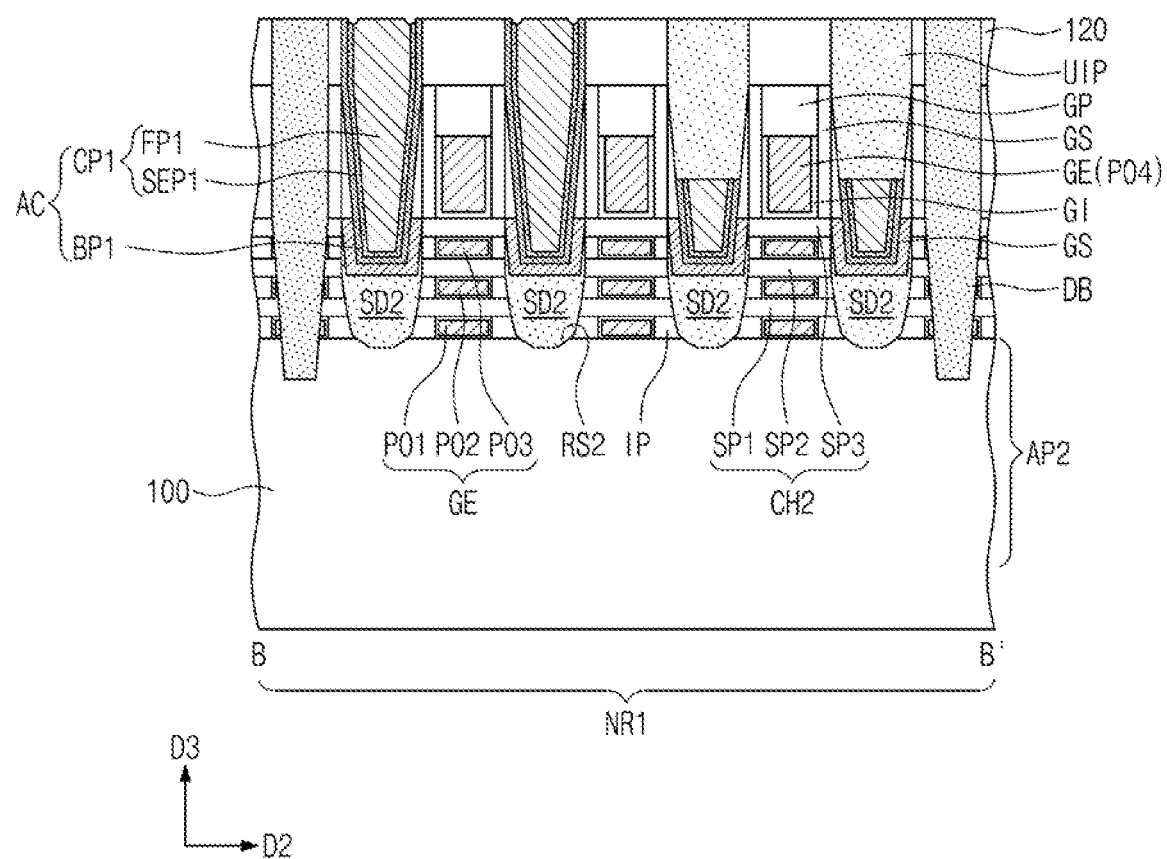
Figure 16C:
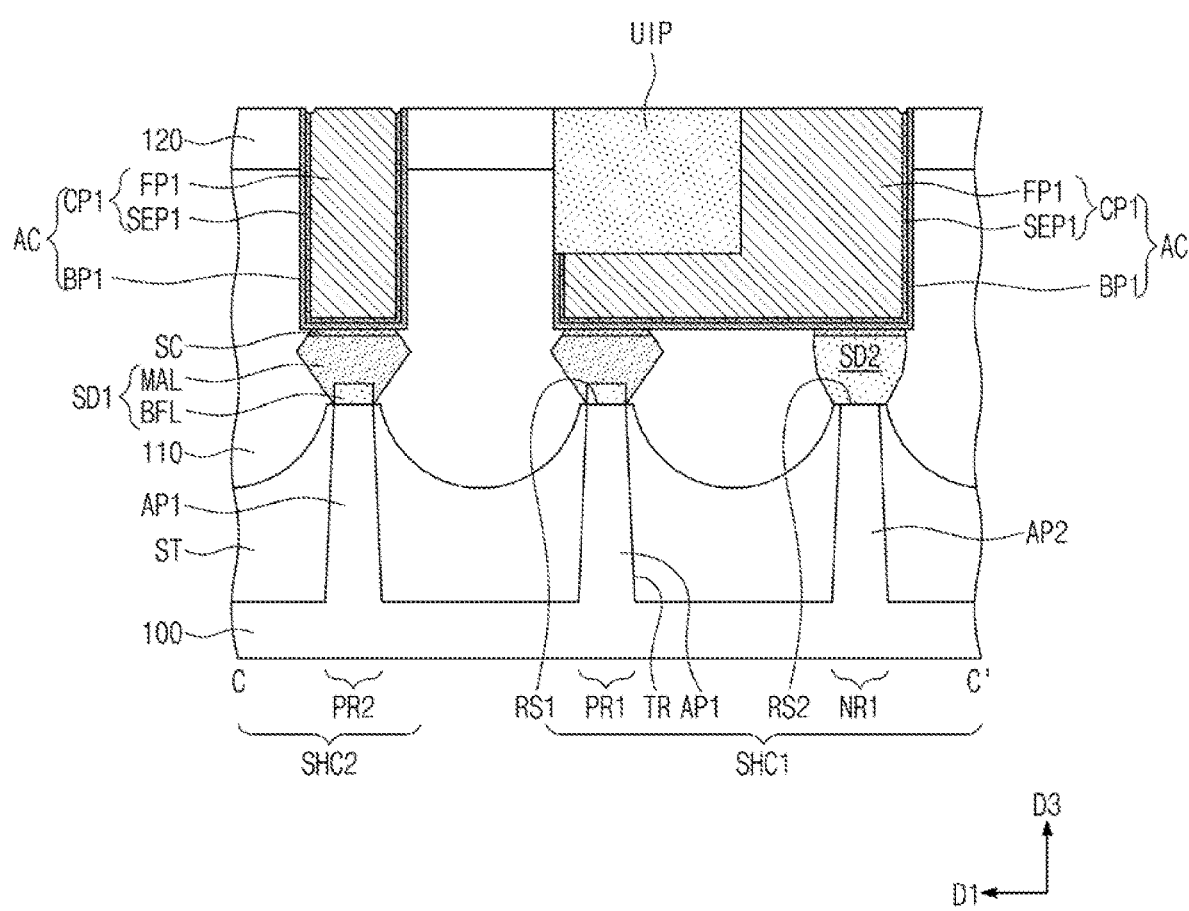
Figure 16D:
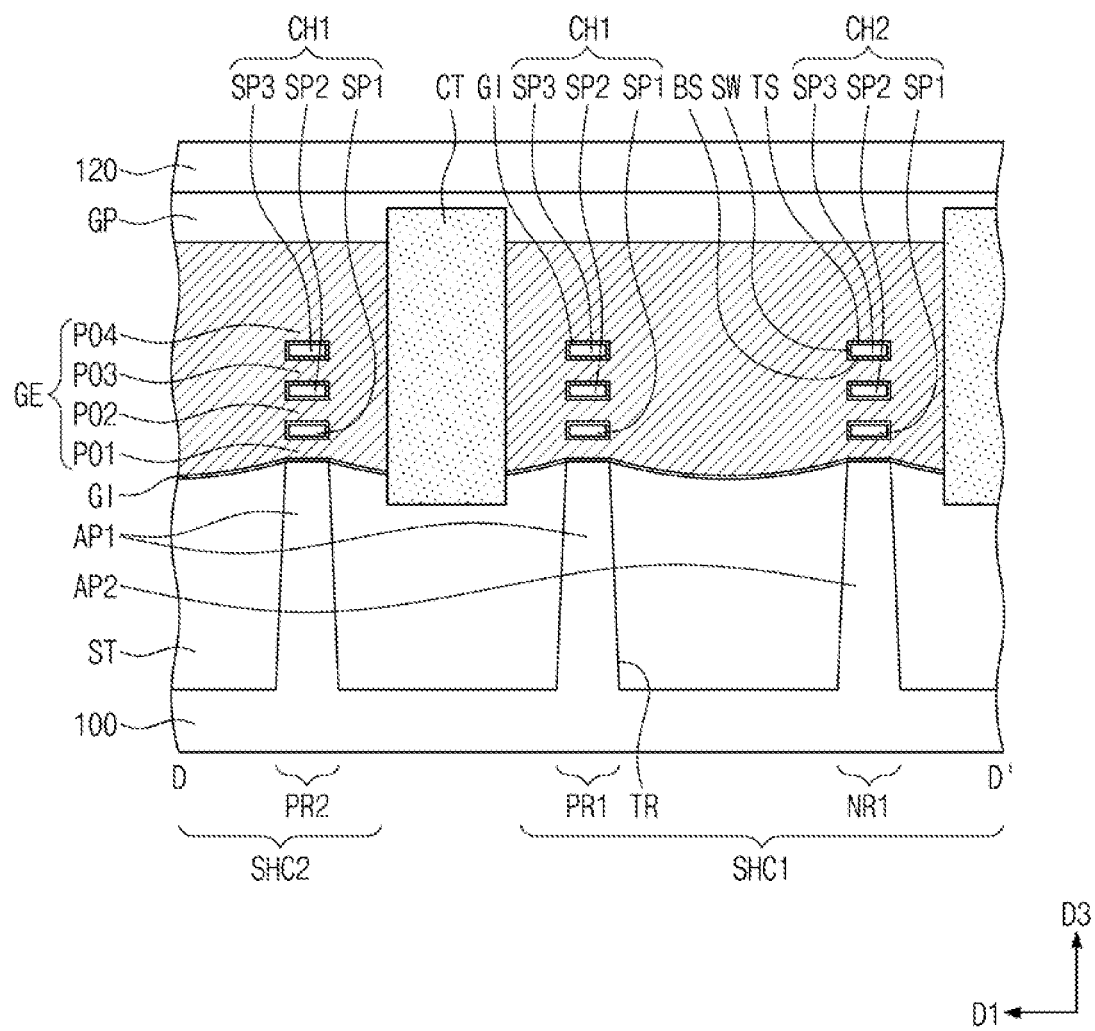
Figure 17A:
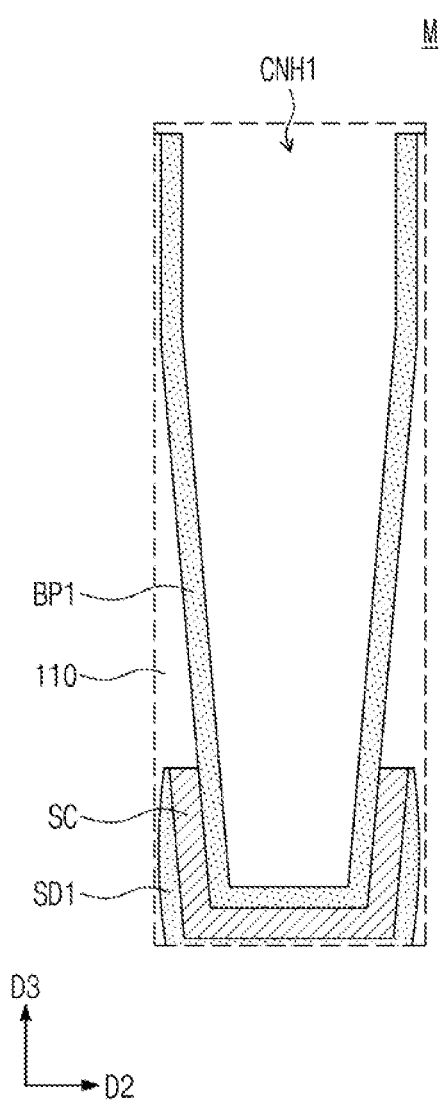
FIGS. 17A to 17C illustrate enlarged views showing a method of forming an active contact on section M of FIG. 16A.
Figure 17B:
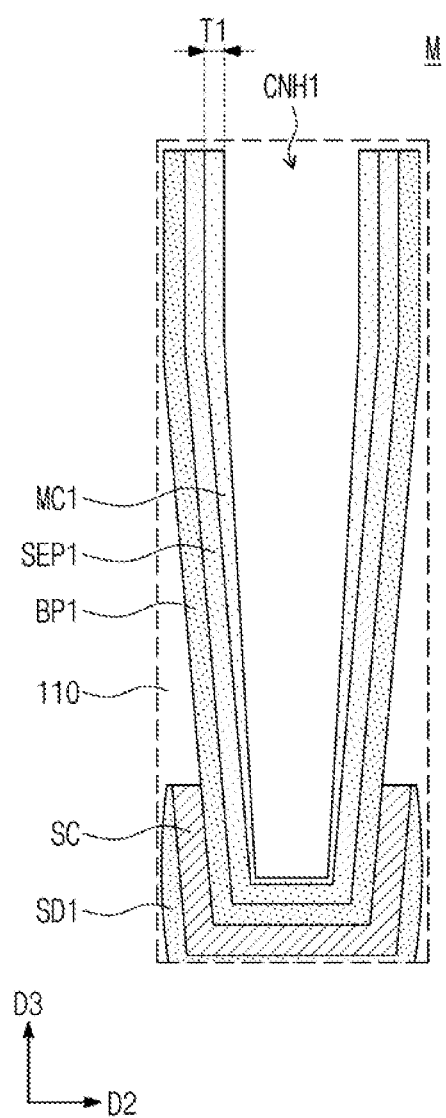
Figure 17C:
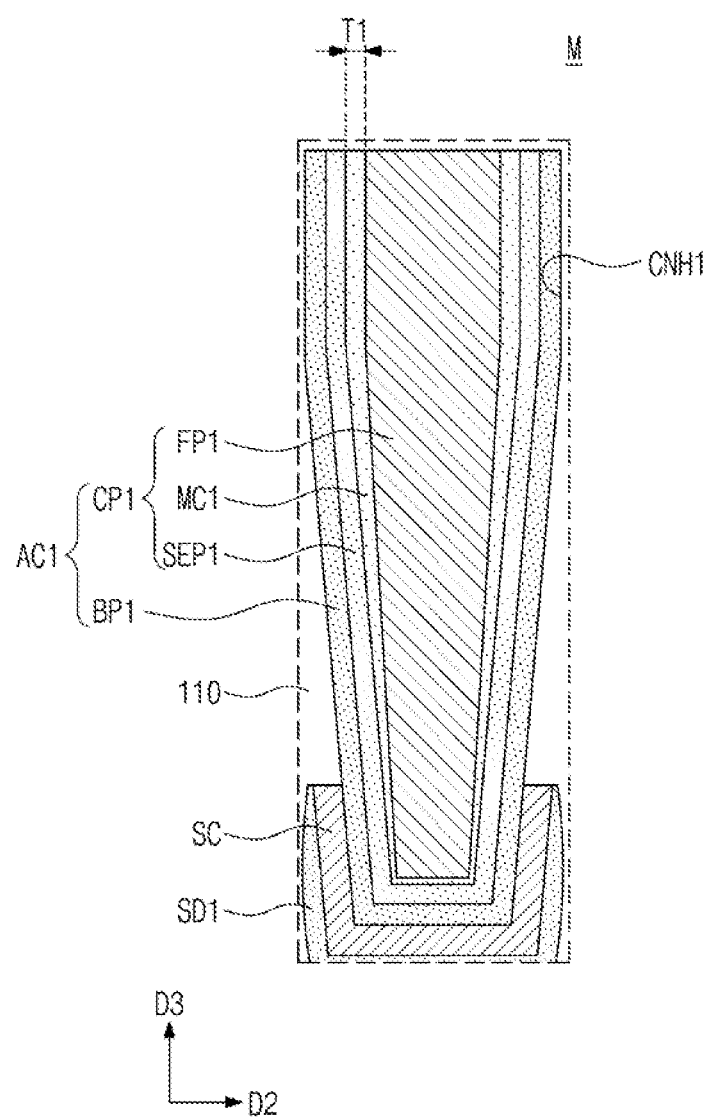

FIGS. 17A to 17C illustrate enlarged views showing a method of forming an active contact on section M of FIG. 16A. Referring to FIG. 17A, a first contact hole CNH1 may be formed to penetrate the first interlayer dielectric layer 110. For example, the first contact hole CNH1 may expose the first source/drain pattern SD1. A bottom surface of the first contact hole CNH1 may be lower than a top surface of the first source/drain pattern SD1.

A first barrier pattern BP1 may be conformally formed on an inner wall of the first contact hole CNH1. A chemical vapor deposition (CVD) process may be used to form the first barrier pattern BP1. The first barrier pattern BP1 may include metal nitride (e.g., TiN). A silicidation process may be performed to form a metal-semiconductor compound layer SC.

Referring to FIG. 17B, a first seed pattern SEP1 may be conformally formed on the first barrier pattern BP1. The first seed pattern SEP1 may include, for example, tungsten and boron. A chemical vapor deposition (CVD) process may be used to form the first seed pattern SEP1.

A first metal-containing pattern MC1 may be formed on the first seed pattern SEP1. For example, the first metal-containing pattern MC1 may include tungsten nitride (WN). The first metal-containing pattern MC1 may be formed by using a deposition process to form a metal layer including tungsten, and then allowing the metal layer to undergo a plasma treatment process that uses a nitrogen precursor. In this stage, as discussed with reference to FIG. 6, the first metal-containing pattern MC1 may have a nitrogen concentration that decreases in a downward direction. This may be derived from the fact that the degree of reaction between the nitrogen precursor and the metal layer is reduced in a downward direction when a plasma treatment process is performed in the first contact hole CNH1. A first thickness T1 may be defined to indicate a thickness of the first metal-containing pattern MC1. The first thickness T1 may decrease in a downward direction. Alternatively, the first metal-containing pattern MC1 may be formed by using a deposition process such as chemical vapor deposition (CVD).

Referring to FIG. 17C, a first fill pattern FP1 may be formed to fill an unoccupied portion of the first contact hole CNH1. For example, the first fill pattern FP1 may include tungsten. The first fill pattern FP1 may be formed by a deposition process such as atomic layer deposition (ALD). The first seed pattern SEP1, the first metal-containing pattern MC1, and the first fill pattern FP1 may constitute a first conductive pattern CP1. The first barrier pattern BP1 and the first conductive pattern CP1 may constitute an active contact AC.

Referring back to FIG. 6, a planarization process may be performed on the active contact AC. In this step, there may be a difference in removal rate between the first barrier pattern BP1, the first seed pattern SEP1, the first metal-containing pattern MC1, and the first fill pattern FP1, and the difference in removal rate may be caused to form a first recess region RSR1 that is an area recessed in a direction toward the substrate 100 from a top surface ACu of the active contact AC. The first recess region RSR1 may be defined by a top surface of the first seed pattern SEP1 and a top surface of the first metal-containing pattern MC1.

Referring to FIGS. 18A to 18D, gate contacts GC may be formed to penetrate the second interlayer dielectric layer 120 and the gate capping pattern GP and to electrically connect to corresponding gate electrodes GE.

Figure 18A:
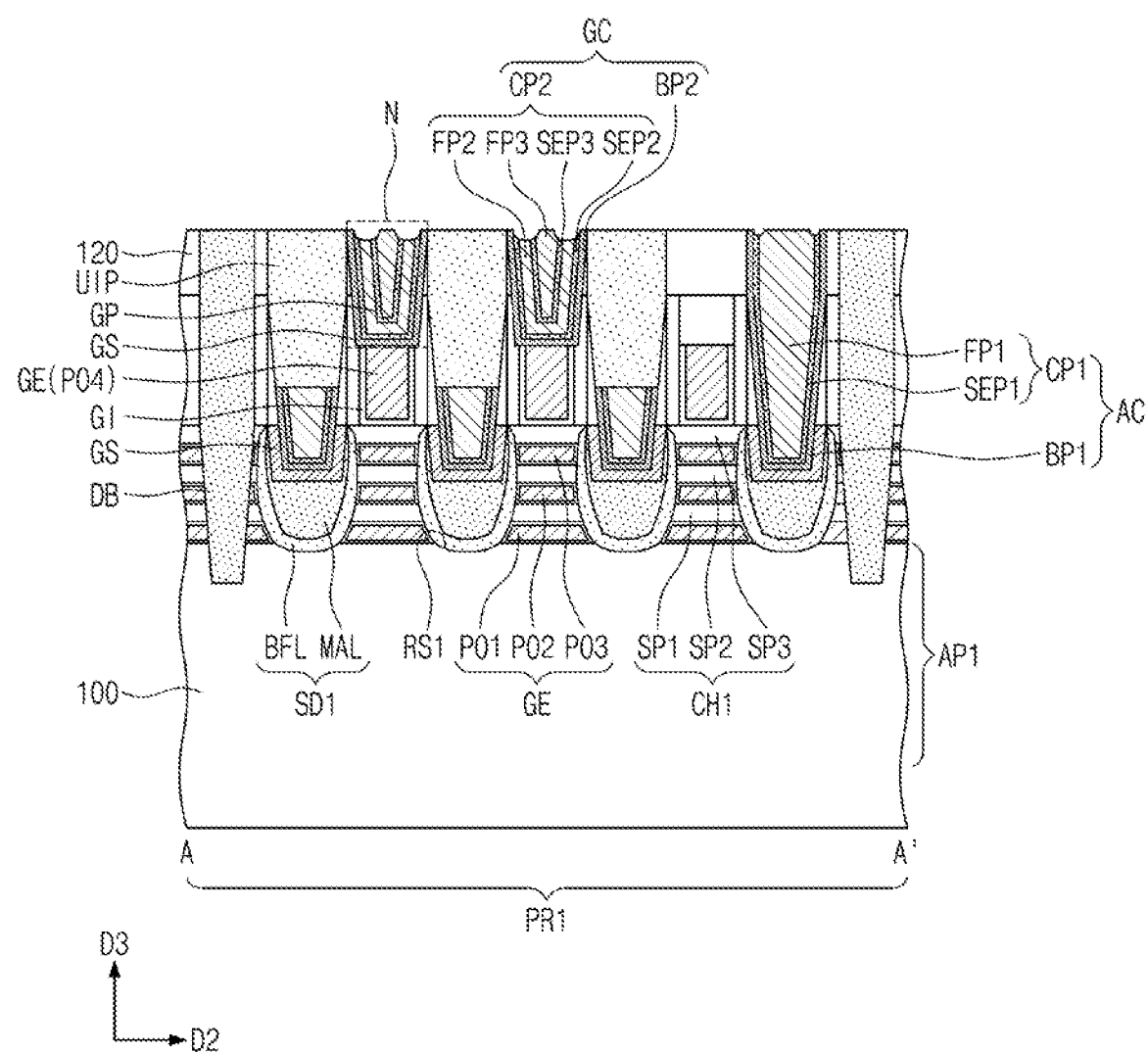
Figure 18B:
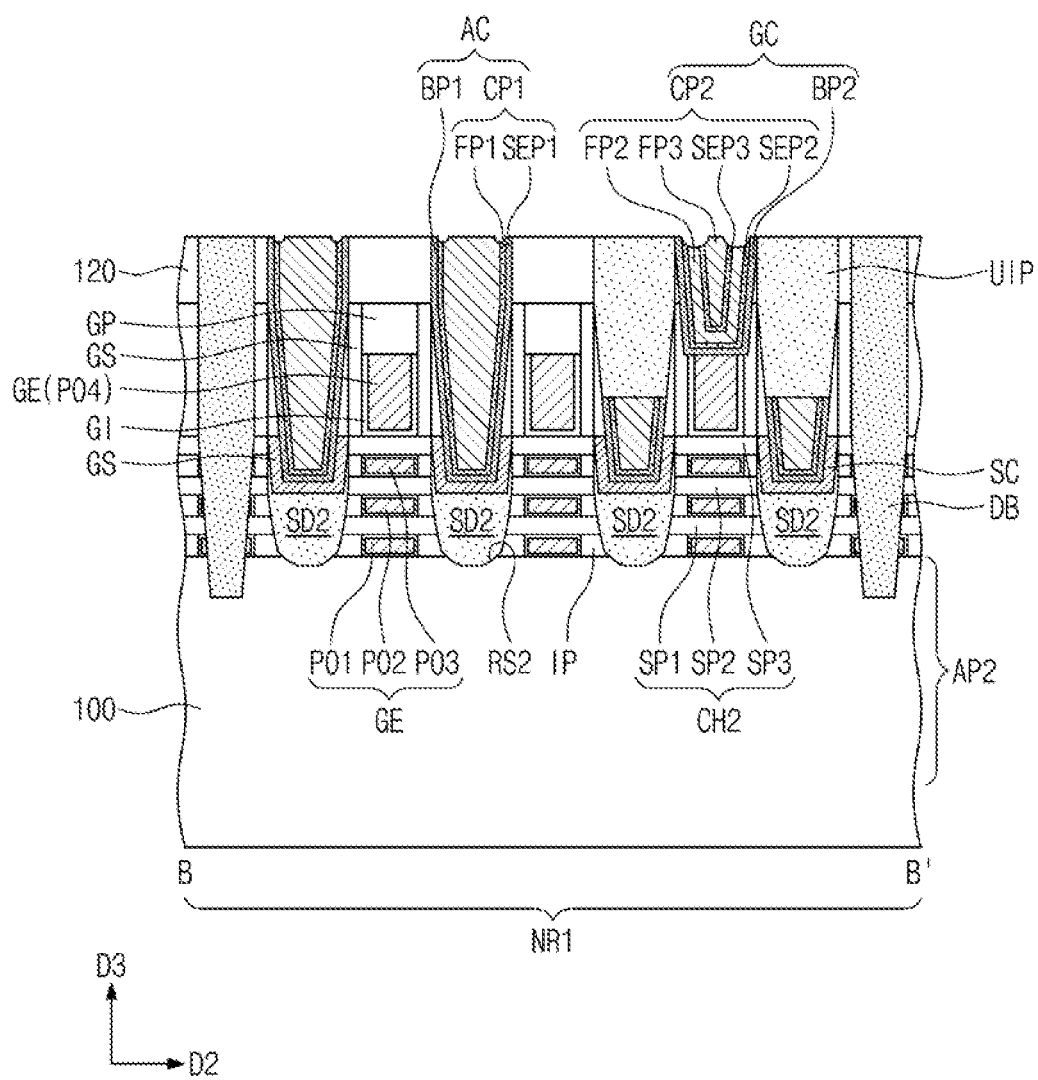
Figure 18C:
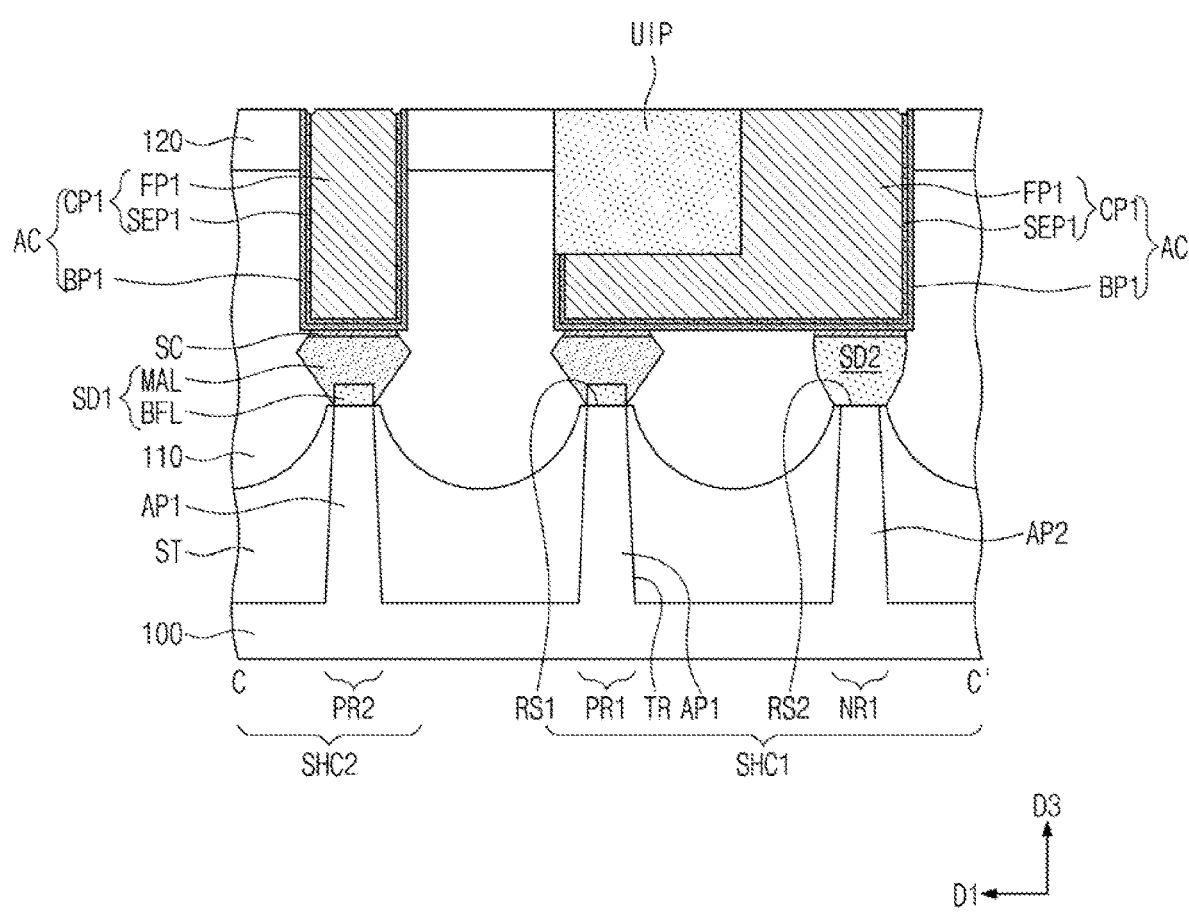
Figure 18D:
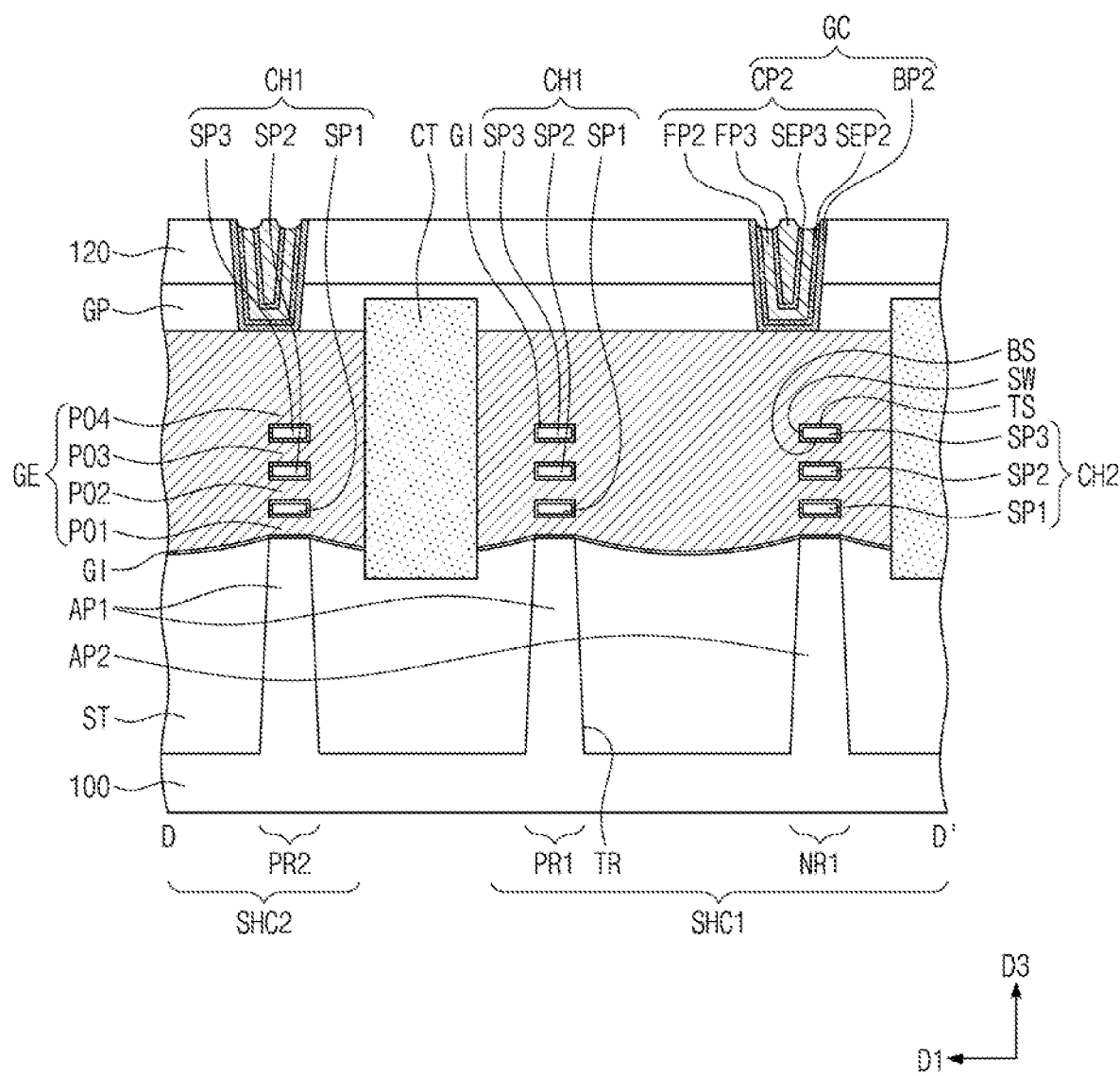
Figure 19A:
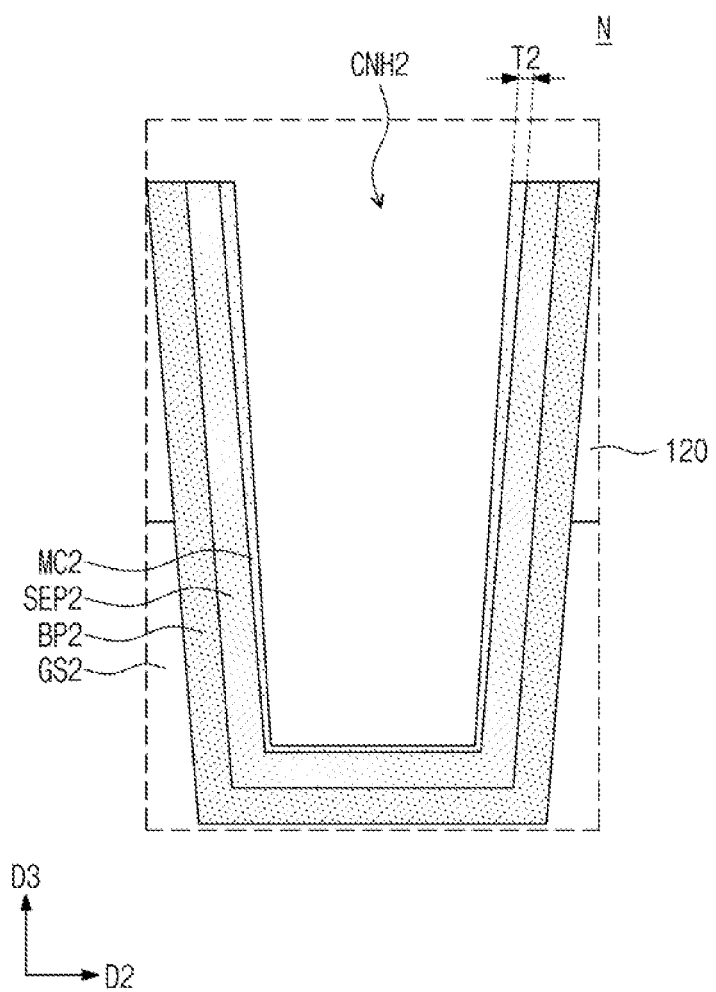
Figure 19B:
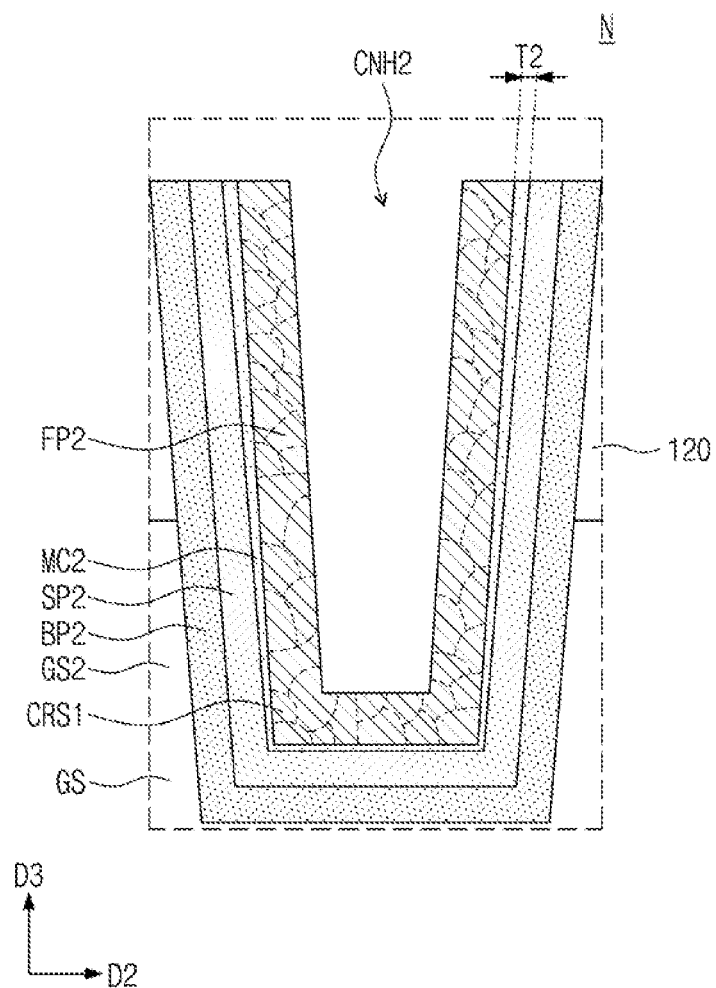
Figure 19C:
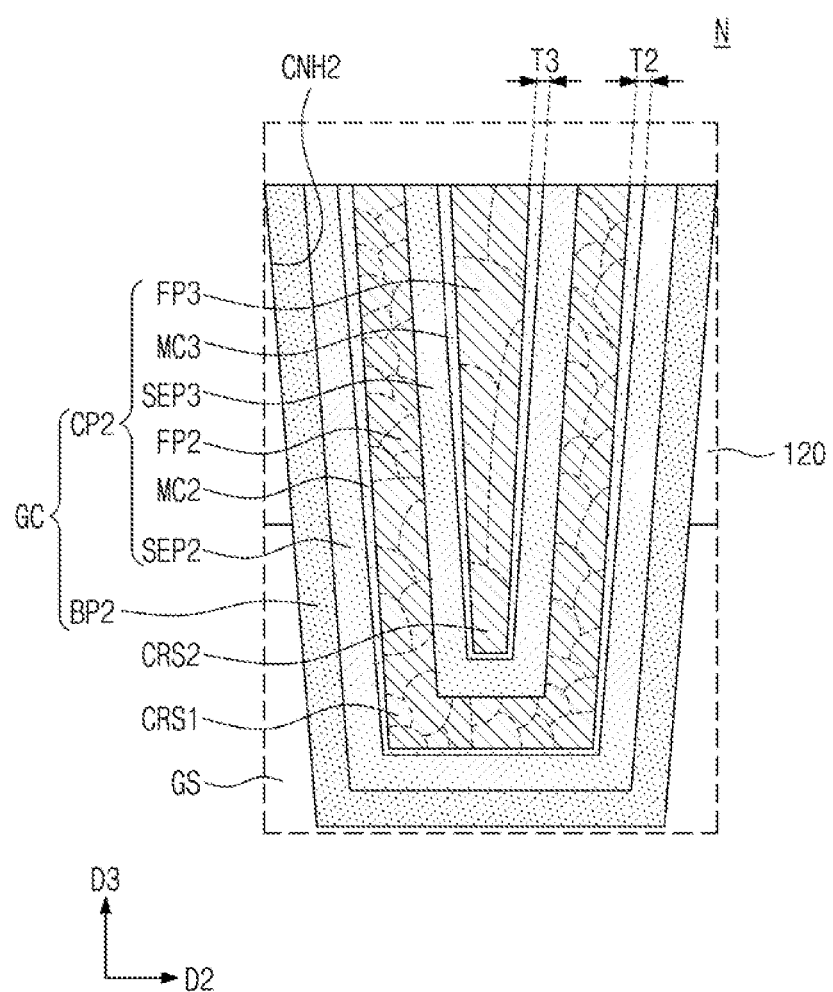

FIGS. 19A to 19C illustrate enlarged views showing a method of forming a gate contact on section N of FIG. 18A. Referring to FIG. 19A, a second contact hole CNH2 may be formed to penetrate the second interlayer dielectric layer 120. For example, the second contact hole CNH2 may expose the gate contact GC (see FIG. 18A). A second barrier pattern BP2 may be conformally formed on an inner wall of the second contact hole CNH2. A chemical vapor deposition (CVD) process may be used to form the second barrier pattern BP2. The second barrier pattern BP2 may include metal nitride (e.g., TiN).

A second seed pattern SEP2 may be conformally formed along an inner wall of the second barrier pattern BP2. The second seed pattern SEP2 may include, for example, tungsten and boron. A chemical vapor deposition (CVD) may be used to form the second seed pattern SEP2.

A second metal-containing pattern MC2 may be formed on the second seed pattern SEP2. For example, the second metal-containing pattern MC2 may include tungsten nitride (WN). For example, the second metal-containing pattern MC2 may be formed by using a deposition process to form a metal layer including tungsten, and then allowing the metal layer to undergo a plasma treatment process that uses a nitrogen precursor. In this stage, as discussed with reference to FIG. 7, the second metal-containing pattern MC2 may have a nitrogen concentration that decreases in a downward direction. This may be derived from the fact that the degree of reaction between the nitrogen precursor and the metal layer is reduced in a downward direction when a plasma treatment process is performed in the second contact hole CNH2. A second thickness T2 may be defined to indicate a thickness of the second metal-containing pattern MC2. The second thickness T2 may decrease in a downward direction. Alternatively, the second metal-containing pattern MC2 may be formed by using a deposition process such as chemical vapor deposition (CVD).

Referring to FIG. 19B, a second fill pattern FP2 may be formed on the second metal-containing pattern MC2. The second fill pattern FP2 may be formed by a deposition process such as atomic layer deposition (ALD). The second fill pattern FP2 may include first grains CRS1.

Referring to FIG. 19C, a third seed pattern SEP3 and a third metal-containing pattern MC3 may be formed on the second fill pattern FP2. The formation of the third seed pattern SEP3 and the third metal-containing pattern MC3 may be achieved by substantially the same process as that used for the formation of the second seed pattern SEP2 and the second metal-containing pattern MC2 discussed with reference to FIG. 19A.

The third fill pattern FP3 may fill an unoccupied portion of the second contact hole CNH2. The third fill pattern FP3 may be formed by a deposition process such as atomic layer deposition (ALD). The third fill pattern FP3 may include second grains CRS2. The first grain CRS1 may have a size less than that of the second grain CRS2. This may be derived from the fact that a process temperature is greater when the third fill pattern FP3 is formed than when the second fill pattern FP2 is formed.

Referring back to FIG. 7, a planarization process may be performed on the gate contact GC. In this step, there may be a difference in removal rate between the second seed pattern SEP2, the second metal-containing pattern MC2, the second fill pattern FP2, the third seed pattern SEP3, and the third metal-containing pattern MC3, and the difference in removal rate may be caused to form a second recess region RSR2 that is an area recessed in a direction toward the substrate 100 from a top surface GCu of the gate contact GC. The second recess region RSR2 may be defined by a top surface of each of the second seed pattern SEP2, the second metal-containing pattern MC2, the second fill pattern FP2, the third seed pattern SEP3, and the third metal-containing pattern MC3.

The first concentration CN1 (e.g., the nitrogen concentration at an upper portion of the first metal-containing pattern MC1) may be greater than the fourth concentration CN4 (e.g., the nitrogen concentration at an upper portion of the second metal-containing pattern MC2). It may be preferable that a nitrogen concentration at a lower portion of each of the metal-containing patterns MC1, MC2, and MC3 is in a range of about 0 at % to about 1 at % so as to grow the fill patterns FP1, FP2, and FP3. As the first contact hole CNH1 has a depth greater than that of the second contact hole CNH2, the first concentration CN1 may be set to be greater than the fourth concentration CN4, and thus the metal-containing patterns MC1, MC2, and MC3 may be formed to have their lower portions whose nitrogen concentrations are relatively low, such as the third concentration CN3 and the fifth concentration CN5.

Referring back to FIGS. 4 and 5A to 5D, a third interlayer dielectric layer 130 may be formed on the active contacts AC and the gate contacts GC. A first metal layer M1 may be formed in the third interlayer dielectric layer 130. For example, first vias VI1 may be formed in a lower portion of the third interlayer dielectric layer 130, which first vias VI1 are correspondingly connected to the active and gate contacts AC and GC. Each of the first vias VI1 may include a barrier metal and a fill metal. Wiring lines M1_R1, M1_R2, M1_R3, and M1_I may be formed in an upper portion of the third interlayer dielectric layer 130, which wiring lines M1_R1, M1_R2, M1_R3, and M1_I are in contact with the first vias VI1. A fourth interlayer dielectric layer 140 may be formed on the third interlayer dielectric layer 130. A second metal layer M2 may be formed in the fourth interlayer dielectric layer 140.

Figure 20A:
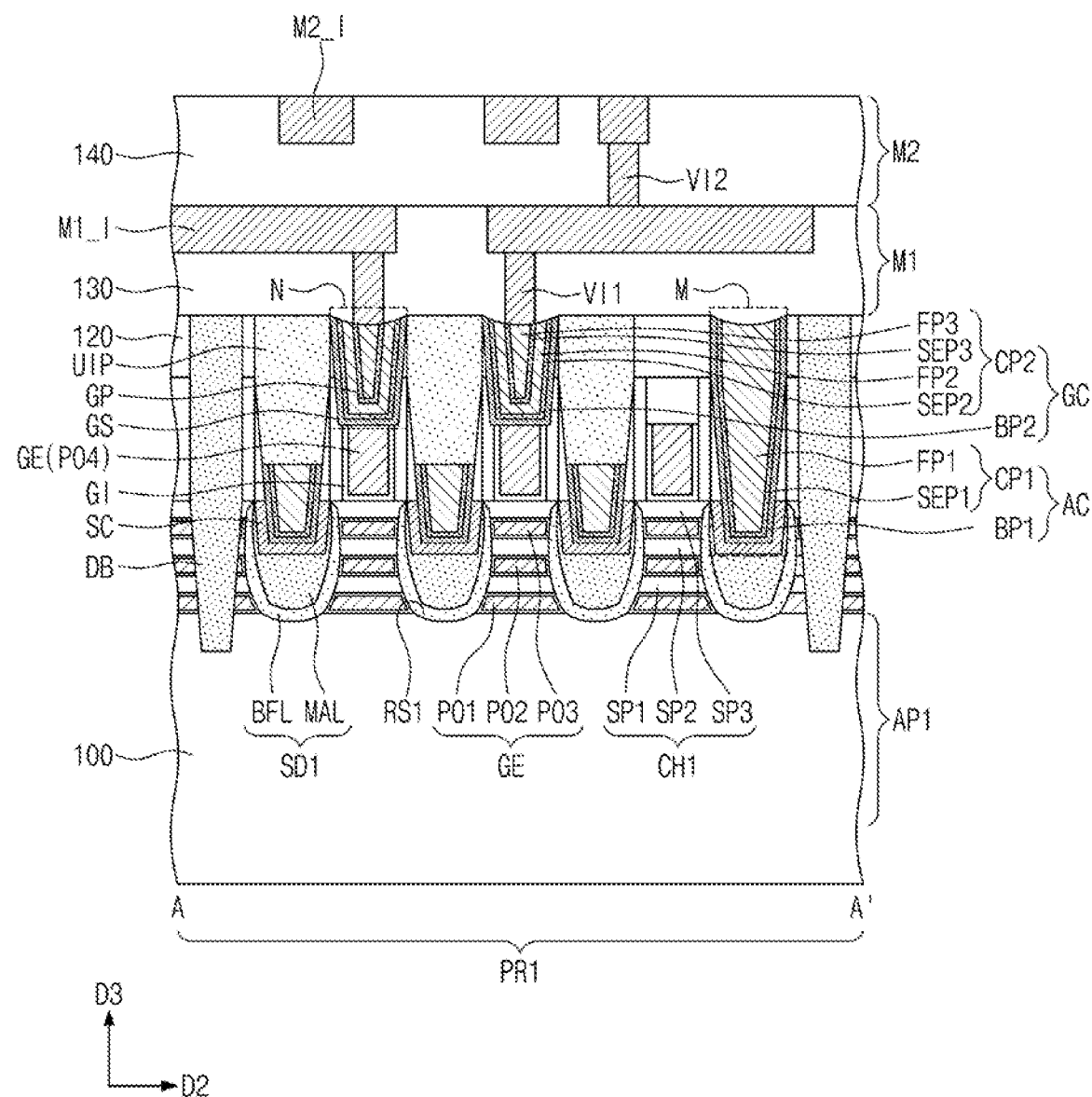
FIG. 20A illustrates a cross-sectional view taken along line A-A' of FIG. 4, showing a semiconductor device according to an embodiment.
Figure 20B:
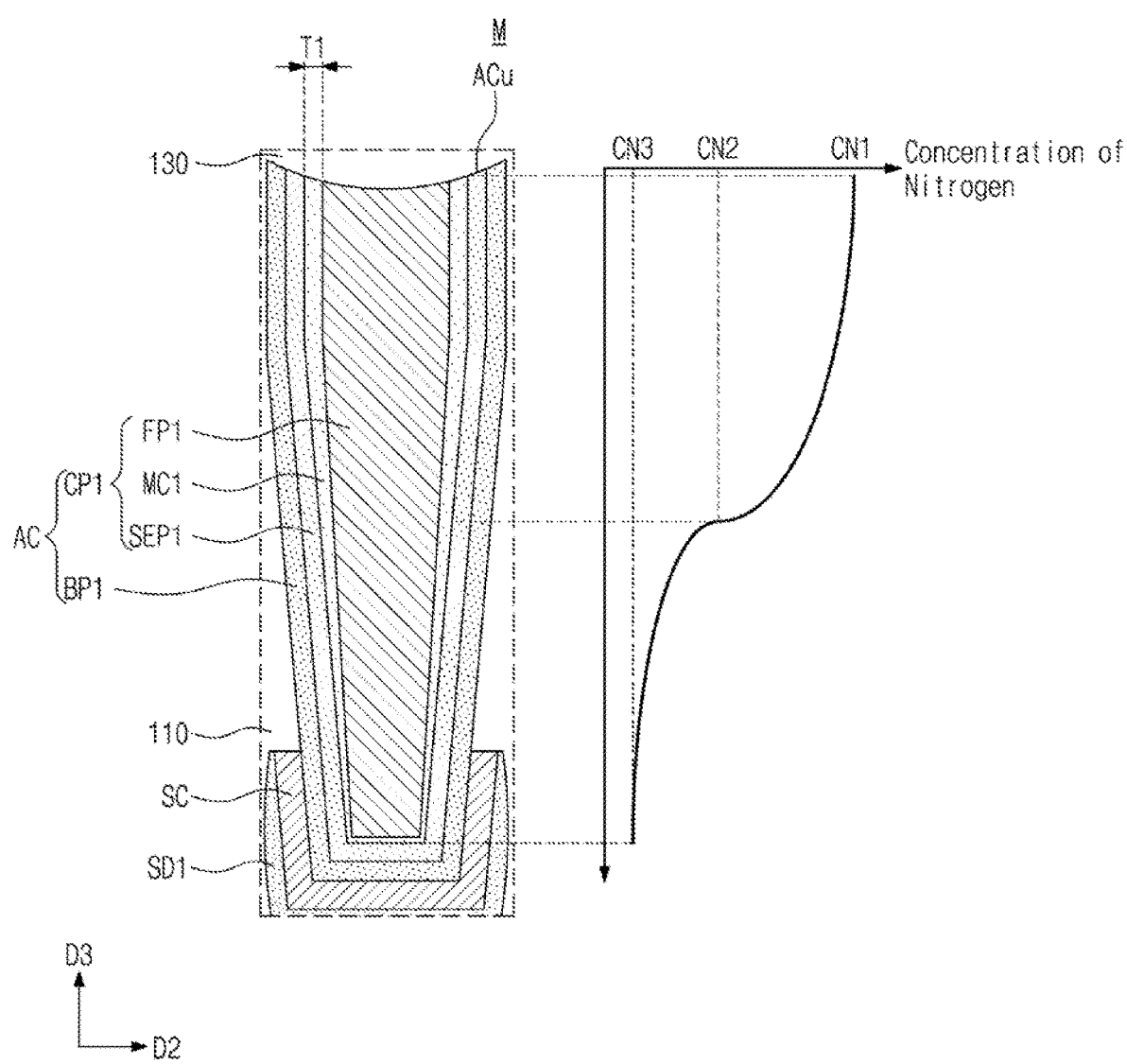
FIG. 20B illustrates an enlarged view showing an example of section M depicted in FIG. 20A.
Figure 20C:
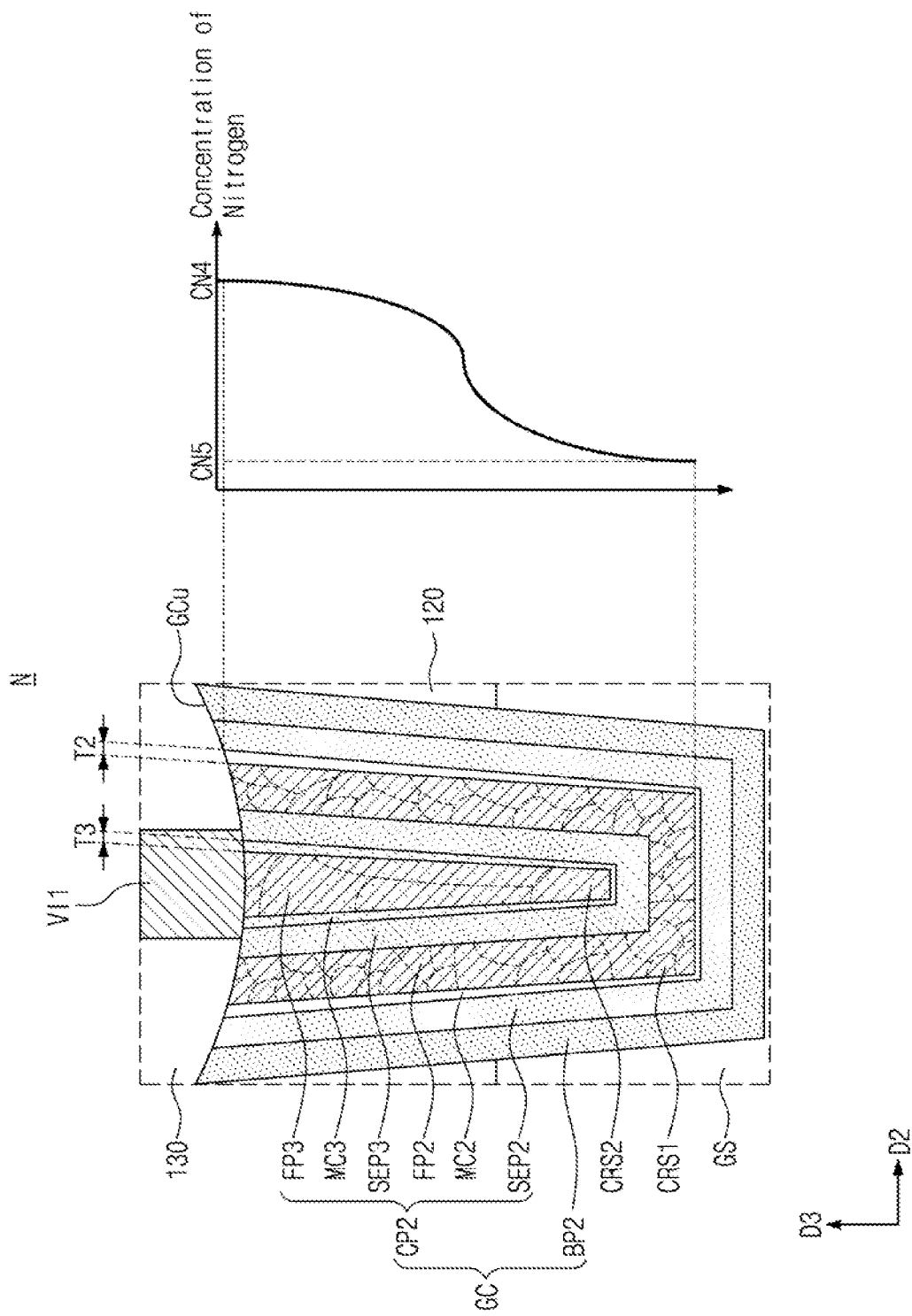
FIG. 20C illustrates an enlarged view showing an example of section N depicted in FIG. 20A.

FIG. 20A illustrates a cross-sectional view taken along line A-A' of FIG. 4, showing a semiconductor device according to an embodiment. FIG. 20B illustrates an enlarged view showing an example of section M depicted in FIG. 20A. FIG. 20C illustrates an enlarged view showing an example of section N depicted in FIG. 20A. In the embodiment that follows, a description of features repetitive to those discussed above with reference to FIGS. 4, 5A to 5D, 6, and 7 will be omitted, and a difference thereof will be discussed in detail.

Referring to FIGS. 4 and 20A to 20C, the active contact AC may not include the first recess region RSR1 discussed with reference to FIG. 6, and the gate contact GC may not include the second recess region RSR2 discussed with reference to FIG. 7. Referring to FIGS. 20B and 20C, the top surface ACu of the active contact AC and the top surface GCu of the gate contact GC may each have a profile that is concave toward the substrate 100 (e.g., a concave profile). This may be derived from the difference in removal rate between the first barrier pattern BP1, the first seed pattern SEP1, the first metal-containing pattern MC1, and the first fill pattern FP1 in the planarization process.

Figure 21A:
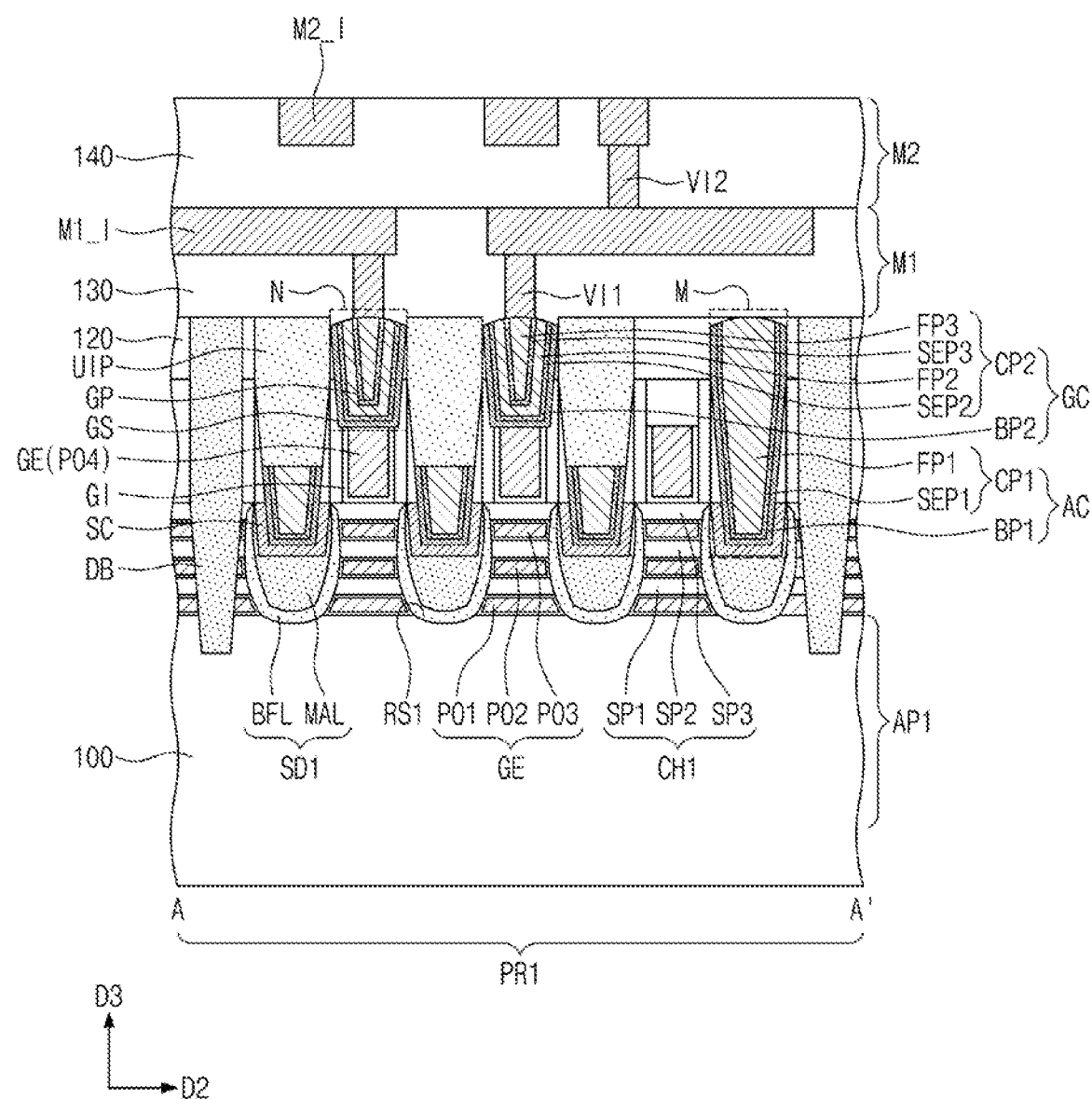
FIG. 21A illustrates a cross-sectional view taken along line A-A' of FIG. 4, showing a semiconductor device according to an embodiment.
Figure 21B:
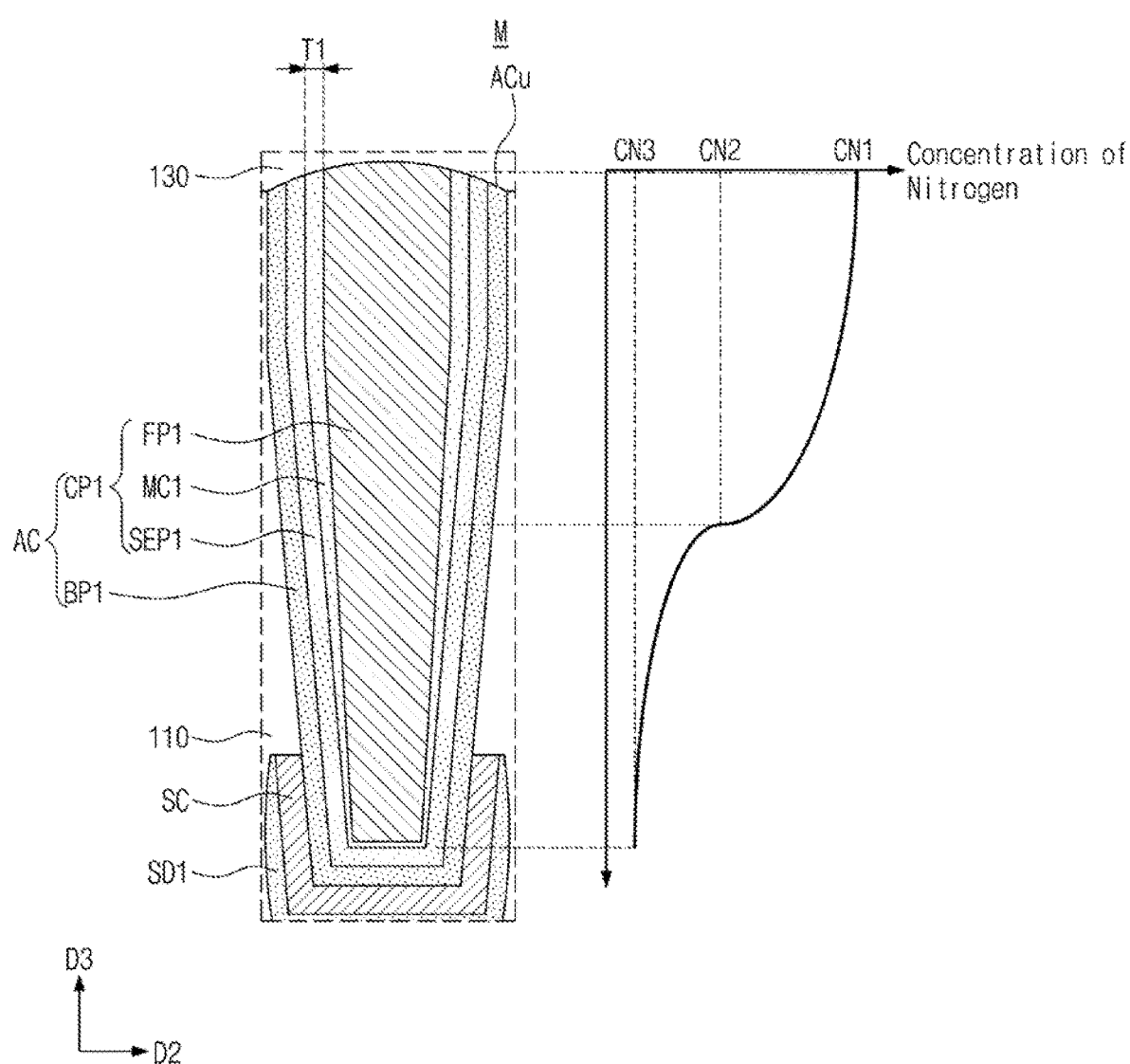
FIG. 21B illustrates an enlarged view showing an example of section M depicted in FIG. 21A.
Figure 21C:
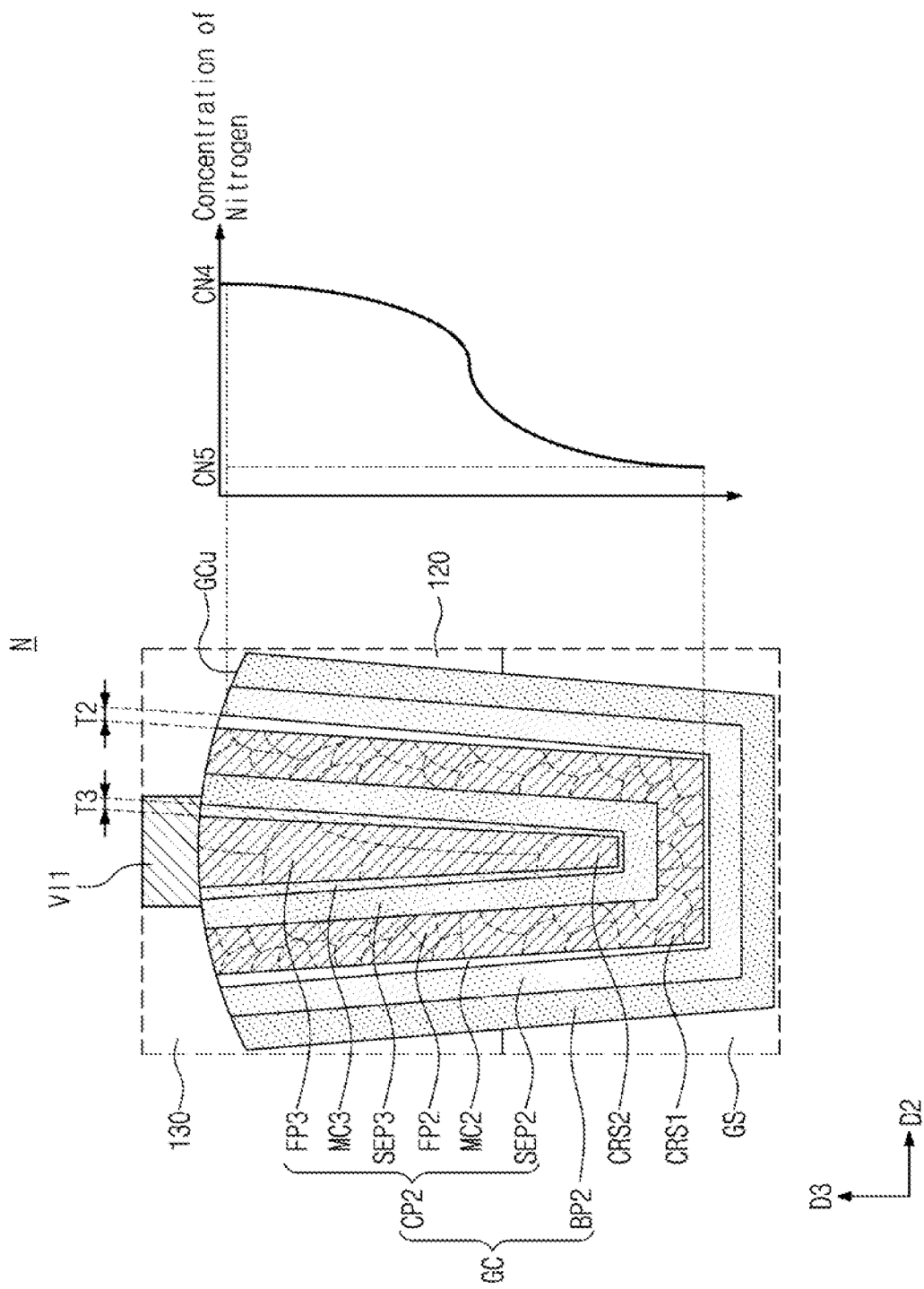
FIG. 21C illustrates an enlarged view showing an example of section N depicted in FIG. 21A.

FIG. 21A illustrates a cross-sectional view taken along line A-A' of FIG. 4, showing a semiconductor device according to an embodiment. FIG. 21B illustrates an enlarged view showing an example of section M depicted in FIG. 21A. FIG. 21C illustrates an enlarged view showing an example of section N depicted in FIG. 21A. In the embodiment that follows, a description of features repetitive to those discussed above with reference to FIGS. 4, 5A to 5D, 6, and 7 will be omitted, and a difference thereof will be discussed in detail.

Referring to FIGS. 4 and 21A to 21C, the active contact AC may not include the first recess region RSR1 discussed with reference to FIG. 6, and the gate contact GC may not include the second recess region RSR2 discussed with reference to FIG. 7. Referring to FIGS. 21B and 21C, the top surface ACu of the active contact AC and the top surface GCu of the gate contact GC may each have a profile that is convex away from the substrate 100 (e.g., a convex profile). This may be derived from the difference in removal rate between the second barrier pattern BP2, the second seed pattern SEP2, the second metal-containing pattern MC2, the second fill pattern FP2, the third seed pattern SEP3, and the third metal-containing pattern MC3 in the planarization process.

FIGS. 22A, 22B, 22C, and 22D illustrate cross-sectional views respectively taken along lines A-A', B-B', C-C', and D-D' of FIG. 4, showing a semiconductor device according to an embodiment. In the embodiment that follows, a description of features repetitive to those discussed above with reference to FIGS. 4, 5A to 5D, 6, and 7 will be omitted, and a difference thereof will be discussed in detail.

Referring to FIGS. 4 and 22A to 22D, the device isolation layer ST (see, e.g., FIG. 22C) may cover a lower sidewall of each of the first and second active patterns AP1 and AP2. An upper portion of each of the first and second active patterns AP1 and AP2 may protrude upwardly from the device isolation layer (see FIG. 22D). The first active pattern AP1 may include, on its upper portion, first source/drain patterns SD1 and a first channel pattern CH1 therebetween. The second active pattern AP2 may include, on its upper portion, second source/drain patterns SD2 and a second channel pattern CH2 therebetween.

Figure 22A:
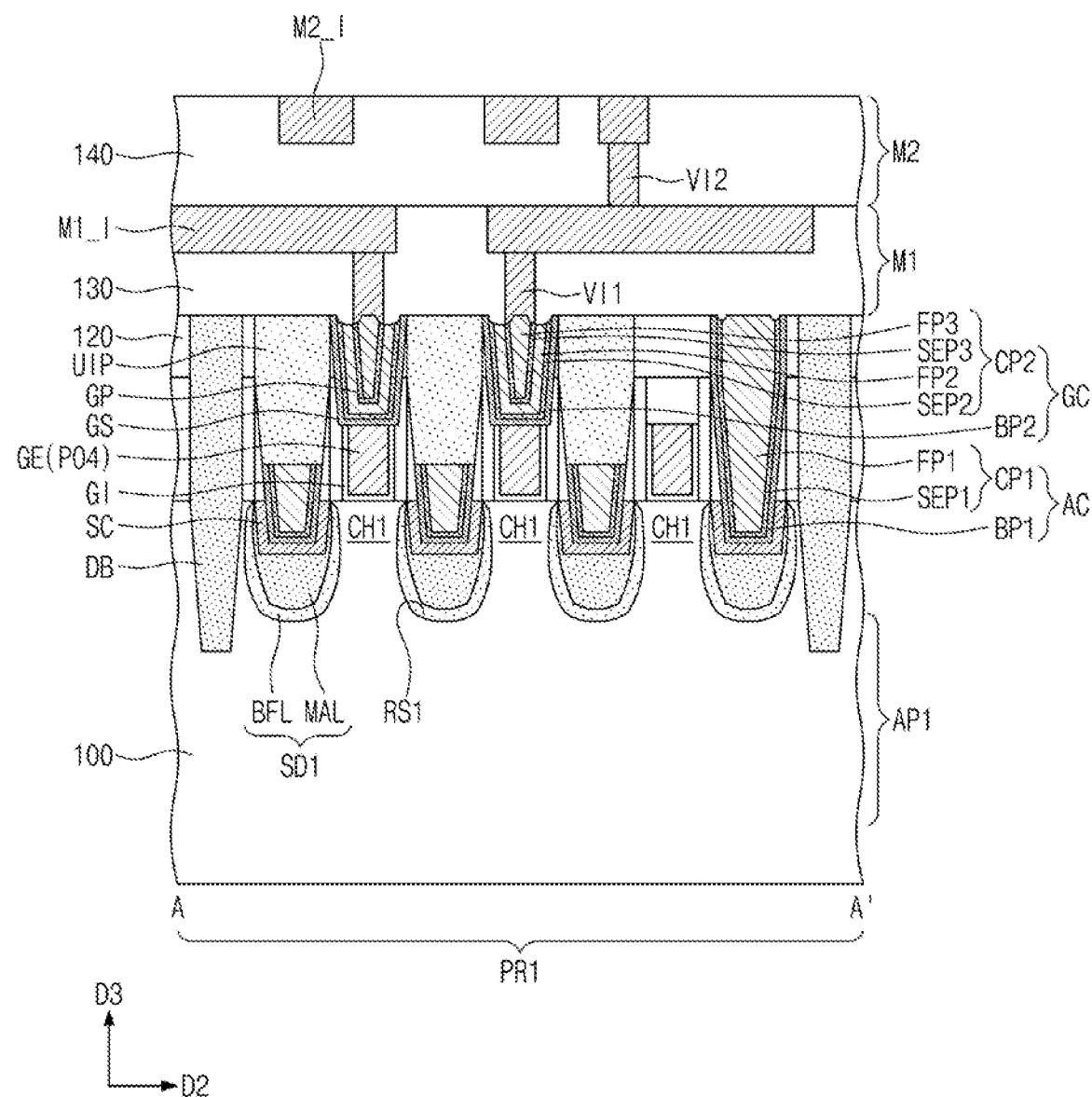
FIGS. 22A, 22B, 22C, and 22D illustrate cross-sectional views respectively taken along lines A-A', B-B', C-C', and D-D' of FIG. 4, showing a semiconductor device according to an embodiment.
Figure 22B:
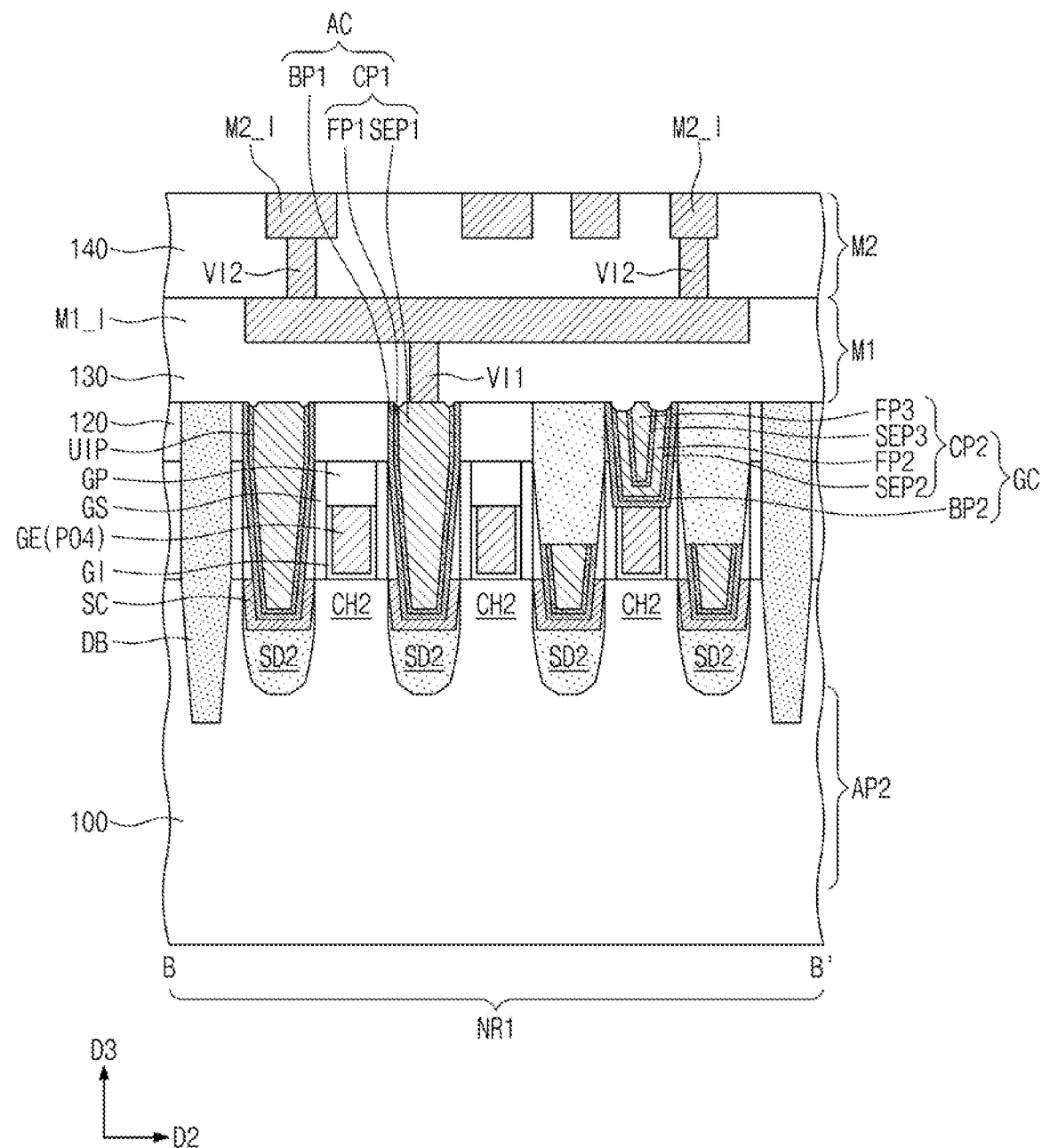
Figure 22C:
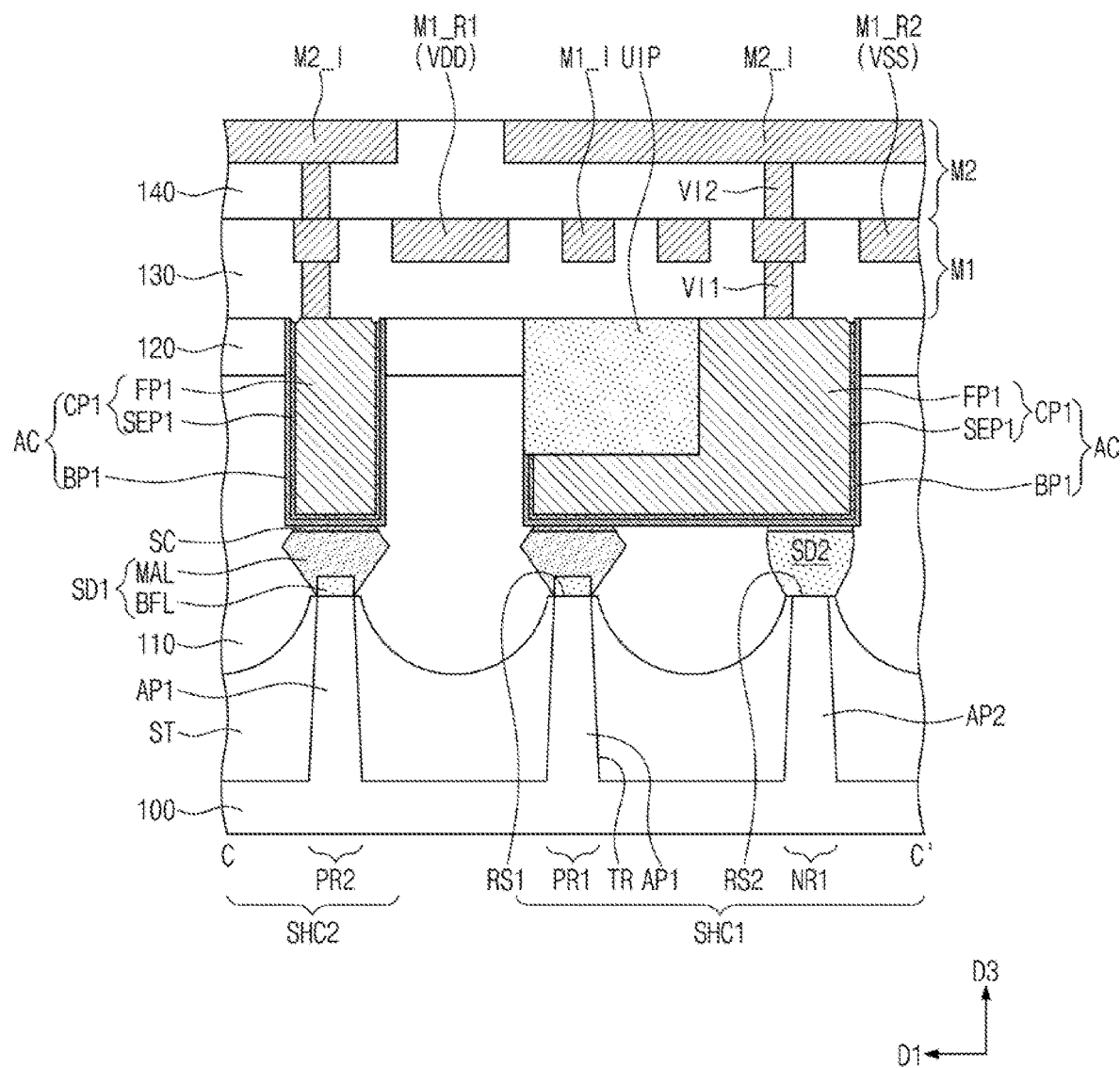
Figure 22D:
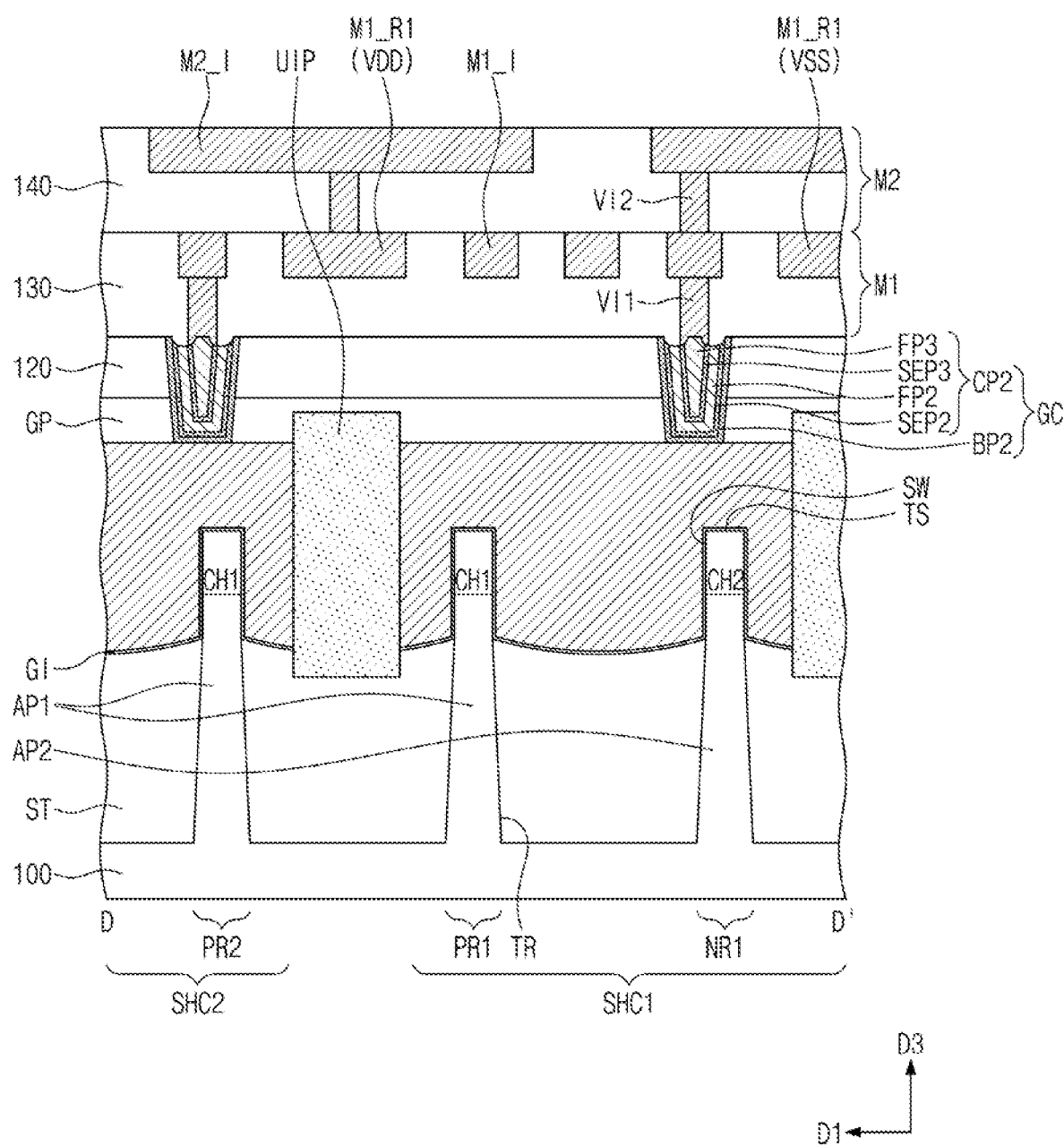

Referring to FIG. 22D, each of the first and second channel patterns CH1 and CH2 may not include any of the first, second, and third semiconductor patterns SP1, SP2, and SP3 that are discussed above with reference to FIGS. 5A to 5D. Each of the first and second channel patterns CH1 and CH2 may have a fin shape that upwardly protrudes from the device isolation layer ST (see FIG. 22D).

The gate electrode GE may be provided on a top surface TS and opposite sidewalls SW of each of the first and second channel patterns CH1 and CH2. In this sense, a transistor according to an embodiment may be a three-dimensional field effect transistor (e.g., FinFET) in which the gate electrode GE three-dimensionally surrounds the first and second channel patterns CH1 and CH2.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly connect to the first and second source/drain patterns SD1 and SD2. A gate contact GC may be provided to penetrate the second interlayer dielectric layer 120 and the gate capping pattern GP and to connect to the gate electrode GE. A detailed description of the active contacts AC and the gate contacts GC may be substantially the same as that discussed above with reference to FIGS. 4, 5A to 5D, 6, and 7.

A third interlayer dielectric layer 130 may be provided on the second interlayer dielectric layer 120. A fourth interlayer dielectric layer 140 may be provided on a third interlayer dielectric layer 130. A first metal layer M1 may be provided in the third interlayer dielectric layer 130. A second metal layer M2 may be provided in the fourth interlayer dielectric layer 140. A detailed description of the first metal layer M1 and the second metal layer M2 may be substantially the same as that discussed above with reference to FIGS. 4 and 5A to 5D.

According to the disclosure, first and second metal-containing patterns may be formed to reduce thicknesses of first and second barrier patterns. Therefore, it may be possible to form an active contact and a gate contact that have their relatively low resistance.

In addition, as first to third metal-containing patterns are formed, it may be possible to prevent the occurrence of a void or to reduce a size of a void in the active contact and the gate contact when forming first and third fill patterns that fill unoccupied portions of first and second contact holes. Accordingly, the active contact and the gate contact may be suppressed or prevented from resistance increase due to voids. In conclusion, a semiconductor device may increase in electrical properties.

Although the disclosure has been described in connection with some embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. A semiconductor device, comprising:
a substrate comprising an active pattern;
a channel pattern and a source/drain pattern on the active pattern, the channel pattern being connected to the source/drain pattern;
a gate electrode on the channel pattern;
an active contact electrically connected to the source/drain pattern; and
a gate contact electrically connected to the gate electrode, wherein the active contact comprises:
a first barrier pattern;
a first seed pattern on the first barrier pattern;
a first fill pattern on the first seed pattern; and
a first metal-containing pattern between the first seed pattern and the first fill pattern,
wherein the first metal-containing pattern comprises tungsten nitride, and
wherein a nitrogen concentration of the first metal-containing pattern decreases in a direction toward the substrate.

2. The semiconductor device of claim 1, wherein a thickness of the first metal-containing pattern decreases in the direction toward the substrate.

3. The semiconductor device of claim 1, wherein a top surface of the active contact comprises a first recess region that is recessed in the direction toward the substrate.

4. The semiconductor device of claim 3, wherein a top surface of the gate contact comprises a second recess region that is recessed in the direction toward the substrate.

5. The semiconductor device of claim 1, wherein the gate contact comprises:
a second barrier pattern;
a second seed pattern on the second barrier pattern;
a second metal-containing pattern on the second seed pattern;
a second fill pattern on the second metal-containing pattern;
a third seed pattern on the second fill pattern;
a third metal-containing pattern on the third seed pattern; and
a third fill pattern on the third metal-containing pattern.

6. The semiconductor device of claim 5, wherein
the second fill pattern comprises a first grain,
the third fill pattern comprises a second grain, and
a size of the first grain is less than a size of the second grain.

7. The semiconductor device of claim 5, wherein
each of the second metal-containing pattern and the third metal-containing pattern comprises tungsten nitride, and
a nitrogen concentration of each of the second metal-containing pattern and the third metal-containing pattern decreases in the direction toward the substrate.

8. The semiconductor device of claim 5, wherein a thickness of each of the second metal-containing pattern and the third metal-containing pattern decreases in the direction toward the substrate.

9. The semiconductor device of claim 1, wherein a top surface of the active contact has a concave profile.

10. The semiconductor device of claim 1, wherein a top surface of the active contact has a convex profile.

11. A semiconductor device, comprising:
a substrate comprising an active pattern;
a channel pattern and a source/drain pattern on the active pattern, the channel pattern being connected to the source/drain pattern;
a gate electrode on the channel pattern;
an active contact electrically connected to the source/drain pattern; and
a gate contact electrically connected to the gate electrode,
wherein the active contact comprises:
a first barrier pattern;
a first seed pattern on the first barrier pattern;
a first metal-containing pattern on the first seed pattern; and
a first fill pattern on the first metal-containing pattern,
wherein the gate contact comprises:
a second barrier pattern;
a second seed pattern on the second barrier pattern;
a second metal-containing pattern on the second seed pattern;
a second fill pattern on the second metal-containing pattern;
a third seed pattern on the second fill pattern;
a third metal-containing pattern on the third seed pattern; and
a third fill pattern on the third metal-containing pattern, and
wherein each of the first metal-containing pattern, the second metal-containing pattern, and the third metal-containing pattern comprises metal nitride.

12. The semiconductor device of claim 11, wherein
the first seed pattern comprises tungsten and boron, and the first fill pattern comprises tungsten.

13. The semiconductor device of claim 11, wherein a maximum concentration of nitrogen in the first metal-containing pattern is greater than a maximum concentration of nitrogen in the second metal-containing pattern.

14. The semiconductor device of claim 11, wherein a top surface of the first seed pattern and a top surface of the first metal-containing pattern have a curved profile.

15. The semiconductor device of claim 11, wherein
each of the first metal-containing pattern, the second metal-containing pattern, and the third metal-containing pattern comprises tungsten nitride, and
a nitrogen concentration of each of the first metal-containing pattern, the second metal-containing pattern, and the third metal-containing pattern decreases in a direction toward the substrate.

16. A semiconductor device, comprising:
a substrate comprising a p-type metal-oxide-semiconductor field-effect transistor (PMOSFET) region and an n-type metal-oxide-semiconductor field-effect transistor (NMOSFET) region;
a first active pattern on the PMOSFET region and a second active pattern on the NMOSFET region;
a first channel pattern and a first source/drain pattern on the first active pattern;
a second channel pattern and a second source/drain pattern on the second active pattern;
a gate electrode that runs across the first channel pattern and the second channel pattern;
a gate dielectric layer between the gate electrode and the first channel pattern, the gate dielectric layer being between the gate electrode and the second channel pattern;
a gate spacer on a sidewall of the gate electrode;
a gate capping pattern on a top surface of the gate electrode;
a gate cutting pattern that penetrates the gate electrode;
an interlayer dielectric layer on the gate capping pattern;
an active contact that penetrates the interlayer dielectric layer and is electrically connected to one of the first source/drain pattern and the second source/drain pattern;
a metal-semiconductor compound layer between the active contact and the first source/drain pattern, the metal-semiconductor compound layer being between the active contact and the second source/drain pattern;
a gate contact that penetrates the interlayer dielectric layer and the gate capping pattern and is electrically connected to the gate electrode;
a first metal layer on the interlayer dielectric layer, the first metal layer comprising:
a power line that vertically overlaps the gate cutting pattern; and
a plurality of first lines that are electrically connected to the active contact and the gate contact; and
a second metal layer on the first metal layer,
wherein the second metal layer comprises a plurality of second lines that are electrically connected to the first metal layer,
wherein the active contact comprises:
a first barrier pattern;
a first seed pattern on the first barrier pattern;
a first metal-containing pattern on the first seed pattern; and
a first fill pattern on the first metal-containing pattern,
wherein the gate contact comprises:
a second barrier pattern;
a second seed pattern on the second barrier pattern;
a second metal-containing pattern on the second seed pattern;
a second fill pattern on the second metal-containing pattern;
a third seed pattern on the second fill pattern;
a third metal-containing pattern on the third seed pattern; and
a third fill pattern on the third metal-containing pattern,
wherein each of the first metal-containing pattern, the second metal-containing pattern, and the third metal-containing pattern comprises tungsten nitride, and
wherein a nitrogen concentration of each of the first metal-containing pattern, the second metal-containing pattern, and the third metal-containing pattern decreases in a direction toward the substrate.

17. The semiconductor device of claim 16, wherein
a top surface of the active contact comprises a first recess region that is recessed in the direction toward the substrate, and
a top surface of the gate contact comprises a second recess region that is recessed in the direction toward the substrate.

18. The semiconductor device of claim 16, wherein a top surface of the first seed pattern and a top surface of the first metal-containing pattern are located at a level lower than a level of an uppermost surface of the first fill pattern.

19. The semiconductor device of claim 16, wherein a thickness of the first metal-containing pattern decreases in the direction toward the substrate.

20. The semiconductor device of claim 16, wherein each of the first channel pattern and the second channel pattern comprises a respective plurality of semiconductor patterns that are sequentially stacked and spaced apart from each other.

* * * * *